US012651546B2

(12) United States Patent
Lu et al.

(10) Patent No.: US 12,651,546 B2
(45) Date of Patent: Jun. 9, 2026

(54) DISPLAY SUBSTRATE AND DISPLAY DEVICE

(71) Applicant: BOE Technology Group Co., Ltd., Beijing (CN)

(72) Inventors: Jiangnan Lu, Beijing (CN); Guangliang Shang, Beijing (CN); Libin Liu, Beijing (CN); Long Han, Beijing (CN); Yu Feng, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/982,451

(22) Filed: Dec. 16, 2024

(65) Prior Publication Data

US 2025/0191507 A1 Jun. 12, 2025

Related U.S. Application Data

(63) Continuation of application No. 17/781,988, filed as application No. PCT/CN2021/082769 on Mar. 24, 2021, now Pat. No. 12,205,506.

(51) Int. Cl.
*G09G 3/20* (2006.01)
*G11C 19/28* (2006.01)

(52) U.S. Cl.
CPC .............. *G09G 3/20* (2013.01); *G11C 19/28* (2013.01); *G09G 2300/0408* (2013.01); *G09G 2310/0286* (2013.01); *G09G 2320/0209* (2013.01); *G09G 2320/0233* (2013.01); *G09G 2330/021* (2013.01)

(58) Field of Classification Search
CPC ............. G09G 3/20; G09G 2300/0408; G09G 2310/0286; G09G 2320/0209; G09G 2320/0233; G09G 2330/021; G11C 19/28
See application file for complete search history.

(56) References Cited

U.S. PATENT DOCUMENTS

| | | | | |
|---|---|---|---|---|
| 12,205,506 B2 * | 1/2025 | Lu | ........................ | G09G 3/3266 |
| 2009/0286336 A1 * | 11/2009 | Cho | ...................... | G09G 3/3611 |
| | | | | 257/E33.076 |
| 2010/0166136 A1 * | 7/2010 | Tobita | .................. | G11C 19/184 |
| | | | | 377/67 |
| 2013/0056736 A1 * | 3/2013 | Kim | ...................... | G09G 3/3677 |
| | | | | 438/34 |
| 2014/0035889 A1 * | 2/2014 | Huang | ................ | G09G 3/3674 |
| | | | | 345/204 |
| 2016/0335962 A1 * | 11/2016 | Xiao | ........................ | G09G 3/36 |

(Continued)

*Primary Examiner* — Ryan A Lubit
(74) *Attorney, Agent, or Firm* — Banner & Witcoff, Ltd.

(57) ABSTRACT

A display substrate and a display device are provided. In the display substrate, the shift register unit includes a charge pump circuit, the charge pump circuit includes a first capacitor and a first transistor, and the charge pump circuit is electrically connected with a first input node and a first node, respectively; a first electrode plate of the first capacitor is connected with the first clock signal line, a second electrode plate of the first capacitor is connected with the first input node, a gate electrode of the first transistor is connected with a first electrode of the first transistor, a second electrode plate of the first capacitor is provided with a first portion, and the first portion of the second electrode plate of the first capacitor and the gate electrode of the first transistor have an integral structure.

18 Claims, 21 Drawing Sheets

(56)  References Cited

U.S. PATENT DOCUMENTS

| | | | |
|---|---|---|---|
| 2018/0122315 A1* | 5/2018 | Zhang | G09G 3/3677 |
| 2018/0335814 A1* | 11/2018 | Shao | G06F 1/24 |
| 2020/0027900 A1* | 1/2020 | Ebihara | H10D 86/0231 |
| 2020/0135132 A1* | 4/2020 | Tanaka | G09G 3/3677 |
| 2021/0241686 A1* | 8/2021 | Cheng | G09G 3/3291 |
| 2021/0280659 A1* | 9/2021 | Park | H10K 59/126 |

* cited by examiner

Second Conductive Layer (LY2)
First Conductive Layer (LY1)
Semiconductor Layer (LY0)

~100

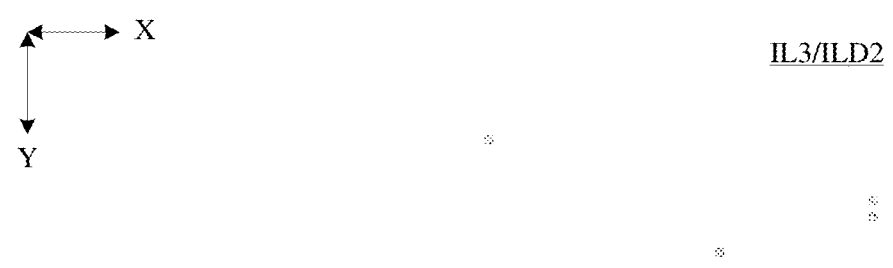
FIG. 7
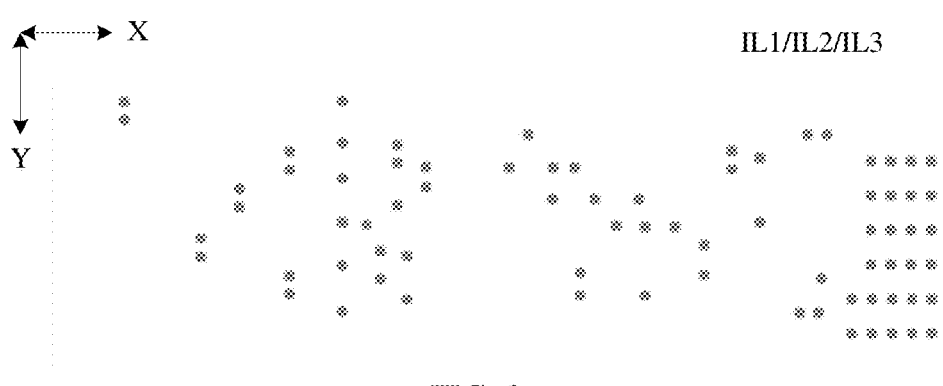
FIG. 8
FIG. 9

LY3+PVX+PLN1

IL1/IL2/IL3

LY3

IL4/IL5

LY4

LY0+ILD(IL1/IL2/IL3)

LY1+ILD(IL1/IL2/IL3)

LY2+ILD(IL1/IL2/IL3)

LY4

LY3+IL4/IL5+LY4

Display Device 2

Display Substrate
1

FIG. 42

DISPLAY SUBSTRATE AND DISPLAY DEVICE

This application is a continuation application of U.S. Ser. No. 17/781,988 filed on Jun. 2, 2022 which is a U.S. National Phase Entry of International Application No. PCT/CN2021/082769 filed on Mar. 24, 2021. The present application claims priority to and the benefit of the above-identified applications and the above-identified applications are incorporated by reference herein in their entirety.

TECHNICAL FIELD

At least one embodiment of the present disclosure relates to a display substrate and a display device.

BACKGROUND

In the field of display technology, for example, a pixel array of a liquid crystal display panel or an organic light-emitting diode (OLED) display panel usually includes rows of gate lines and columns of data lines intersecting with the gate lines. The driving of the gate lines can be realized by a bonded integrated driving circuit. In recent years, with continuous improvement of the fabrication process of amorphous silicon thin film transistors or oxide thin film transistors, the gate line driving circuit can also be directly integrated on the thin film transistor array substrate to form GOA (Gate driver On Array) to drive the gate lines. For example, a GOA including a plurality of cascaded shift register units can be used to provide on-off voltage signals (scanning signals) for the rows of gate lines of the pixel array, so as to control the rows of gate lines to be turned on sequentially, and meanwhile, the data lines provide data signals to pixel units of corresponding row in the pixel array, so as to form grayscale voltages required for displaying the grayscales of the image in each pixel unit, and then display a frame of image.

SUMMARY

At least one embodiment of the present disclosure relates to a display substrate and a display device.

At least one embodiment of the present disclosure provides a display substrate, comprising: a base substrate, and a shift register unit, a first clock signal line, and a first power line which are all provided in a peripheral region of the base substrate, wherein the shift register unit comprises a charge pump circuit, the first clock signal line is configured to supply a first clock signal to the shift register unit, the first power line is configured to supply a first power voltage to the shift register unit, the charge pump circuit comprises a first capacitor, a first transistor, and a second capacitor, and the charge pump circuit is electrically connected with a first input node and a first node, respectively; a first electrode plate of the first capacitor is connected with the first clock signal line, a second electrode plate of the first capacitor is connected with the first input node, a first electrode plate of the second capacitor is connected with the first power line, and a second electrode plate of the second capacitor is connected with the first node; and a gate electrode of the first transistor is connected with a first electrode or a second electrode of the first transistor, an orthogonal projection of the first capacitor on the base substrate is adjacent to an orthogonal projection of the first transistor on the base substrate, and an orthogonal projection of the second capacitor on the base substrate is adjacent to the orthogonal projection of the first transistor on the base substrate.

For example, in some embodiments of the present disclosure, the charge pump circuit is configured to, under control of the first clock signal supplied by the first clock signal line during a first period, convert a potential of the first input node from a first voltage signal to a second voltage signal, and transmit the second voltage signal to the first node, and is configured to maintain a potential of the first node during a second period.

For example, in some embodiments of the present disclosure, a polarity of the first voltage signal is the same as a polarity of the second voltage signal, and an absolute value of a voltage value of the second voltage signal is greater than an absolute value of a voltage value of the first voltage signal.

For example, in some embodiments of the present disclosure, the display substrate further comprises a first connection electrode and a second connection electrode; the gate electrode of the first transistor is connected with the first electrode of the first transistor through the first connection electrode to form a diode structure, a first end of the first connection electrode is connected with the first electrode of the first transistor, a second end of the first connection electrode is connected with gate electrode of the first transistor, a first end of the second connection electrode is connected with the second electrode of the first transistor, a second end of the second connection electrode is connected with the second electrode plate of the second capacitor, the first electrode of the first transistor is connected with an active layer of the first transistor through a first via hole, and an orthogonal projection of a channel of the first transistor on the base substrate does not overlap with an orthogonal projection of the first via hole on the base substrate.

For example, in some embodiments of the present disclosure, the first connection electrode is connected with the gate electrode of the first transistor through a second via hole, and the orthogonal projection of the channel of the first transistor on the base substrate does not overlap with an orthogonal projection of the second via hole on the base substrate.

For example, in some embodiments of the present disclosure, a height of the second via hole in a direction perpendicular to the base substrate is smaller than a height of the first via hole in the direction perpendicular to the base substrate.

For example, in some embodiments of the present disclosure, the first via hole penetrates a first insulating layer, a second insulating layer, and a third insulating layer, and the second via hole penetrates the second insulating layer and the third insulating layer.

For example, in some embodiments of the present disclosure, the orthogonal projection of the channel of the first transistor on the base substrate partially overlaps with an orthogonal projection of the gate electrode of the first transistor on the base substrate.

For example, in some embodiments of the present disclosure, a capacitance value of the first capacitor is greater than or equal to a capacitance value of the second capacitor.

For example, in some embodiments of the present disclosure, the capacitance value of the first capacitor is less than or equal to ten times the capacitance value of the second capacitor.

For example, in some embodiments of the present disclosure, the capacitance value of the second capacitor ranges from 0.01 pF to 2 pF.

For example, in some embodiments of the present disclosure, at least one of the first capacitor and the second capacitor is a structure of three capacitors connected in parallel, and the structure of three capacitors connected in parallel comprises a first portion of the second electrode plate, a second portion of the second electrode plate, a first portion of the first electrode plate, and a second portion of the first electrode plate.

For example, in some embodiments of the present disclosure, the first portion of the second electrode plate is connected with the second portion of the second electrode plate through a third via hole, the first portion of the first electrode plate is connected with the second portion of the first electrode plate through an connection portion, and the third via hole and the connection portion are respectively located on two opposite sides of the structure of three capacitors connected in parallel; and the first portion of the second electrode plate, the first portion of the first electrode plate, the second portion of the second electrode plate, and the second portion of the first electrode plate are arranged sequentially to form the structure of three capacitors connected in parallel, and the connection portion and the second portion of the second electrode plate are located in the same layer and insulated from each other.

For example, in some embodiments of the present disclosure, an orthogonal projection of the second electrode plate of the first capacitor on the base substrate partially overlaps with an orthogonal projection of the first electrode of the first transistor on the base substrate, and an orthogonal projection of the second electrode plate of the second capacitor on the base substrate partially overlaps with an orthogonal projection of the second electrode of the first transistor on the base substrate.

For example, in some embodiments of the present disclosure, the display substrate further comprises a first conductive line and a third connection electrode, wherein a first end of the first conductive line is connected with the first clock signal line, a second end of the first conductive line is connected with a first end of the third connection electrode, and a second end of the third connection electrode is connected with the first electrode plate of the first capacitor.

For example, in some embodiments of the present disclosure, the display substrate further comprises a fourth connection electrode and a fifth connection electrode, wherein the charge pump circuit further comprises a second transistor, a first end of the fourth connection electrode is connected with a gate electrode of the second transistor, the first end of the fourth connection electrode is connected with the second electrode plate of the first capacitor, a first end of the fifth connection electrode is connected with a first electrode of the second transistor, a second end of the fifth connection electrode is connected with the first conductive line, the first conductive line is connected with the first clock signal line, and a second electrode of the second transistor is connected with the third connection electrode.

For example, in some embodiments of the present disclosure, the first clock signal line extends along a first direction on the base substrate, the first capacitor, the first transistor and the second capacitor are sequentially arranged in a second direction, and the first direction intersects with the second direction.

For example, in some embodiments of the present disclosure, the display substrate further comprises a sixth connection electrode, a seventh connection electrode, an eighth connection electrode, a ninth connection electrode, a tenth connection electrode, an eleventh connection electrode, a second clock signal line and a second power line; the second clock signal line is configured to supply a second clock signal to the shift register unit, the second power line is configured to supply a second power voltage to the shift register unit, and the shift register unit further comprises a first node control transistor, a first output transistor, a second output transistor, and a third capacitor; a gate electrode of the first output transistor is electrically connected with the second electrode plate of the second capacitor through the sixth connection electrode, a first electrode of the first output transistor is electrically connected with the first power line through the seventh connection electrode, and a second electrode of the first output transistor is electrically connected with a driving signal output terminal through the eighth connection electrode; a gate electrode of the second output transistor is electrically connected with a first electrode plate of the third capacitor through the ninth connection electrode, a first electrode of the second output transistor is electrically connected with the driving signal output terminal through the eighth connection electrode, and a second electrode of the second output transistor is electrically connected with the second clock signal line through the tenth connection electrode; a second electrode plate of the third capacitor is electrically connected with the second clock signal line; and a first electrode of the first node control transistor is electrically connected with the second power line through the sixth connection electrode, and a second electrode of the first node control transistor is electrically connected with the first node through the eleventh connection electrode.

For example, in some embodiments of the present disclosure, an orthogonal projection of the third capacitor on the base substrate is adjacent to an orthogonal projection of the second output transistor on the base substrate.

For example, in some embodiments of the present disclosure, the second power line and the first power line are separately provided on both sides of the shift register unit.

For example, in some embodiments of the present disclosure, the second clock signal line and the second power line are located on the same side of the shift register unit; or the second clock signal line and the first power line are located on the same side of the shift register unit.

For example, in some embodiments of the present disclosure, the display substrate further comprises a twelfth connection electrode, a thirteenth connection electrode, a fourteenth connection electrode, and a third clock signal line; the third clock signal line is configured to supply a third clock signal to the shift register unit, and the shift register unit further comprises a first control transistor, a second control transistor, and a first isolation transistor; a gate electrode of the first control transistor is electrically connected with the second clock signal line, and a first electrode of the first control transistor is electrically connected with an input terminal through the twelfth connection electrode; a gate electrode of the second control transistor is electrically connected with the third clock signal line, a first electrode of the second control transistor is electrically connected with a second electrode of the first control transistor through the thirteenth connection electrode, a second electrode of the second control transistor is electrically connected with a second electrode of the first isolation transistor through the fourteenth connection electrode, a first electrode of the first isolation transistor is electrically connected with the second electrode plate of the first capacitor through the fourth connection electrode, and a gate electrode of the first isolation transistor is electrically connected with the first power line.

For example, in some embodiments of the present disclosure, the first control transistor and the second clock signal line are located on the same side of the second output transistor; or, the first control transistor and the second clock signal line are located on two opposite sides of the second output transistor.

For example, in some embodiments of the present disclosure, connection lines between centers of the first control transistor, the second control transistor, and the first isolation transistor constitute an acute triangle.

For example, in some embodiments of the present disclosure, the second control transistor, the first control transistor, the second output transistor, and the second clock signal line are sequentially arranged along the second direction.

For example, in some embodiments of the present disclosure, the second control transistor, the second capacitor, the first control transistor, the second output transistor, and the second clock signal lines are sequentially arranged along the second direction.

For example, in some embodiments of the present disclosure, the display substrate further comprises a fifteenth connection electrode, a sixteenth connection electrode, a seventeenth connection electrode, and an eighteenth connection electrode; the shift register unit further comprises a third control transistor, a fourth control transistor and a second isolation transistor; a gate electrode of the third control transistor is electrically connected with the third clock signal line, and a first electrode of the third control transistor is electrically connected with the first power line through the fifteenth connection electrode; a gate electrode of the fourth control transistor is electrically connected with the second electrode of the second control transistor, a first electrode of the fourth control transistor is electrically connected with the third clock signal line through the seventeenth connection electrode, and a second electrode of the fourth control transistor is electrically connected with the second electrode of the third control transistor through the sixteenth connection electrode; a gate electrode of the second isolation transistor is electrically connected with the first power line, a first electrode of the second isolation transistor is electrically connected with the second electrode of the fourth control transistor through the sixteenth connection electrode, and a second electrode of the second isolation transistor is connected with the eighteenth connection electrode.

For example, in some embodiments of the present disclosure, the third control transistor, the fourth control transistor, and the second isolation transistor are sequentially arranged along the second direction, an orthogonal projection of the third control transistor on the base substrate is adjacent to an orthogonal projection of the fourth control transistor on the base substrate, and an orthogonal projection of the second isolation transistor on the base substrate is adjacent to the orthogonal projection of the fourth control transistor on the base substrate.

For example, in some embodiments of the present disclosure, the display substrate further comprises a connection line and a nineteenth connection electrode, wherein the shift register unit further comprises a fifth control transistor, a sixth control transistor, a seventh control transistor and a fourth capacitor; a first electrode of the fourth capacitor is electrically connected with the eighteenth connection electrode, a gate electrode of the fifth control transistor is electrically connected with a first electrode plate of the fourth capacitor through the eighteenth connection electrode, a first electrode of the fifth control transistor is electrically connected with a second electrode plate of the fourth capacitor through the nineteenth connection electrode, and a second electrode of the fifth control transistor is electrically connected with the first clock signal line through the fifth connection electrode; a gate electrode of the sixth control transistor is electrically connected with the first clock signal line through the fifth connection electrode, a first electrode of the sixth control transistor is electrically connected with the second electrode plate of the fourth capacitor through the nineteenth connection electrode, and a second electrode of the sixth control transistor is electrically connected with the first electrode plate of the third capacitor through the ninth connection electrode; a gate electrode of the seventh control transistor is electrically connected with the second electrode of the second control transistor through the connection line and the fourteenth connection electrode, a first electrode of the seventh control transistor is electrically connected with the second power line through the eleventh connection electrode, and a second electrode of the seventh control transistor is electrically connected with the gate electrode of the second output transistor through the ninth connection electrode; and a gate electrode of the first node control transistor is connected with the second electrode plate of the fourth capacitor.

For example, in some embodiments of the present disclosure, an orthogonal projection of the fifth control transistor on the base substrate is adjacent to an orthogonal projection of the fourth capacitor on the base substrate, and an orthogonal projection of the sixth control transistor on the base substrate is adjacent to the orthogonal projection of the fourth capacitor on the base substrate.

For example, in some embodiments of the present disclosure, a center of the fourth capacitor, a center of the fifth control transistor, and a center of the sixth control transistor form an obtuse triangle or an acute triangle.

For example, in some embodiments of the present disclosure, the fifth control transistor and the sixth control transistor are arranged along the second direction, and the fifth control transistor and the sixth control transistor are located on the same side of the fourth capacitor.

For example, in some embodiments of the present disclosure, the first capacitor and the third capacitor are arranged in the first direction, the second capacitor and the fourth capacitor are arranged in the second direction, the second capacitor is located between the first capacitor and the third capacitor, and the fourth capacitor is located between the first capacitor and the third capacitor.

For example, in some embodiments of the present disclosure, a distance between the third capacitor and the second capacitor in the second direction is greater than a distance between the first capacitor and the second capacitor in the second direction.

At least one embodiment of the present disclosure provides a display device, comprising the display substrate according to any one of the embodiments of the present disclosure.

BRIEF DESCRIPTION OF THE DRAWINGS

In order to clearly illustrate the technical solution of the embodiments of the present disclosure, the drawings of the embodiments will be briefly described. It is obvious that the described drawings in the following are only related to some embodiments of the present disclosure and thus are not limitative of the present disclosure.

FIG. 4 to FIG. 12 are plan views of wirings or via holes of respective layers of the display substrate shown in FIG. 3;

FIG. 42 is a schematic diagram of a display device provided by at least one embodiment of the present disclosure.

DETAILED DESCRIPTION

In order to make objectives, technical details, and advantages of the embodiments of the present disclosure more apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment (s), without any inventive work, which should be within the scope of the present disclosure.

Unless otherwise defined, all the technical and scientific terms used herein have the same meanings as commonly understood by one of ordinary skill in the art to which the present disclosure belongs. The terms "first", "second", etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1A:
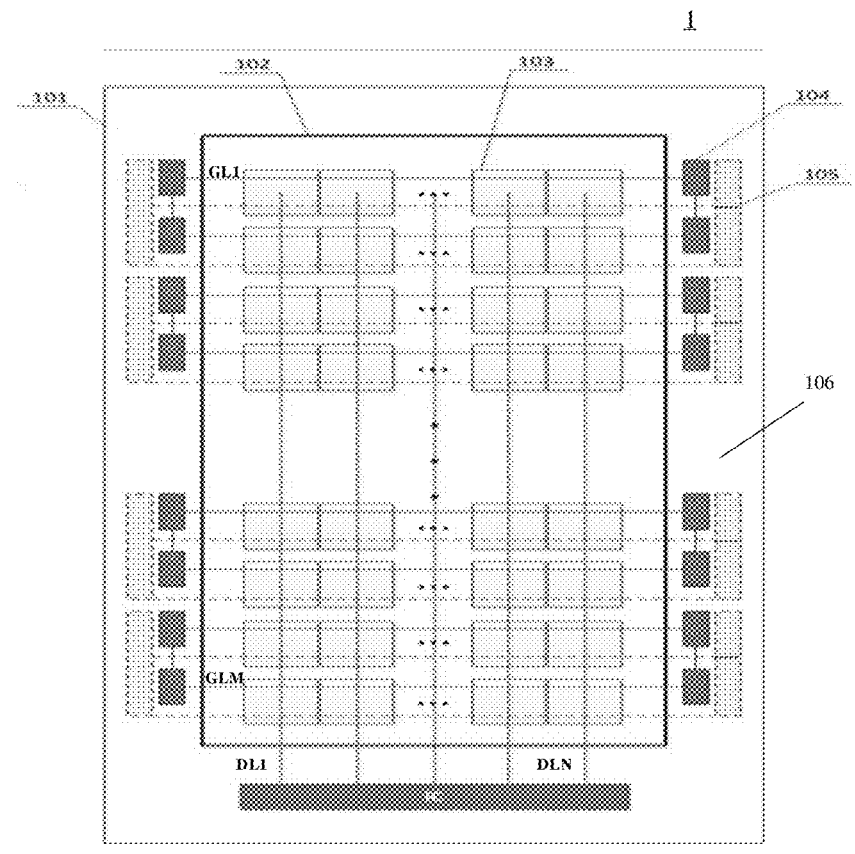
FIG. 1A is a schematic diagram of an overall circuit architecture of a display panel.

FIG. 1A is a schematic diagram of an overall circuit architecture of a display panel. For example, as shown in FIG. 1A, a rectangular frame indicated by reference sign 101 represents an overall outer frame line of the display panel. The display panel 101 includes a display region (i.e., a pixel array region) 102 and a peripheral region 106 located at the periphery of the display region 102, and the display region 102 includes pixel units 103 arranged in an array. The peripheral region 106 includes a scanning driving shift register unit 104, and a plurality of the scanning driving shift register units 104 that are cascaded form a gate driving circuit (Gate GOA), which is used to provide, for example, gate scanning signals shifted row by row to the pixel units 103 arranged in an array in the display region 102 of the display panel 101. The peripheral region 106 further includes a light-emitting control shift register unit 105, and a plurality of the light-emitting control shift register units 105 that are cascaded constitute a light-emitting control driving circuit array (EM GOA), which is used to provide, for example, light-emitting control signals shifted row by row to the pixel units 103 arranged in an array in the display region 102 of the display panel 101, that is, light-emitting control driving circuit array is a gate driving circuit for outputting the light-emitting control signals.

In some embodiments, an output signal output by an output circuit of one shift register unit 104 is correspondingly output to two rows of pixel units 103, and the embodiments of the present disclosure include but are not limited thereto.

As shown in FIG. 1A, the data lines DL1 to DLN (N is an integer greater than 1) connected with a data driving chip IC longitudinally pass through the display region 102 to provide data signals to the pixel units 103 arranged in an array. The gate lines GL1 to GLM (M is an integer greater than 1) connected with the scanning driving shift register units 104 and the light-emitting control shift register units 105 laterally cross the display region 102 to provide the gate scanning signals and the light-emitting control signals to the pixel units 103 arranged in an array. For example, each pixel unit 103 includes a pixel circuit having a circuit structure such as 7T1C, 8T2C or 4T1C in the art and a light-emitting element, and the pixel circuit is operated under the control of the data signal transmitted through the data lines and the gate scanning signals and the light-emitting control signals transmitted through the gate lines to drive the light-emitting element to emit light, so as to implement display and other operations. The light-emitting element is, for example, an organic light-emitting diode (OLED) or a quantum dot light-emitting diode (QLED).

In order to keep the pixel brightness fluctuation within a reasonable range, the data still needs to be refreshed when the picture is static, because the voltage that controls brightness the changes with time due to leakage. In order to reduce power consumption, reducing the refresh frequency is a more effective method, and meanwhile, in order to maintain the display quality, it is necessary to reduce the pixel leakage rate. The oxide semiconductors have the characteristics of ultra-low leakage to meet the demand. In order to make the pixel unit have a faster charging speed and smaller parasitic capacitance, a better way is fabricating the display substrates by using a low temperature polycrystalline oxide (LTPO) process, in combination with the advantages of low temperature poly-silicon (LTPS) and oxide semiconductors. That is, two types of TFT devices, i.e., low temperature poly-silicon (LTPS) and oxide, are integrated in the same pixel unit.

Figure 1B:
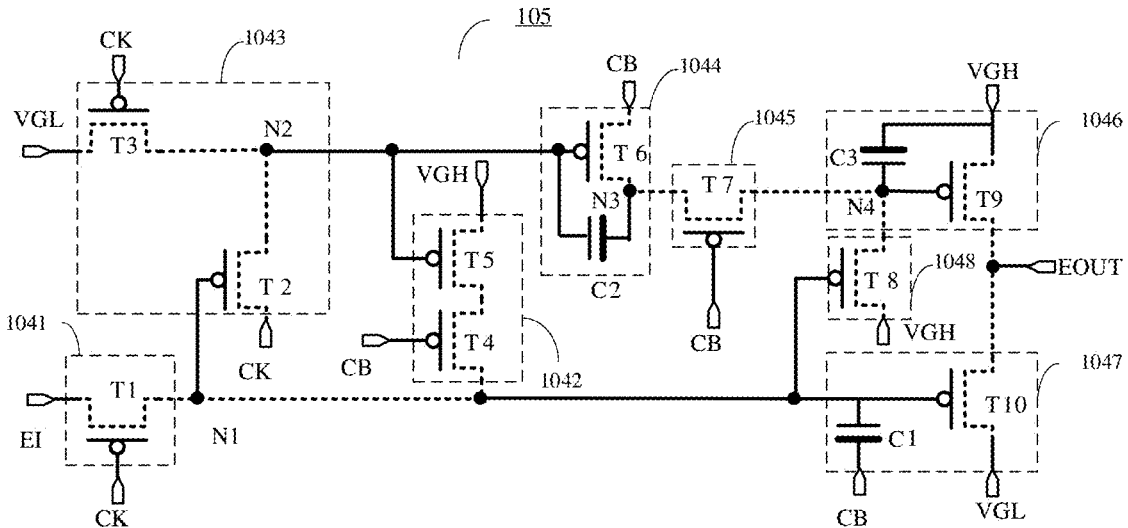
FIG. 1B is a schematic diagram of a shift register unit.
Figures 1C, 2A:
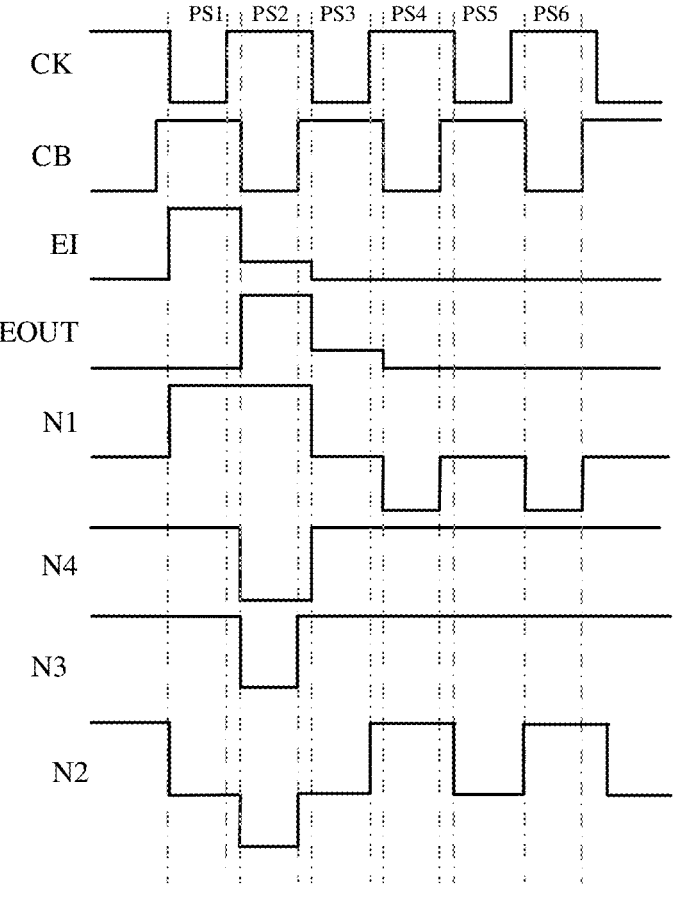
FIG. 1C is a signal timing diagram of the shift register unit shown in FIG. 1B during operation.
FIG. 2A is a schematic diagram of a shift register unit.

FIG. 1B is a schematic diagram of a shift register unit. FIG. 1C is a signal timing diagram of the shift register unit shown in FIG. 1B during operation. As shown in FIG. 1C, an operation process of the shift register unit includes 6 phases, namely a first phase PS1, a second phase PS2, a third phase PS3, a fourth phase PS4, a fifth phase PS5, and a sixth phase PS6. The first phase PS1 is an input phase, the second phase PS2 is an output phase, the third phase PS3 is a reset phase, the fourth phase PS4 is a first keeping period, the fifth phase PS5 is a second keeping period, and the sixth phase PS6 is a third keeping period. That is, the fourth phase PS4, the fifth phase PS5, and the sixth phase PS6 constitute a keeping phase. As shown in FIG. 1B, the shift register unit adopts a 10T3C structure including ten transistors (T1 to T10) and three capacitors (capacitor C1 to capacitor C3). When the structure is used in an OLED light-emitting control switch EM, the influence of reset delay may be ignored. But when the structure is used in switch control of an oxide thin film transistor in the display substrate fabricated by the LTPO process, it will seriously affect the charging time of the pixel units. For example, the data lines of the AMOLED are shared to charge the pixel units row by row. The GOA provides a switching signal to the pixel units. In order to prevent data from being incorrectly charged, the data signal may only be changed to data of next row after the switch is closed, that is, after GOA output is reset, and the pixel units cannot be charged effectively during this period of waiting for GOA reset. After the resolution and the refresh rate are determined, the total time available for each row of pixel units is determined, so that the faster the GOA reset, the longer the pixel charging time, and conversely, the shorter the pixel charging time, because reset step delay may reach as long as 2 rows.

As shown in FIG. 1B, when a plurality of shift register units are cascaded, a first electrode of a transistor T1 in a first-stage shift register unit is connected with an input terminal EI. The input terminal EI is configured to be connected with a trigger signal line to receive a trigger signal as an input signal, and a first electrode of a transistors T1 in other respective stage of shift register unit is electrically connected with an output terminal EOUT of a previous-stage shift register unit to receive an output signal output by the output terminal EOUT of the previous-stage shift register unit as an input signal, thereby implementing shift output, so as to provide, for example, the light-emitting control signal shifted row by row to the pixel units 103 arranged in an array in the display region 102 of the display panel 101.

In addition, as shown in FIG. 1B, the shift register unit further includes a clock signal terminal CK and a clock signal terminal CB. For example, one of the clock signal terminal CK and the clock signal terminal CB is configured to provide a first clock signal, and the other of the clock signal terminal CK and the clock signal terminal CB is configured to provide a second clock signal. For example, the first clock signal and the second clock signal respectively adopt a pulse signal with a duty ratio greater than 50%, and a difference between the two pulse signals is, for example, a half cycle. For example, VGL represents a first power line and a first power voltage provided by the first power line, VGH represents a second power line and a second power voltage provided by the second power line, and the second power voltage is greater than the first power voltage. For example, the second power voltage is at a direct-current high level, and the first power voltage is at a direct-current low level. N1, N2, N3 and N4 respectively represent a first node, a second node, a third node and a fourth node in a circuit schematic diagram. For example, the first power voltage VGL is VSS, and the second power voltage VGH is VDD.

FIG. 1B shows a semiconductor layer LY0, a first conductive layer LY1 and a second conductive layer LY2. The semiconductor layer LY0 includes active layers of respective transistors, the first conductive layer LY1 includes source electrodes and drain electrodes of respective transistors, and the second conductive layer LY2 includes various connection lines.

In order to reduce a leakage speed of the pixel units, a charge pump circuit is introduced into a denoising module to facilitate the denoising module to be continuously turned on during the keeping phase, so as to eliminate noise interference in time, thereby ensuring stability of GOA output and improving stability of the driving circuit and display. For example, the denoising module includes a charge pump circuit and a denoising transistor. For example, the denoising transistor includes a first output transistor T10.

Figure 2B:
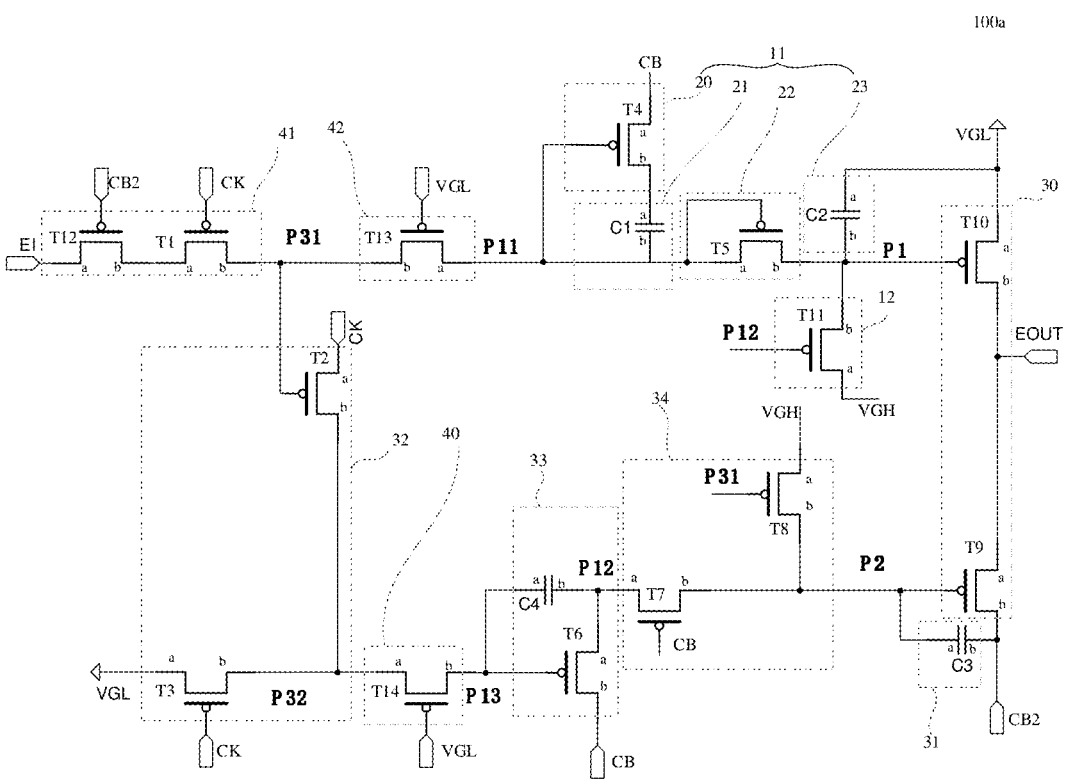
FIG. 2B is a circuit diagram of a shift register unit.
Figure 2C:
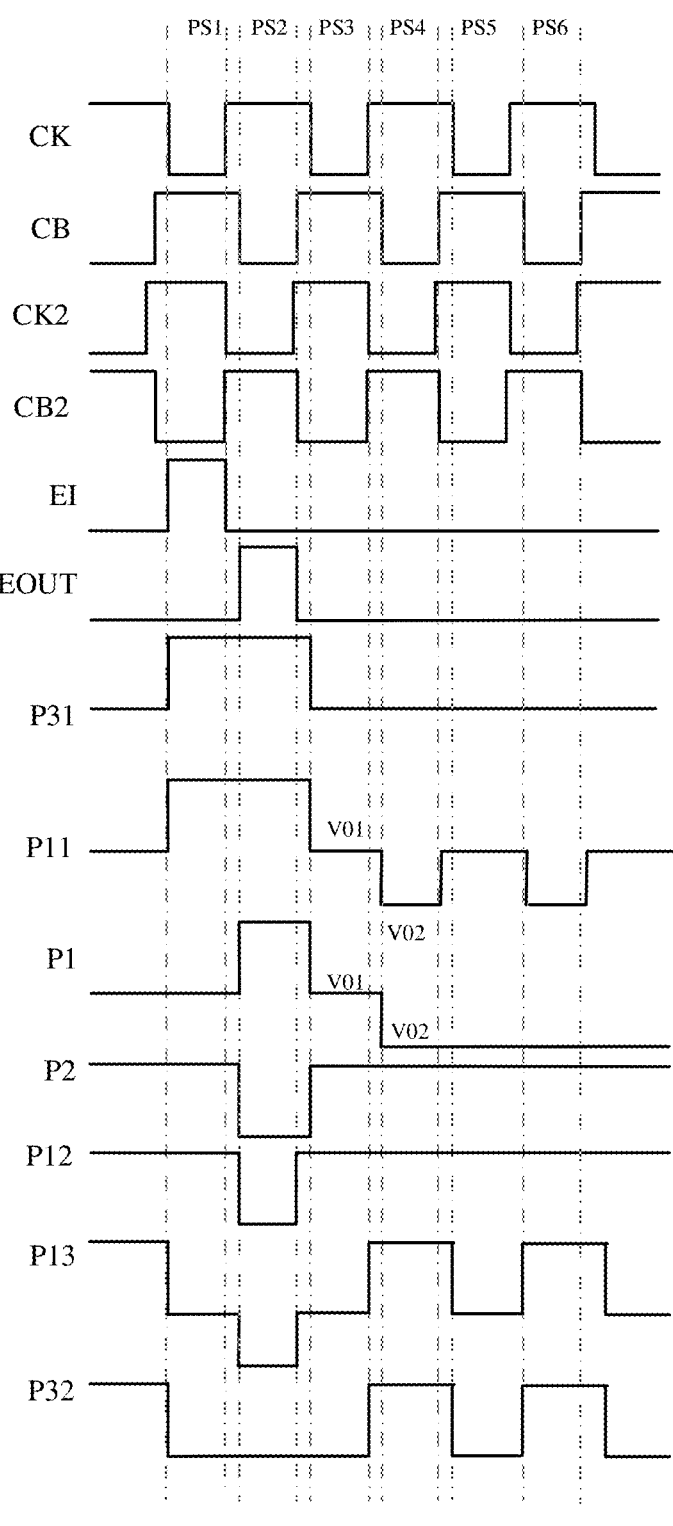
FIG. 2C is a signal timing diagram of the shift register unit shown in FIG. 2B during operation.

FIG. 2A is a schematic diagram of a shift register unit. FIG. 2B is a circuit diagram of a shift register unit. FIG. 2C is a signal timing diagram of the shift register unit shown in FIG. 2B during operation. The operation process of the shift register unit is briefly introduced below in conjunction with FIG. 2A to FIG. 2C.

As shown in FIG. 2A, the shift register unit 100 includes a charge pump circuit 11. The charge pump circuit 11 is respectively electrically connected with a first input node P11, a first clock signal terminal CB, and a first node P1, and is configured to, under the control of the first clock signal provided by the first clock signal terminal CB during the first period, convert the potential of the first input node P11 from a first voltage signal to a second voltage signal, and transmit the second voltage signal to the first node P1, and is further configured to maintain the potential of the first node P1 during the second period. That is, in the second period, the potential of the first node P1 is maintained as the second voltage signal. For example, the polarity of the first voltage signal is the same as the polarity of the second voltage signal, and the absolute value of the voltage value of the second voltage signal is greater than the absolute value of the voltage value of the first voltage signal. For example, in the second period, when the potential of the first node P1 is maintained as the second voltage signal, the voltage signal of the first input node P11 may be adjusted to the first voltage signal. For example, the first period is a first keeping period, and the second period is a second keeping period. For example, in the second period, when the potential of the first node P1 is maintained as the second voltage signal, the voltage signal of the first input node P11 may be the first voltage signal. For example, the first period is a first keeping period, and the second period is a third keeping period. FIG. 2C shows the first voltage signal V01 and the second voltage signal V02.

The charge pump is a structure similar to a water pump in a circuit, which implements redistribution of charges and achieves a purpose of boosting (or bucking) mainly through a capacitor, clock, and diode rectification structure. For example, the shift register unit including the charge pump circuit 11 can sufficiently buck or boost the potential of the first node P1 during the keeping phase through the charge pump circuit 11, so that in the keeping phase, the first output transistor controlled by the first node P1 is kept on, which further allows the potential of the driving signal output by the shift register unit not to be affected by noise interference during the keeping phase.

For example, the polarity of the first voltage signal being the same as the polarity of the second voltage signal refers to that: when the first voltage signal is a positive voltage signal, the second voltage signal is a positive voltage signal; and when the first voltage signal is a negative voltage signal, the second voltage signal is a negative voltage signal.

The absolute value of the voltage value of the second voltage signal being greater than the absolute value of the voltage value of the first voltage signal refers to that: when the first voltage signal is a positive voltage signal, the voltage value of the second voltage signal is greater than the voltage value of the first voltage signal; and when the first voltage signal is a negative voltage signal, the voltage value of the second voltage signal is less than the voltage value of the second voltage signal.

When the shift register unit 100 is operating, the charge pump circuit 11 can further buck or boost the potential of the first node P1 during the keeping phase.

For example, during operation of the shift register unit 100, when the potential of the first voltage signal is −5 V, the potential of the second voltage signal is greater than or equal to −15 V and less than or equal to −10 V, that is, the charge pump circuit can pump the potential of the first voltage signal 2 to 3 times lower, but is not limited thereto.

As shown in FIG. 2B, the shift register unit 100a includes 14 transistors T1 to T14 and 4 capacitors (a first capacitor C1, a second capacitor C2, a third capacitor C3, and a fourth capacitor C4). FIG. 2B shows first electrodes a and second electrodes b of the respective transistors, and first electrode plates a and second electrode plates b of the respective capacitors. In the embodiments of the present disclosure shown in FIG. 2B and subsequent drawings, for convenience of description, T1 to T14 shown in the drawings are simplified as transistors T1 to T14. In order to distinguish respective transistors, names of the respective transistors may be defined, for example, the transistor T1 is referred to as a second control transistor T1, the transistor T2 is referred to as a fourth control transistor T2, the transistor T3 is referred to as a third control transistor T3, the transistor T4 is referred to as a second control transistor T4, the transistor T5 is referred to as a first transistor T5, the transistor T6 is referred to as a fifth control transistor T6, the transistor T7 is referred to as a sixth control transistor T7, the transistor T8 is referred to as a seventh control transistor T8, the transistor T9 is referred to as a second output transistor T9, the transistor T10 is referred to as a first output transistor T10, the transistor T11 is referred to as a first node control transistor T11, the transistor T12 is referred to as a first control transistor T12, the transistor T13 is referred to as a first isolation transistor T13, and the transistor T14 is referred to as a second isolation transistor T14. For example, when a plurality of shift register units 100a are cascaded, a first electrode of the first control transistor T12 in the first-stage shift register unit 100a is connected with an input terminal EI. The input terminal EI is configured to be connected with the trigger signal line to receive the trigger signal as the input signal, and a first electrode of the first control transistor T12 in other respective stage of shift register unit 100a is electrically connected with the output terminal EOUT of a previous-stage shift register unit 100a to receive an output signal output by the output terminal EOUT of the previous-stage shift register unit as the input signal, thereby implementing shift output, so as to provide, for example, the light-emitting control signal shifted row by row to the pixel units 103 arranged in an array in the display region 102 of the display panel 101.

In addition, as shown in FIG. 2B, the shift register unit 100a further includes a first clock signal terminal CB and a second clock signal terminal CB2. For example, the first clock signal terminal CB is connected with the first clock signal line or the second clock signal line to receive the first clock signal. For example, when the first clock signal terminal CB is connected with the first clock signal line, the first clock signal line provides the first clock signal; when the first clock signal terminal CB is connected with the second clock signal line, the second clock signal line provides the first clock signal, which specifically depends on an actual situation, and is not limited in the embodiments of the present disclosure. Similarly, the second clock signal terminal CB2 is connected with the second clock signal line or the first clock signal line to receive the second clock signal. Hereinafter, it is introduced by taking the case where the first clock signal terminal CB is connected with the first clock signal line to receive the first clock signal, and the second clock signal terminal CB2 is connected with the second clock signal line to receive the second clock signal as an example, which is not limited in the embodiments of the present disclosure. For example, the first clock signal and the second clock signal respectively adopt a pulse signal with a duty ratio greater than 50%, and a difference between the two pulse signals is, for example, a half cycle.

In addition, as shown in FIG. 2B, the shift register unit further includes a third clock signal terminal CK and a fourth clock signal terminal CK2 (not shown in FIG. 2B). For example, in a next-stage shift register unit behind the shift register unit shown in FIG. 2B, the third clock signal terminal CK shown in FIG. 2B is replaced with the fourth clock signal terminal CK2. For example, the third clock signal terminal CK is connected with the third clock signal line or the fourth clock signal line to receive a third clock signal. For example, when the third clock signal terminal CK is connected with the third clock signal line, the third clock signal line provides the third clock signal; when the third clock signal terminal CK is connected with the fourth clock signal line, the fourth clock signal line provides the third clock signal, which specifically depends on an actual situation, and is not limited in the embodiments of the present disclosure. Similarly, the fourth clock signal terminal CK2 is connected with the third clock signal line or the fourth clock signal line to receive a fourth clock signal. Hereinafter, it is introduced by taking the case where the third clock signal terminal CK is connected with the third clock signal line to receive the third clock signal, and the fourth clock signal terminal CK2 is connected with the fourth clock signal line to receive the fourth clock signal as an example, which is not limited in the embodiments of the present disclosure. For example, the third clock signal and the fourth clock signal respectively adopt a pulse signal with a duty ratio greater than 50%, and a difference between the two pulse signals is, for example, a half cycle.

For example, VGL represents the first power line and the first power voltage provided by the first power line, VGH represents the second power line and the second power voltage provided by the second power line, and the first power voltage is greater than the second power voltage. For example, the first power voltage is at a direct-current high level, and the second power voltage is at a direct-current low level. For example, P31, P11, P1, P2, P12, P13 and P32 respectively represent the first isolation node, the first input node, the first node, the second node, the second input node, the third input node, and the second isolation node in the circuit schematic diagrams. That is, FIG. 2B shows the first isolation node P31, the first input node P11, the first node P1, the second node P2, the second input node P12, the third input node P13, and the second isolation node P32. As shown in FIG. 2B, the shift register unit 100a includes a charge pump circuit 11, a first isolation node control sub-circuit 41, a first isolating sub-circuit 42, a first tank circuit 31, a first node control circuit 12, a second isolation node control sub-circuit 32, a second isolating sub-circuit 40, a second input node control sub-circuit 33, a second node control sub-circuit 34, and an output circuit 30.

As shown in FIG. 2B, the charge pump circuit 11 includes a first clock signal terminal CB, a first capacitor C1, a first transistor T5, and a second capacitor C2. A first electrode plate of the first capacitor C1 is connected with the first clock signal terminal CB, and a second electrode plate of the first capacitor C1 is connected with the first input node P11. A first electrode of the first transistor T5 is connected with the first input node P11, and a second electrode of the first transistor T5 is connected with the first node P1. A gate electrode of the first transistor T5 is connected with the first electrode or the second electrode of the first transistor T5 to form a diode-connected triode. A first electrode plate of the second capacitor C2 is connected with the first power line VGL, and a second electrode plate of the second capacitor C2 is connected with the first node P1.

As shown in FIG. 2B, the charge pump circuit 11 further includes a second transistor T4. A gate electrode of the second transistor T4 is electrically connected with the first input node P11, a first electrode of the second transistor T4 is electrically connected with the first clock signal terminal CB, and a second electrode of the second transistor T4 is electrically connected with the first electrode plate of the first capacitor C1.

It should be noted that, the charge pump circuit 11 may not include the second transistor T4. In the case where the charge pump circuit 11 does not include the second transistor T4, the first clock signal terminal CB is connected with the first electrode plate of the first capacitor C1.

As shown in FIG. 2B, the output circuit 30 is respectively connected with the first node P1, the second node P2, the first power line VGL, the second clock signal terminal CB2, and the output terminal EOUT. The output circuit 30 is configured to output the first power voltage to the output terminal EOUT for reset under the control of the potential of the first node P1, and output the second clock signal to the output terminal EOUT to output a valid driving signal, under the control of the potential of the second node P2.

As shown in FIG. 2B, the output circuit 30 includes a first output transistor T10 and a second output transistor T9. A gate electrode of the first output transistor T10 is electrically connected with the first node P1, a first electrode of the first output transistor T10 is electrically connected with the first power line VGL, and a second electrode of the first output transistor T10 is electrically connected with the driving signal output terminal EOUT. A gate electrode of the second output transistor T9 is electrically connected with the second node P2, a first electrode of the second output transistor T9 is electrically connected with the driving signal output terminal EOUT, and a second electrode of the second output transistor T9 is electrically connected with the second clock signal terminal CB2. On the one hand, by adding the second clock signal terminal CB2, a reset speed of the output terminal EOUT is accelerated. On the other hand, by connecting the second electrode of the second output transistor T9 with the second clock signal terminal CB2, it is favorable for accelerating the charging and discharging speed of the output terminal EOUT.

For example, the first output transistor T10 is a p-type transistor, and the first voltage signal is a negative voltage signal; or, the first output transistor T10 is an n-type transistor, and the first voltage signal is a positive voltage signal.

For example, in the case where the first output transistor is a p-type transistor, the first voltage signal is a negative voltage signal, and the charge pump circuit 11 can further buck the potential of the first node P1. In the case where the first output transistor is an n-type transistor, the first voltage signal is a positive voltage signal, and the charge pump circuit 11 can further boost the potential of the first node P1, which is not limited thereto. As shown in FIG. 2C, an operation process of the shift register unit includes 6 phases, namely, a first phase PS1, a second phase PS2, a third phase PS3, a fourth phase PS4, a fifth phase PS5, and a sixth phase PS6. The first phase PS1 is an input phase, the second phase PS2 is an output phase, the third phase PS3 is a reset phase, the fourth phase PS4 is a first keeping period, the fifth phase PS5 is a second keeping period, and the sixth phase PS6 is a third keeping period. That is, the fourth phase PS4, the fifth phase PS5, and the sixth phase PS6 constitute a keeping phase. In the embodiments of the present disclosure, one operating cycle of the shift register unit may include an input phase, an output phase, a reset phase, and a keeping phase that are sequentially set; in the input phase, the input terminal provides an input signal; in the output phase, the shift register unit outputs a valid driving signal; in the reset phase, the driving signal is reset so that the shift register unit outputs an invalid driving signal; and in the keeping phase, the shift register unit needs to keep outputting an invalid driving signal.

For example, the driving signal output by the shift register unit is output to a gate electrode of a transistor of the pixel circuit. In the case where the transistor receiving the driving signal output by the shift register unit is an n-type transistor, the potential of the valid driving signal is a high voltage, and the potential of the invalid driving signal is a low voltage. In the case where the transistor receiving the driving signal output by the shift register unit is a p-type transistor, the potential of the valid driving signal is a low voltage, and the potential of the invalid driving signal is a high voltage.

As shown in FIG. 2B, the first tank circuit 31 is respectively connected with the second node P2 and the second clock signal terminal CB2, and the first tank circuit 31 is configured to control the potential of the second node P2. For example, the first tank circuit 31 is configured to maintain the potential of the second node P2 in the keeping phase. For example, as shown in FIG. 2B, the first tank circuit 31 includes a third capacitor C3, a first electrode plate of the third capacitor C3 is electrically connected with the second node P2, and a second electrode plate of the third capacitor C3 is connected with the second clock signal terminal CB2.

As shown in FIG. 2B, the first isolation node control sub-circuit 41 is respectively electrically connected with the second clock signal terminal CB2, the third clock signal terminal CK, the input terminal EI, and the first isolation node P31, and is configured to transmit the input signal of the input terminal EI to the first isolation node P31 under the control of the second clock signal and the third clock signal.

As shown in FIG. 2B, the first isolation node control sub-circuit 41 includes a first control transistor T12 and a second control transistor T1. As shown in FIG. 2B, a gate electrode of the first control transistor T12 is electrically connected with the second clock signal terminal CB2, and a first electrode of the first control transistor T12 is electrically connected with the input terminal EI. A gate electrode of the second control transistor T1 is electrically connected with the third clock signal terminal CK, a first electrode of the second control transistor T1 is electrically connected with a second electrode of the first control transistor T12, and a second electrode of the second control transistor T1 is electrically connected with the first isolation node P31. For example, in the case where the shift register unit is a first-stage shift register unit, the input terminal EI is connected with the trigger signal line to receive the trigger signal. In the case where the shift register unit is other respective stage of shift register unit except the first-stage shift register unit, the input terminal EI is connected with an output terminal EOUT of a previous-stage shift register unit thereof. In other embodiments, the first isolation node control sub-circuit 41 includes only the first control transistor T12 or only the second control transistor T1. For example, providing the first control transistor T12 and the second control transistor T1 can help to reduce leakage current.

As shown in FIG. 2B, the first isolating sub-circuit 42 is respectively electrically connected with the first power line VGL, the first isolation node P31, and the first input node P11, and is configured to control whether the first isolation node P31 and the first input node P11 are connected. For example, providing the first isolating sub-circuit 42 can reduce leakage current from the first input node P11 to the first isolation node P31, that is, the potential of the first isolation node P31 is maintained when the potential of the first input node P11 changes, so as to improve the response speed of driving signal output. As shown in FIG. 2B, the first isolating sub-circuit 42 includes a first isolation transistor T13. As shown in FIG. 2B, a gate electrode of the first isolation transistor T13 is electrically connected with the first power line VGL, a first electrode of the first isolation transistor T13 is electrically connected with the first input node P11, and a second electrode of the first isolation transistor T13 is electrically connected with the first isolation node P31. For example, providing the first isolation transistor T13 can reduce leakage current from the first input node P11 to the first isolation node P31, so that the response speed of driving signal output is faster. For example, in other embodiments, the first isolating sub-circuit 42 is not provided, in this case, the first isolation node P31 and the first input node P11 are the same node.

As shown in FIG. 2B, the second node control sub-circuit 34 is respectively electrically connected with the first clock signal terminal CB, the second input node P12, the second node P2, the first isolation node P31, and the second power line VGH. The second node control sub-circuit 34 is configured to turn on or off the connection between the second input node P12 and the second node P2 under the control of the first clock signal, and is configured to write the second power voltage into the second node P2 under the control of the potential of the first isolation node P31, so as to control the potential of the second node P2.

As shown in FIG. 2B, the second node control sub-circuit 34 includes a sixth control transistor T7 and a seventh control transistor T8. As shown in FIG. 2B, a gate electrode of the sixth control transistor T7 is electrically connected with the first clock signal terminal CB, a first electrode of the sixth control transistor T7 is electrically connected with the second input node P12, and a second electrode of the sixth control transistor T7 is electrically connected with the second node P2. A gate electrode of the seventh control transistor T8 is electrically connected with the first isolation node P31, a first electrode of the seventh control transistor T8 is electrically connected with the second power line VGH, and a second electrode of the seventh control transistor T8 is electrically connected with the second node P2. For example, the sixth control transistor T7 can prevent leakage to the second input node P12, isolate influence of the fourth capacitor C4 on the second node P2, and enhance the coupling effect of the second clock signal provided by the second clock signal terminal CB2 on the second node P2, so that when the potential of the second clock signal decreases, the potential of the second node P2 can be lower, thereby accelerating the discharge speed of the second output transistor T9 to the output terminal EOUT.

As shown in FIG. 2B, the second input node control sub-circuit 33 is respectively electrically connected with the third input node P13, the second input node P12, and the first clock signal terminal CB. the second input node control sub-circuit 33 is configured to write the first clock signal into the second input node P12 under the control of the potential of the third input node P13, and is configured to control the potential of the second input node P12 according to the potential of the third input node P13. As shown in FIG. 2B, the second input node control sub-circuit 33 includes a fifth control transistor T6 and a fourth capacitor C4. As shown in FIG. 2B, a gate electrode of the fifth control transistor T6 is electrically connected with the third input node P13, a first electrode of the fifth control transistor T6 is electrically connected with the second input node P12, and a second electrode of the fifth control transistor T6 is electrically connected with the first clock signal terminal CB. A first electrode plate of the fourth capacitor C4 is electrically connected with the third input node P13, and a second electrode plate of the fourth capacitor C4 is electrically connected with the second input node P12.

As shown in FIG. 2B, the second isolation node control sub-circuit 32 is respectively connected with the first isolation node P31, the second isolation node P32, the third clock signal terminal CK, and the first power line VGL, and is configured to input the first power voltage or the third clock signal to the second isolation node P32, under the control of the potential of the first isolation node P31 and the third clock signal, to control the potential of the second isolation node P32.

For example, as shown in FIG. 2B, the second isolation node control sub-circuit 32 includes a third control transistor T3 and a fourth control transistor T2. As shown in FIG. 2B, a gate electrode of the third control transistor T3 is electrically connected with the third clock signal terminal CK, a first electrode of the third control transistor T3 is electrically connected with the first power line VGL, and a second electrode of the third control transistor T3 is electrically connected with the second isolation node P32. As shown in FIG. 2B, a gate electrode of the fourth control transistor T2 is electrically connected with the first isolation node P31, a first electrode of the fourth control transistor T2 is electrically connected with the third clock signal terminal CK, and a second electrode of the fourth control transistor T2 is electrically connected with the second isolation node P32.

As shown in FIG. 2B, the second isolating sub-circuit 40 is respectively connected with the second isolation node P32, the third input node P13, and the first power line VGL, and is configured to control whether the second isolation node P32 and the third input node P13 are connected. The second isolating sub-circuit 40 is provided to prevent leakage from the third input node P13 to the second isolation node P32, and isolate influence of the fourth capacitor C4 on the second isolation node P32.

For example, as shown in FIG. 2B, the second isolating sub-circuit 40 includes a second isolation transistor T14. As shown in FIG. 2B, a gate electrode of the second isolation transistor T14 is electrically connected with the first power line VGL, a first electrode of the second isolation transistor T14 is electrically connected with the second isolation node P32, and a second electrode of the second isolation transistor T14 is electrically connected with the third input node P13. Providing the second isolation transistor T14 can reduce leakage of the third input node P13 to the second isolation node P32, so that the response speed of driving signal output is faster. In other embodiments, the second isolation transistor T14 is not provided, in this case, the second isolation node P32 and the third input node P13 are the same node.

As shown in FIG. 2B, the first node control circuit 12 is respectively electrically connected with the second input node P12, the second power line VGH, and the first node P1, and is configured to write the second power voltage into the first node P1 under the control of the potential of the second input node P12 to control the potential of the first node P1. For example, as shown in FIG. 2B, the first node control circuit 12 includes a first node control transistor T11. As shown in FIG. 2B, a gate electrode of the first node control transistor T11 is electrically connected with the second input node P12, a first electrode of the first node control transistor T11 is electrically connected with the second power line VGH, and a second electrode of the first node control transistor T11 is electrically connected with the first node P1.

The transistors in the shift register unit 100a shown in FIG. 2B are all described by taking P-type transistors as an example, that is, the respective transistors are turned on when the gate electrodes are input by a low level (ON level), and are turned off when the gate electrodes are input by a high level (OFF level). For example, the first electrode of the transistor is a source electrode, and the second electrode of the transistor is a drain electrode.

The shift register unit includes, but is not limited to, the setting mode of FIG. 2B, for example, the respective transistors in the shift register unit 100a may also adopt N-type transistors or a mixture of P-type transistors and N-type transistors, as long as each electrode of the transistor of selected type is correspondingly connected with reference to each electrode of the corresponding transistor employed in examples of the embodiments of the present disclosure.

It should be noted that, the transistors adopted in the shift register unit may all be thin film transistors or field effect transistors or other switch devices with same characteristics. Herein, all is described by taking thin film transistors as an example, for example, the active layer (a channel region) of the transistor is made of a semiconductor material, for example, polysilicon (e.g., low-temperature polysilicon or high-temperature polysilicon), amorphous silicon, indium gallium zinc oxide (IGZO), etc., while the gate electrode, the source electrode, and the drain electrode are made of metal materials, for example, metal aluminum or aluminum alloy. The source electrode and the drain electrode of the transistor adopted here may be symmetrical in structure, so the source electrode and the drain electrode thereof may be structurally indistinguishable. In the embodiments of the present disclosure, in order to distinguish the two electrodes of the transistor other than the gate electrode, one electrode is directly described as a first electrode and the other electrode as a second electrode. In addition, in the embodiments of the present disclosure, electrode plates of the capacitor may be metal electrodes or one of the electrode plates may be made of a semiconductor material (e.g., doped polysilicon). The material of the electrode plate of the capacitor according to the embodiments of the present disclosure is described by taking metal as an example.

FIG. 2C is a signal timing diagram of the shift register unit 100a shown in FIG. 2B during operation and a schematic diagram of potential waveforms of respective nodes. The operation process of the shift register unit is described in detail below in conjunction with FIG. 2B and FIG. 2C. For example, it is explained by taking an operating principle of an (N+2)th-stage shift register unit as an example, operating principles of other stages of shift register units are similar thereto, and no details are repeated here. As shown in FIG. 2C, the operation process of the shift register unit includes 6 phases, namely, a first phase PS1, a second phase PS2, a third phase PS3, a fourth phase PS4, a fifth phase PS5, and a sixth phase PS6, and FIG. 2C shows timing waveforms of respective signals in each phase. The first phase PS1 is an input phase, the second phase PS2 is an output phase, the third phase PS3 is a reset phase, the fourth phase PS4 is a first keeping period, the fifth phase PS5 is a second keeping period, and the sixth phase PS6 is a third keeping period. That is, the fourth phase PS4, the fifth phase PS5, and the sixth phase PS6 constitute a keeping phase.

In the first phase PS1, as shown in FIG. 2C, the third clock signal terminal CK provides a low voltage, the first clock signal terminal CB provides a high voltage, the second clock signal terminal CB2 provides a low voltage, the input terminal EI provides a high voltage, the first control transistor T12 and the second control transistor T1 are turned on, the first isolation transistor T13 is turned on, the potential of the first input node P11 is a high voltage, the potential of the first isolation node P31 is a high voltage, and the first transistor T5 and the second transistor T4 are both turned off. The fourth control transistor T2 is turned off, the third control transistor T3 is turned on, the second isolation transistor T14 is turned on, the potential of the second isolation node P32 is a low voltage, the potential of the third input node P13 is a low voltage, the fifth control transistor T6 is turned on, the potential of the second input node P12 is a high voltage, the sixth control transistor T7 is turned off, the seventh control transistor T8 is turned off, the first node control transistor T11 is turned off, the potential of the first node P1 is maintained as a low voltage, the potential of the second node P2 is maintained as a high voltage, the first output transistor T10 is turned on, the second output transistor T9 is turned off, and the output terminal EOUT outputs a low voltage.

In the second phase PS2, as shown in FIG. 2C, in the output phase, the third clock signal terminal CK provides a high voltage, the first clock signal terminal CB provides a low voltage, the second clock signal terminal CB2 provides a high voltage, the input terminal EI provides a low voltage, and both the first control transistor T12 and the second control transistor T1 are turned off. Due to the storage effect of the first capacitor C1, the potential of the first input node P11 is maintained as a high voltage, the first isolation transistor T13 is turned on, and the potential of the first isolation node P31 is a high voltage. The second transistor T4 is turned off, the first transistor T5 is turned off, the fourth control transistor T2 is turned off, the third control transistor T3 is turned off, the potential of the second isolation node P32 is maintained as a low voltage, the second isolation transistor T14 is turned off, the potential of the third input node P13 is further bucked by the fourth capacitor C4, the fifth control transistor T6 is turned on, the potential of the second input node P12 is a low voltage, the sixth control transistor T7 is turned on, the seventh control transistor T8 is turned off, the first node control transistor T11 is turned on, the potential of the first node P1 is a high voltage, the potential of the second node P2 is a low voltage, the second output transistor T9 is turned on, the first output transistor T10 is turned off, and the output terminal EOUT outputs a high voltage.

In the third phase PS3, as shown in FIG. 2C, the third clock signal terminal CK provides a low voltage, the first clock signal terminal CB provides a high voltage, the second clock signal terminal CB2 provides a low voltage, the input terminal EI provides a low voltage, the first control transistor T12 and the second control transistor T1 are both turned on, the potential of the first input node P11 is bucked, the first isolation transistor T13 is turned on, the potential of the first isolation node P31 is bucked, the fourth control transistor T2 is turned on, the second transistor T4 is turned on, the first transistor T5 is turned on, and the potential of the first node P1 is bucked. The first output transistor T10 is turned on, the third control transistor T3 is turned on, the potential of the second isolation node P32 is a low voltage, the second isolation transistor T14 is turned on, the fifth control transistor T6 is turned on, the potential of the third input node P13 and the potential of the second input node P12 are boosted, the sixth control transistor T7 is turned off, and the first node control transistor T11 is turned off. The seventh control transistor T8 is turned on, the potential of the second node P2 is a high voltage, the second output transistor T9 is turned off, and the output terminal EOUT outputs a low voltage.

In the fourth phase PS4, as shown in FIG. 2C, the third clock signal terminal CK provides a high voltage, the first clock signal terminal CB provides a low voltage, the second clock signal terminal CB2 provides a high voltage, the input terminal EI provides a low voltage, the first control transistor T12 and the second control transistor T1 are both turned off, the second transistor T4 is turned on, the first clock signal terminal CB bucks the potential of the first input node P11 through the first capacitor C1, the first isolation transistor T13 is turned off, the potential of the first isolation node P31 is maintained as a low voltage, the first transistor T5 is turned on, so that the potential of the first node P1 is bucked and maintained to be lower than VSS+Vth, where Vth is a threshold voltage of the first output transistor T10, so that the first output transistor T10 is turned on, and further the potential of the driving signal output by the output terminal EOUT is maintained as VSS, without being affected by noise interference. The third control transistor T3 is turned off, the fourth control transistor T2 is turned on, the potential of the second isolation node P32 is a high voltage, the second isolation transistor T14 is turned on, the potential of the third input node P13 is a high voltage, the fifth control transistor T6 is turned off, the potential of the second input node P12 is a high voltage, the sixth control transistor T7 is turned on, the seventh control transistor T8 is turned on, the potential of the second node P2 is a high voltage, and the second output transistor T9 is turned off.

In the fifth phase PS5, as shown in FIG. 2C, the third clock signal terminal CK provides a low voltage, the first clock signal terminal CB provides a high voltage, the second clock signal terminal CB2 provides a low voltage, the input terminal EI provides a low voltage, the first control transistor T12 and the second control transistor T1 are both turned on, the potential of the first input node P11 is a low voltage, the first isolation transistor T13 is turned on, the second transistor T4 is turned on, the potential of the first clock signal provided by the first clock signal terminal CB is boosted, so that the potential of the first input node P11 is boosted through the first capacitor C1, and the first transistor T5 is turned off without affecting the potential of the first node P1. Under the action of the second capacitor C2, the potential of the first node P1 is maintained to be lower than VSS+Vth, where Vth is the threshold voltage of the first output transistor T10, so that the first output transistor T10 is turned on, and further the potential of the driving signal output by the output terminal EOUT is maintained at VSS, without being affected by noise interference. The third control transistor T3 is turned on, the fourth control transistor T2 is turned on, the potential of the second isolation node P32 is a low voltage, the second isolation transistor T14 is turned on, the potential of the third input node P13 is a low voltage, the fifth control transistor T6 is turned on, the potential of the second input node P12 is a high voltage, the first node control transistor T11 is turned off, the sixth control transistor T7 is turned off, the seventh control transistor T8 is turned on, the potential of the second node P2 is a high voltage, and the second output transistor T9 is turned off.

In the sixth phase PS6, as shown in FIG. 2C, the third clock signal terminal CK provides a high voltage, the first clock signal terminal CB provides a low voltage, the second clock signal terminal CB2 provides a high voltage, the input terminal EI provides a low voltage, the first control transistor T12 and the second control transistor T1 are both turned off, the potential of the first input node P11 is maintained as a low voltage, the second transistor T4 is turned on, the first clock signal terminal CB bucks the potential of the first input node P11 through the first capacitor C1, the first transistor T5 is turned on, so that the potential of the first node P1 is maintained to be lower than VSS+Vth, where Vth is the threshold voltage of the first output transistor T10, so that the first output transistor T10 is turned on, and further the potential of the driving signal output by the output terminal EOUT is maintained as VSS, without being affected by noise interference. The first isolation transistor T13 is turned off, the potential of the first isolation node P31 is maintained as a low voltage, the third control transistor T3 is turned off, the fourth control transistor T2 is turned on, the potential of the second isolation node P32 is a high voltage, the second isolation transistor T14 is turned on, the potential of the third input node P13 is a high voltage, the fifth control transistor T6 is turned off, the potential of the second input node P12 is a high voltage, the first node control transistor T11 is turned off, the sixth control transistor T7 is turned on, the seventh control transistor T8 is turned on, the potential of the second node P2 is a high voltage, and the second output transistor T9 is turned off.

In the keeping phase, the potential of the first node P1 is maintained to be lower than VSS+Vth, where Vth is the threshold voltage of the first output transistor T10, so that the first output transistor T10 is turned on, and further the potential of the driving signal output by the output terminal EOUT is maintained as VSS, without being affected by noise interference.

For example, in the keeping phase of GOA driving signal output, the first input node P11 is at a low level VSS, the transistor T1 and the transistor T12 are used to initialize the first input node P11 to VSS, the first capacitor C1 and the second transistor T4 are used to further buck the potential of the first input node P11 at a falling edge of the first clock signal, and save the low level to the first node P1 through the first transistor T5 with the diode structure, and meanwhile store charges through the second capacitor C2 to maintain the potential. When the first clock signal rises, the first input node P11 is pushed high, and the first transistor T5 is turned off, without affecting the potential of the first node P1 When the third clock signal terminal CK and the second clock signal terminal CB2 are at a low level, excess charges are discharged to the first isolation node P31 through the transistor T1 and the transistor T12. The above process is circulated subsequently.

FIG. 2C shows the first voltage signal V01 and the second voltage signal V02. For example, the first voltage signal V01 and the second voltage signal V02 have same polarity, and the absolute value of the voltage value of the second voltage signal V02 is greater than the absolute value of the voltage value of the first voltage signal V01.

The embodiments of the present disclosure and some examples thereof are described in detail below in conjunction with the accompanying drawings.

Figure 3:
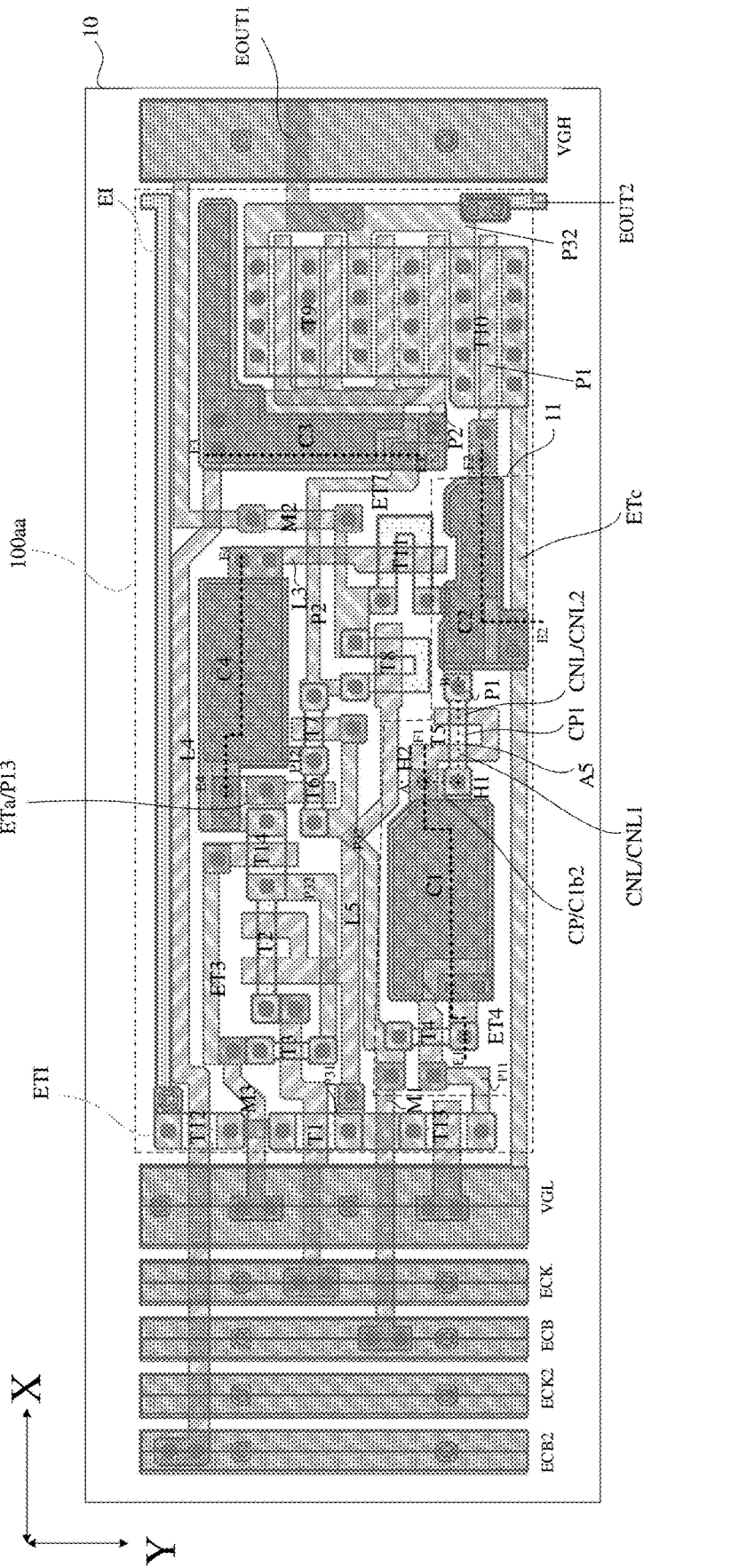
FIG. 3 is a schematic diagram of a layout of the shift register unit shown in FIG. 2B in a display substrate.

At least one embodiment of the present disclosure provides a display substrate. FIG. 3 is a schematic diagram of a layout of the shift register unit 100a shown in FIG. 2B in the display substrate.

For example, as shown in FIG. 3, the display substrate includes a base substrate 10, and a shift register unit 100aa, a first power line VGL, a second power line VGH, and a plurality of clock signal lines which are provided on the base substrate 10. For example, the plurality of clock signal lines include the first clock signal line ECB, the second clock signal line ECB2, the third clock signal line ECK, and the fourth clock signal line ECK2 shown in the diagram, and may also include a trigger signal line (not shown). For example, in the embodiments of the present disclosure, the shift register unit 100aa is a light-emitting control shift register unit.

For example, the first power line VGL, the second power line VGH, and the plurality of clock signal lines (e.g., the first clock signal line ECB, the second clock signal line ECB2, the third clock signal line ECK, the fourth clock signal line ECK2) all extend along a first direction Y on the base substrate 10, and are configured to respectively provide a first power voltage, a second power voltage, and a plurality of clock signals (e.g., the first clock signal, second clock signal, etc. as described above) to the shift register unit 100aa. For example, the first power line VGL is configured to provide a first power voltage to the shift register unit 100aa, and the second power line VGH is configured to provide a second power voltage to the shift register unit 100aa. The first clock signal line ECB and the second clock signal line ECB2 are configured to respectively provide the first clock signal or the second clock signal to the shift register unit 100aa. For example, the first power voltage is less than the second power voltage, for example, the first power voltage is a direct-current low level, and the second power voltage is a direct-current high level. For the specific connection relationship of the first power line VGL, the second power line VGH, and the plurality of clock signal lines with the shift register unit 100aa, reference may be made to the following description.

It should be noted that, the embodiments of the present disclosure are described by taking the case where the first clock signal line ECB provides the first clock signal to the shift register unit 100aa, and the second clock signal line ECB2 provides the second clock signal to the shift register unit 100aa as an example, and the embodiments of the present disclosure include but are not limited thereto. In some other embodiments of the present disclosure, the first clock signal line ECB may also provide the second clock signal to the shift register unit 100aa, and the second clock signal line ECB2 may provide the first clock signal to the shift register unit 100aa, which is not limited by the embodiments of the present disclosure.

It should be noted that, the embodiments of the present disclosure are described by taking the case where the third clock signal line ECK provides the third clock signal to the shift register unit 100aa, and the fourth clock signal line ECK2 provides the fourth clock signal to the shift register unit 100aa, and the embodiments of the present disclosure include but are not limited thereto. In some other embodiments of the present disclosure, the third clock signal line ECK may also provide the fourth clock signal to the shift register unit 100aa, and the fourth clock signal line ECK2 provides the third clock signal to the shift register unit 100aa, which is not limited in the embodiments of the present disclosure.

It should be noted that, the first power line VGL, the second power line VGH, and the plurality of clock signal lines may extend along the first direction Y and be arranged parallel to each other, or may also cross by a certain angle (e.g., less than or equal to 20°), which is not limited in the embodiments of the present disclosure.

For example, the base substrate 10 is made of, for example, glass, plastic, quartz, or other suitable materials, which is not limited in the embodiment of the present disclosure.

For example, referring to FIG. 1A, the display substrate 1 includes a display region 102 (e.g., the display region 102 may also be referred to as a pixel array region) and a peripheral region 106 located on at least one side of the pixel array region. The shift register unit 100aa provided by the embodiment of the present disclosure may be the light-emitting control shift register unit 105 shown in FIG. 1A. For example, the first power line VGL, the second power line VGH, the plurality of clock signal lines and the shift register unit 100aa as described above are located in the peripheral region 106 of the base substrate 10 and located on one side of the base substrate 10 (as shown in FIG. 1A, located between the display region 102 and a side edge of the base substrate 10), for example, as shown in FIG. 1A, located on the left side of the base substrate 10, of course, may also be located on the right side or both left and right sides of the base substrate 10, which is not limited in the embodiments of the present disclosure.

For example, as shown in FIG. 3, an orthogonal projection of the first power line VGL on the base substrate 10 and an orthogonal projection of the plurality of clock signal lines on the base substrate 10 are located on a side of an orthogonal projection of the shift register unit 100aa on the base substrate 10 that is away from the display region 102, for example, in the second direction X, both are located on the left side of the shift register unit 100aa shown in FIG. 3. The second power line VGH is located on a side of the orthogonal projection of the shift register unit 100aa on the base substrate 10 that is close to the display region 102, for example, in the second direction X, located on the right side of the shift register unit 100aa shown in FIG. 3.

For example, as shown in FIG. 3, the orthogonal projection of the first power line VGL on the base substrate 10 is located between the orthogonal projection of the clock signal lines (including the first clock signal line ECB, the second clock signal line ECB2, the third clock signal line ECK, and the fourth clock signal line ECK2) on the base substrate 10 and the orthogonal projection of the shift register unit 100aa on the base substrate 10. For example, the second clock signal line ECB2, the fourth clock signal line ECK2, the first clock signal line ECB, and the third clock signal line ECK are sequentially arranged on the base substrate 10 from left to right along the second direction X.

It should be noted that, the plurality of clock signal lines described above may further include a trigger signal line for providing a trigger signal. For example, an orthogonal projection of the trigger signal line on the base substrate 10 is located on a side of the orthogonal projection of the second clock signal line ECB2 on the base substrate 10 that is away from the orthogonal projection of the shift register unit 100*aa* on the base substrate 10. That is, the trigger signal line, the second clock signal line ECB2, the fourth clock signal line ECK2, the first clock signal line ECB, and the third clock signal line ECK are sequentially arranged on the base substrate 10 from left to right along the second direction X.

It should be noted that, the above-described line positions are only exemplary, as long as the line arrangement can be satisfied to facilitate connection with the shift register unit, which is not limited in the embodiment of the present disclosure.

For example, an included angle between the first direction Y and the second direction X is between 70° and 90°, and includes 70° and 90°. For example, the included angle between the first direction Y and the second direction X is 70°, 75°, 85°, 90°, or 80°, etc., and the specific value of the included angle is set according to actual conditions, which is not limited in the embodiment of the present disclosure.

For example, referring to FIG. 1A, the display region 102 includes a plurality of pixel units 103 arranged in an array. For example, each of the plurality of pixel units 103 includes a pixel circuit, for example, further includes a light-emitting element (not shown). For example, the light-emitting element includes an organic light-emitting diode, but is not limited thereto.

For example, a plurality of shift register units 100*aa* (i.e., light-emitting control shift register units 100*aa*) that are cascaded constitute a light-emitting control driving circuit array (EM GOA). For example, the output terminals EOUT of the plurality of shift register units 100*aa* are respectively connected with light-emitting control signal terminals of respective rows of pixel circuits located in the pixel array region to provide output signals (e.g., light-emitting control signals) to the respective rows of pixel circuits, so as to implement driving the light-emitting element to emit light. For example, the pixel circuit is a pixel circuit including a circuit structure such as 7T1C, 2T1C, 4T2C, 8T2C, etc. in the art, and details are not repeated here.

It should be noted that, FIG. 3 only shows a Kth-stage (K is an even number greater than or equal to 2) shift register unit 100*aa* in the gate driving circuit. For example, a first clock signal terminal CB (as shown in FIG. 2B) of the first-stage shift register unit (not shown) is connected with the third clock signal line ECK to receive the first clock signal, a second clock signal terminal CB2 of the first-stage shift register unit is connected with the fourth clock signal line ECK2 to receive the second clock signal, a third clock signal terminal CK (as shown in FIG. 2B) of the first-stage shift register unit is connected with the first clock signal line ECB to receive the third clock signal, a fourth clock signal terminal CK2 of the first-stage shift register unit is connected with the fourth clock signal line ECB2 to receive the fourth clock signal, an input terminal of the first-stage shift register unit is connected with the trigger signal line (not shown) to receive the trigger signal, a first clock signal terminal CB of the second-stage shift register unit (not shown) is connected with the first clock signal line ECB to receive the first clock signal, a second clock signal terminal CB2 of the second-stage shift register unit is connected with the second clock signal line ECB2 to receive the second clock signal, a third clock signal terminal CK of the second-stage shift register unit (not shown) is connected with the third clock signal line ECK to receive the third clock signal, and a fourth clock signal terminal CK2 of the second-stage shift register unit is connected with the fourth clock signal line ECK2 to receive the fourth clock signal. And so on, as shown in FIG. 2 and FIG. 3, a first clock signal terminal CB of the Kth-stage (K is an even number greater than or equal to 2) shift register unit 100*aa* is connected with the first clock signal line ECB to receive the first clock signal, a second clock signal terminal CB2 of the Kth-stage shift register unit is connected with the second clock signal line ECB2 to receive the second clock signal, a third clock signal terminal CK of the Kth-stage shift register unit (not shown) is connected with the third clock signal line ECK to receive the third clock signal, a fourth clock signal terminal CK2 of the Kth-stage shift register unit is connected with the fourth clock signal line ECK2 to receive the fourth clock signal, a first clock signal terminal CB of a (K+1)th-stage shift register unit is connected with the third clock signal line ECK to receive the first clock signal, a second clock signal terminal CB2 of the (K+1)th-stage shift register unit is connected with the fourth clock signal line ECK2 to receive the second clock signal, a third clock signal terminal CK (as shown in FIG. 2B) of the (K+1)th-stage shift register unit is connected with the first clock signal line ECB to receive the third clock signal, and a fourth clock signal terminal CK2 of the (K+1)th-stage shift register unit is connected with the second clock signal line ECB2 to receive the fourth clock signal. It should be noted that, the connection modes of the respective stages of shift register units and the clock signal lines may also be other connection modes in the art, which is not limited in the embodiments of the present disclosure. For example, the input terminal EI of the first-stage shift register unit is connected with the trigger signal line to receive the trigger signal as an input signal, the input terminal of the second-stage shift register unit is connected with an output terminal EOUT of a previous-stage shift register unit (i.e., the first-stage shift register unit), and the connection modes of input terminals of other respective stages of shift register units are similar thereto. The structure of the Kth-stage (K is an even number greater than or equal to 2) shift register unit 100*aa* is described below as an example, which is not limited in the embodiments of the present disclosure.

It should be noted that, the embodiment of the present disclosure only schematically shows four clock signal lines (the first clock signal line ECB, the second clock signal line ECB2, the third clock signal line ECK, and the fourth clock signal line ECK2), the display substrate provided by the embodiment of the present disclosure may further include 6 or 8 or more clock signal lines, which is not limited by the embodiments of the present disclosure. Correspondingly, when the number of clock signal lines changes, the connection relationship between the shift register units 100*aa* and the clock signal lines in the display substrate also changes accordingly. For specific content, reference may be made to conventional designs in the art based on the embodiments of the present disclosure, and details are not described herein again.

Figure 4:
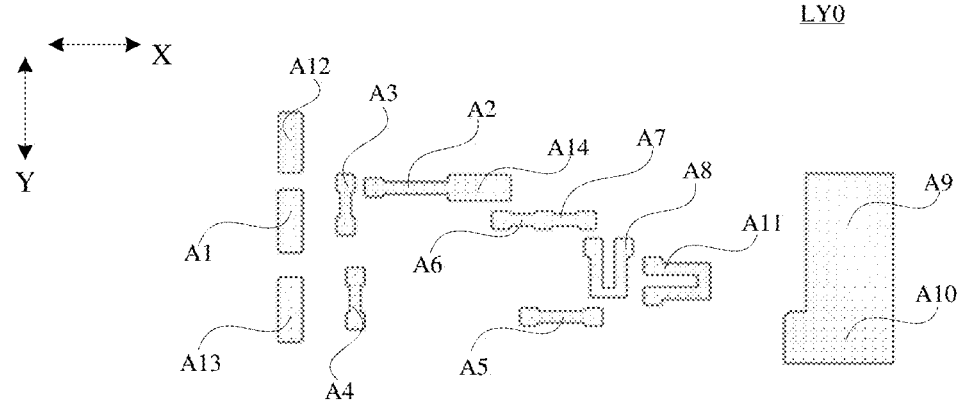
Figure 5:
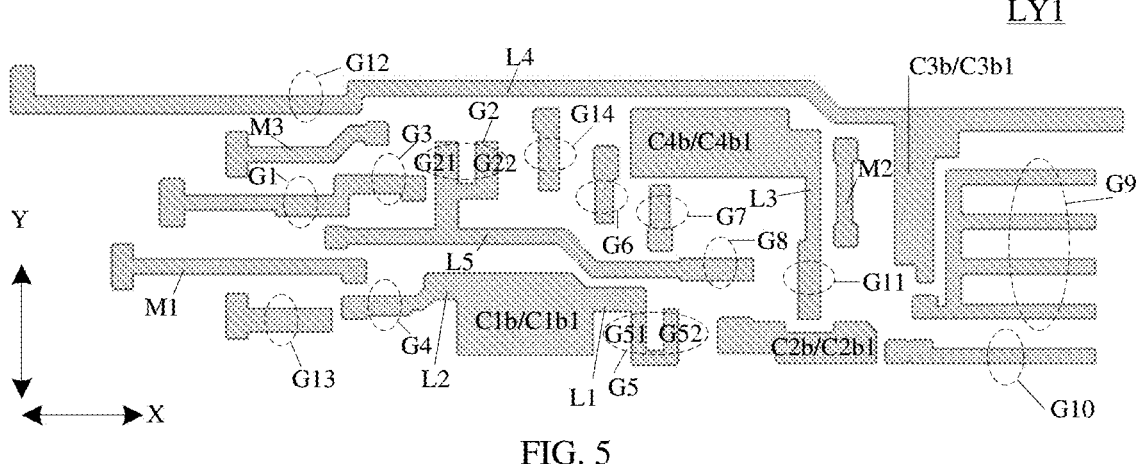
Figure 6:
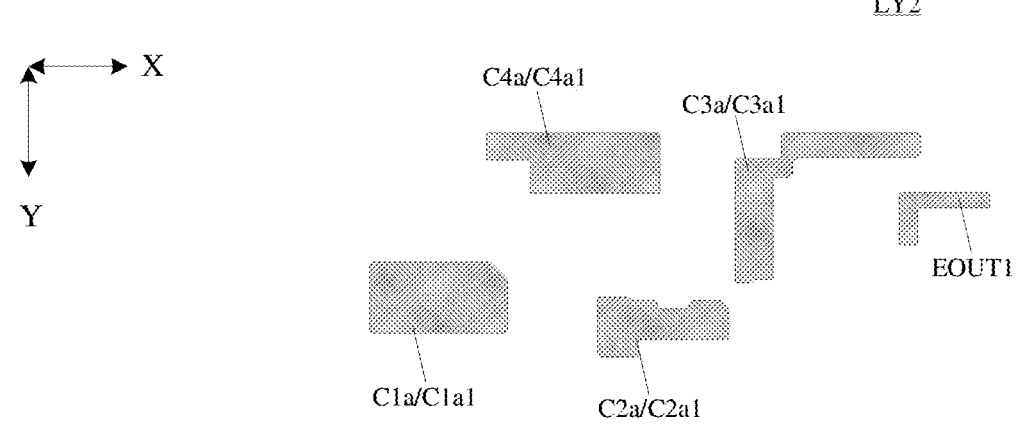
Figure 10:
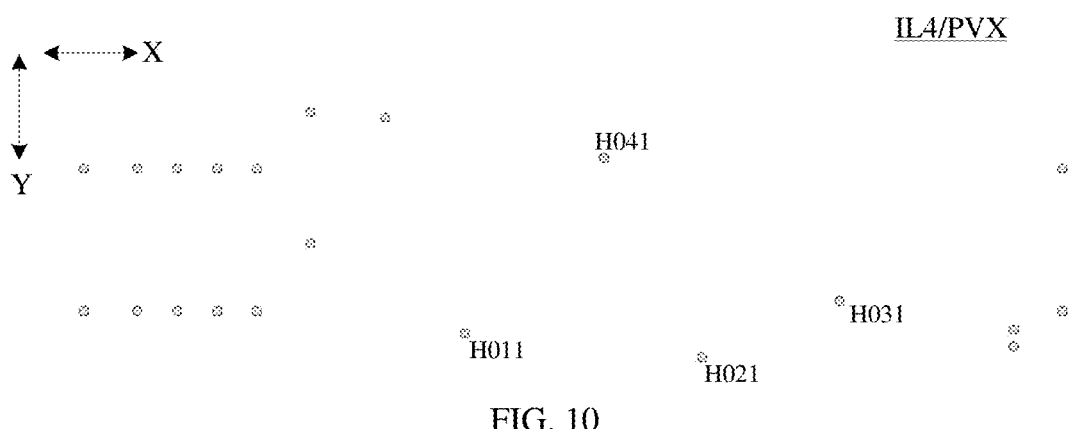
Figure 11:
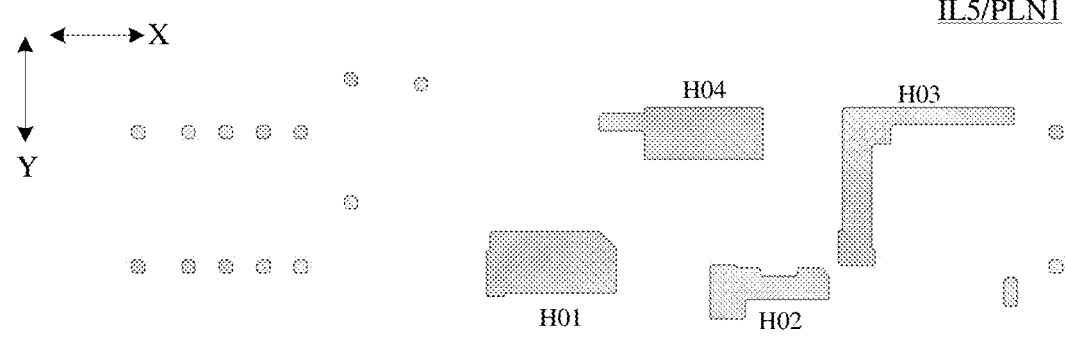
Figure 12:
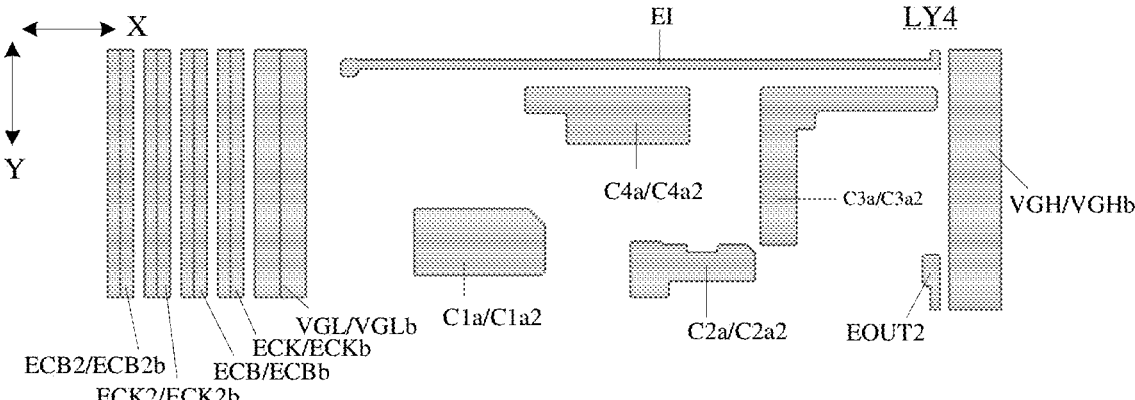
Figure 13:
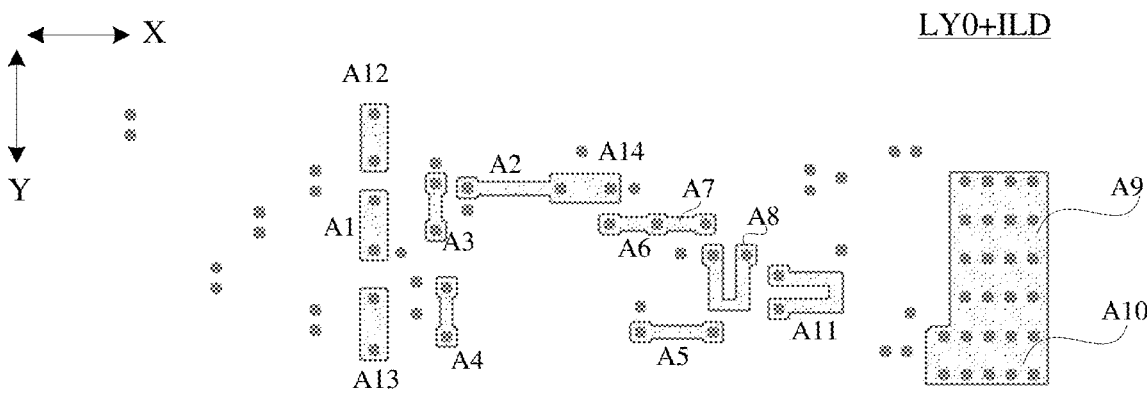
FIG. 13 to FIG. 19 are plan views of a plurality of film layers in the display substrate shown in FIG. 3.
Figure 14:
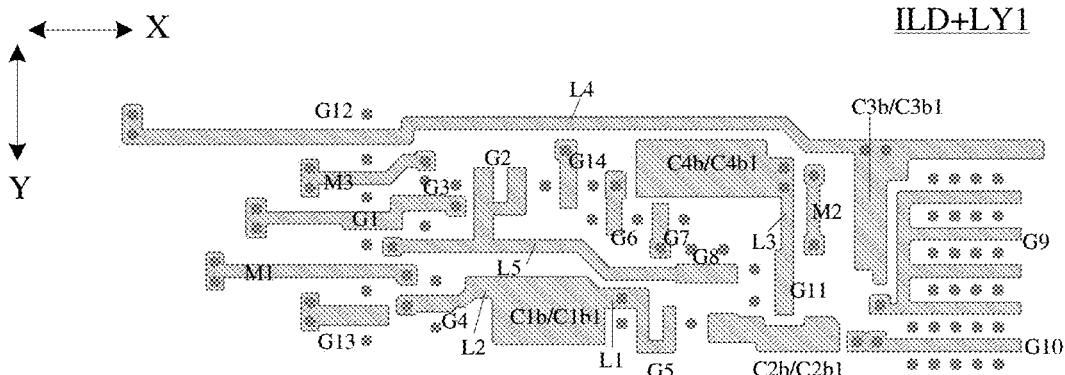
Figure 15:
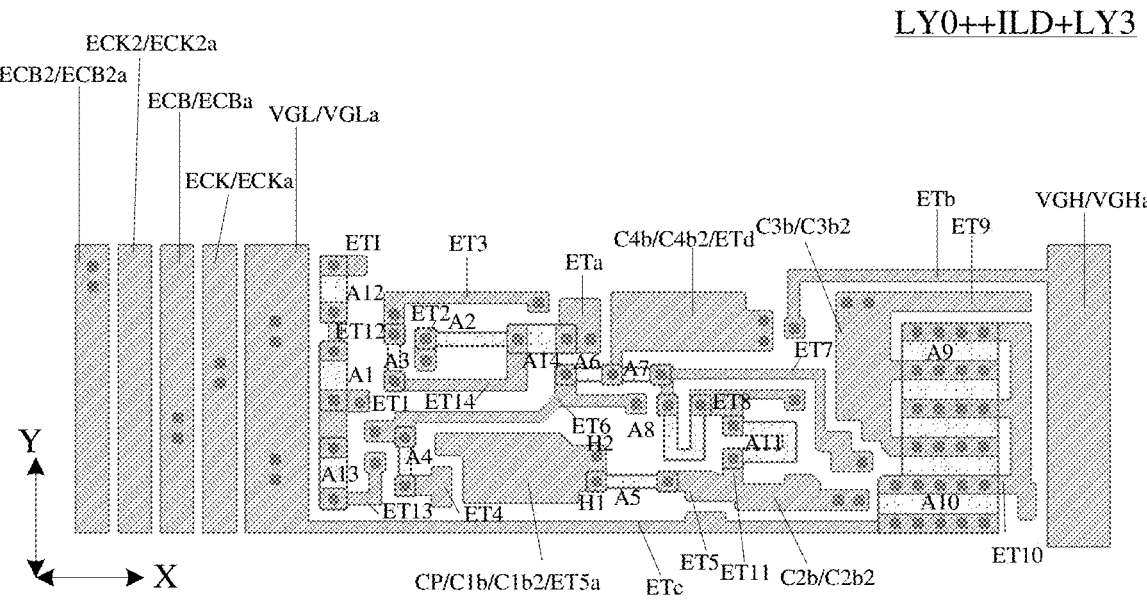
Figure 16:
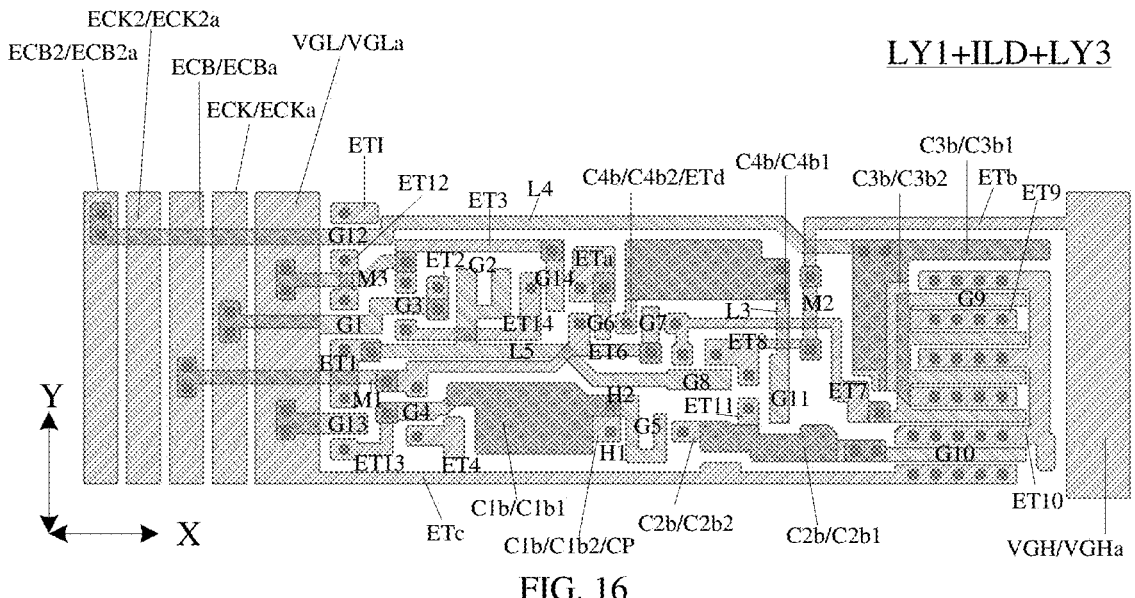
Figure 17:
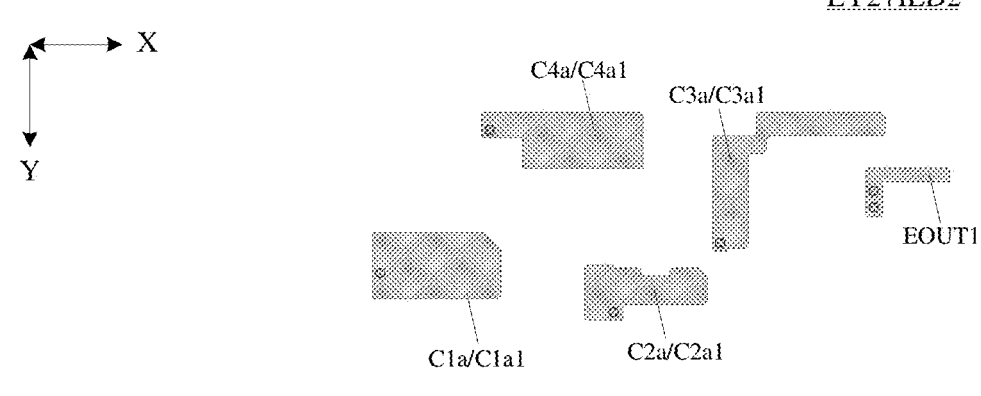
Figure 18:
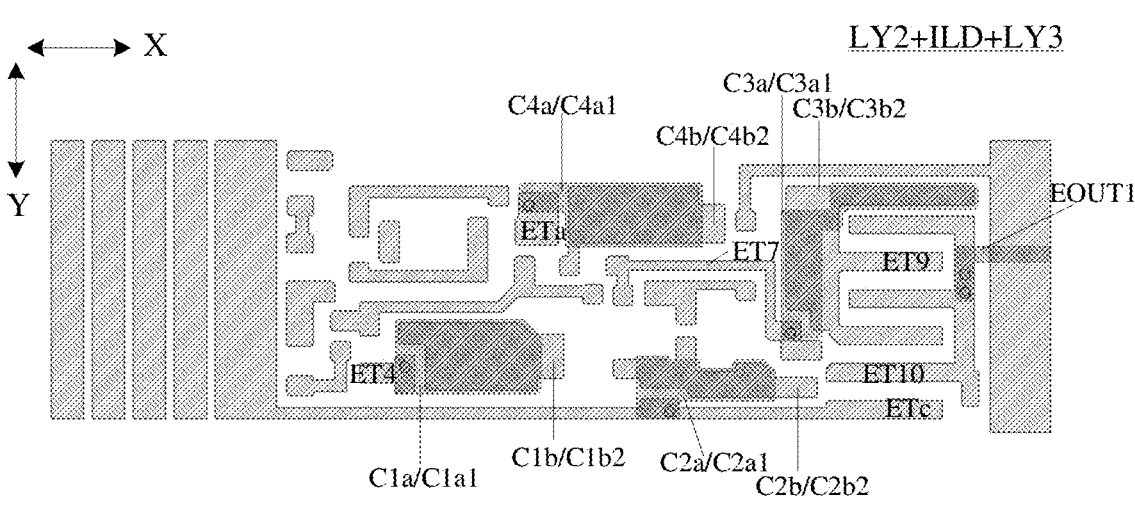
Figure 19:
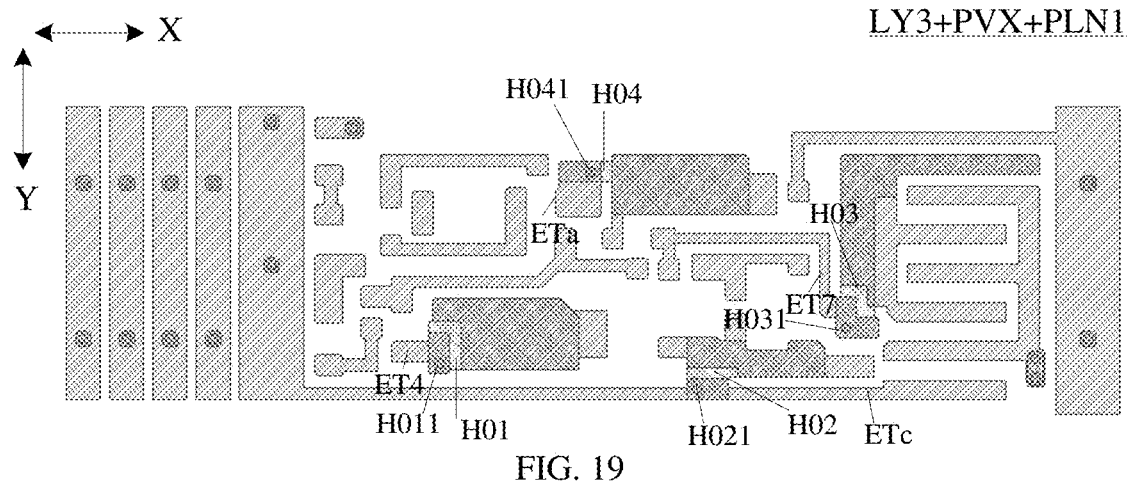
Figure 20A:
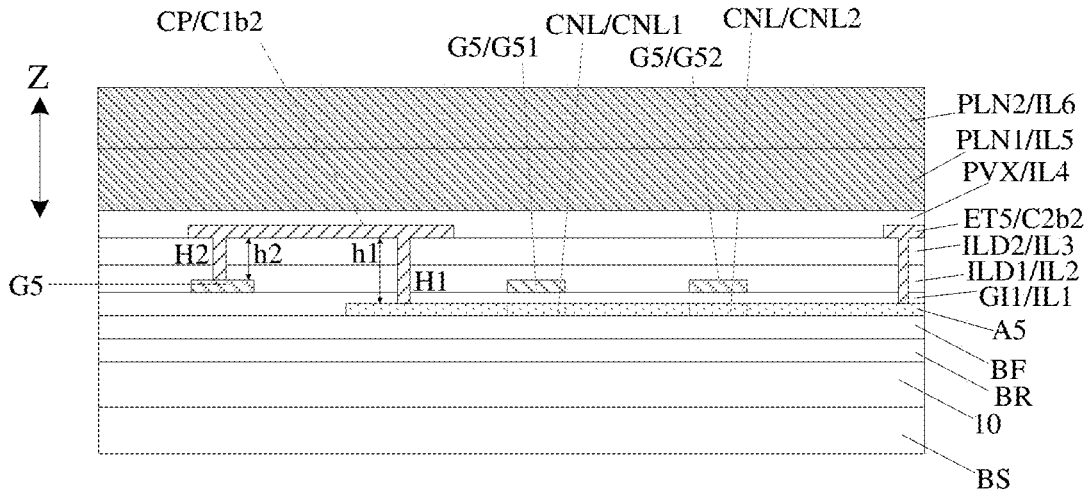
FIG. 20A is a cross-sectional view taken along line A-B in FIG. 3.
Figure 20B:
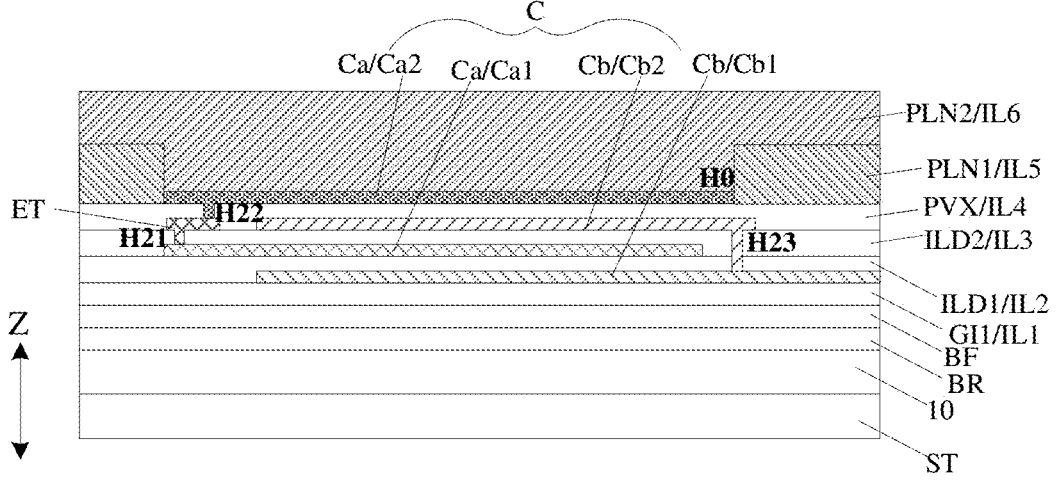
FIG. 20B is a cross-sectional view taken along line E1-F1, E2-F2, E3-F3 or E4-F4 in FIG. 3.
Figure 21:
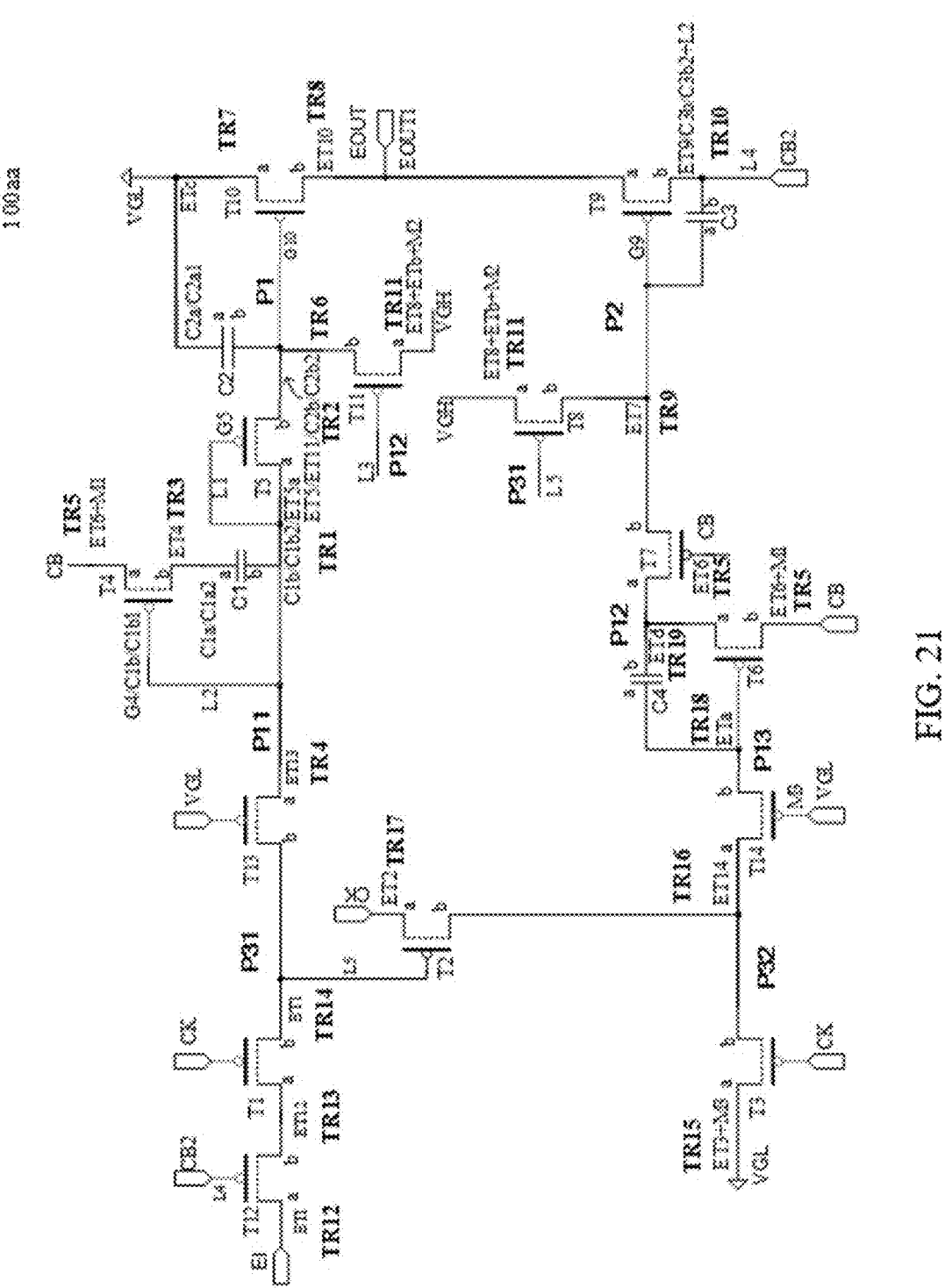
FIG. 21 is a schematic diagram of the arrangement positions of connection lines, connection electrodes, and conductive lines in the display substrate shown in FIG. 3.

FIG. 4 to FIG. 12 are plan views of wiring or via holes of respective layers of the display substrate shown in FIG. 3. FIG. 13 to FIG. 19 are plan views of a plurality of film layers in the display substrate shown in FIG. 3. FIG. 20A is a cross-sectional view taken along line A-B in FIG. 3. FIG. 20B is a cross-sectional view taken along line E1-F1, E2-F2, E3-F3 or E4-F4 in FIG. 3. FIG. 21 is a schematic diagram of the arrangement positions of respective connection lines, connection electrodes, and conductive lines in the display substrate shown in FIG. 3. Specifically, FIG. 4 is a plan view of an active layer of a display substrate provided by at least one embodiment of the present disclosure, FIG. 5 is a plan view of a first conductive layer of a display substrate provided by at least one embodiment of the present disclosure, FIG. 6 is a plan view of a second conductive layer of a display substrate provided by at least one embodiment of the present disclosure, FIG. 7 is a distribution diagram of via holes penetrating a third insulating layer (a second interlayer insulating layer) of a display substrate provided by at least one embodiment of the present disclosure, FIG. 8 is a distribution diagram of via holes penetrating a first insulating layer of a display substrate provided by at least one embodiment of the present disclosure, FIG. 9 is a plan view of a third conductive layer of a display substrate provided by at least one embodiment of the present disclosure, FIG. 10 is a distribution diagram of via holes penetrating a fourth insulating layer (a passivation layer) of a display substrate provided by at least one embodiment of the present disclosure, FIG. 11 is a distribution diagram of via holes penetrating a fifth insulating layer (a first planarization layer) of a display substrate provided by at least one embodiment of the present disclosure, and FIG. 12 is a plan view of a fourth conductive layer of a display substrate provided by at least one embodiment of the present disclosure. FIG. 13 is a schematic diagram of a laminate of a semiconductor layer LY0 and a via hole penetrating an interlayer insulating layer ILD (a first insulating layer IL1, a second insulating layer IL2, and a third insulating layer IL3) of a display substrate provided by at least one embodiment of the present disclosure. FIG. 14 is a schematic diagram of a laminate of a via hole penetrating an interlayer insulating layer ILD and a first conductive layer LY1 of a display substrate provided by at least one embodiment of the present disclosure. FIG. 15 is a schematic diagram of a laminate of a semiconductor layer LY0, the via hole penetrating the interlayer insulating layer ILD, and a third conductive layer LY3 of a display substrate provided by at least one embodiment of the present disclosure. FIG. 16 is a schematic diagram of a laminate of a first conductive layer LY1, the via hole penetrating the interlayer insulating layer ILD, and a third conductive layer LY3 of a display substrate provided by at least one embodiment of the present disclosure. FIG. 17 is a schematic diagram of a laminate of a second conductive layer LY2 and a via hole penetrating a second interlayer insulating layer ILD2 of a display substrate provided by at least one embodiment of the present disclosure. FIG. 18 is a schematic diagram of a laminate of the second conductive layer LY2, the via hole penetrating the second interlayer insulating layer ILD2, and the third conductive layer LY3 of a display substrate provided by at least one embodiment of the present disclosure. FIG. 19 is a schematic diagram of a laminate of the third conductive layer LY3, a via hole in a fourth insulating layer, and a via hole in a fifth insulating layer of a display substrate provided by at least one embodiment of the present disclosure. Hereinafter, a single-layer structure and a stacked structure of the display substrate provided by at least one embodiment of the present disclosure are described in detail in conjunction with FIG. 3 to FIG. 21.

For example, referring to FIG. 20A and FIG. 20B, the insulating layer of the display substrate includes a first insulating layer IL1, a second insulating layer IL2, a third insulating layer IL3, a fourth insulating layer IL4, a fifth insulating layer IL5, etc. For example, the first insulating layer IL1 (as shown in FIG. 20A) is located between the semiconductor layer LY0 shown in FIG. 4 and the first conductive layer LY1 shown in FIG. 5, the second insulating layer IL2 (as shown in FIG. 20A) is located between the first conductive layer LY1 shown in FIG. 5 and the second conductive layer LY2 shown in FIG. 6 (referring to FIG. 20B), and the third insulating layer IL3 (as shown in FIG. 20A) is located between the second conductive layer LY2 shown in FIG. 6 and the third conductive layer LY3 shown in FIG. 9. The fourth insulating layer IL4 (as shown in FIG. 20B) is located between the third conductive layer LY3 shown in FIG. 9 and the fourth conductive layer LY4 shown in FIG. 12. FIG. 20B shows a fifth insulating layer IL5. The via holes shown in FIG. 7 are via holes penetrating the third insulating layer IL3. The via holes shown in FIG. 8 are via holes penetrating one or more layers of the first insulating layer IL1, the second insulating layer IL2, and the third insulating layer IL3. FIG. 20B shows a sixth insulating layer IL6. The sixth insulating layer IL6 is located on the fourth conductive layer LY4, and is used to protect the fourth conductive layer LY4.

For example, the first insulating layer IL1 includes a first gate insulating layer GI1, the second insulating layer IL2 includes a first interlayer insulating layer ILD1, the third insulating layer IL3 includes a second interlayer insulating layer ILD2, the fourth insulating layer IL4 includes a passivation layer PVX, the fifth insulating layer IL5 includes a first planarization layer PLN1, and the sixth insulating layer IL6 includes a second planarization layer PLN2.

For example, the first insulating layer IL1, the second insulating layer IL2, the third insulating layer IL3, the fourth insulating layer IL4, the fifth insulating layer IL5, and the sixth insulating layer IL6 are all made of insulating materials. For example, the materials of the first insulating layer IL1, the second insulating layer IL2, the third insulating layer IL3, and the fourth insulating layer IL4 include inorganic insulating materials such as SiNx, SiOx, SiNxOy, etc., or other suitable materials For example, the materials of the fifth insulating layer IL5 and the sixth insulating layer IL6 include organic insulating materials such as organic resins, or other suitable materials, which is not limited in the embodiments of the present disclosure. For example, the thicknesses of the fifth insulating layer IL5 and the sixth insulating layer IL6 are larger, and a thickness of each of the fifth insulating layer IL5 and the sixth insulating layer IL6 is greater than a thickness of each of the first insulating layer IL1, the second insulating layer IL2, the third insulating layer IL3 and the fourth insulating layer IL4.

It should be noted that, the display substrate shown in FIG. 3 is described by taking the layout design of the Kth-stage shift register unit in the light-emitting control driving circuit array and the first power line, the second power line, and the clock signal lines connected therewith as an example, for the layout implementation of the other respective stages of shift register units, reference may be made to the layout mode shown in FIG. 3, which is not repeated here. Of course, other suitable layout modes may also be adopted, which are not limited in the embodiments of the present disclosure. Of course, for the respective stages of shift register units of the other respective light-emitting control driving circuit arrays, the layout mode shown in FIG. 3 may also be referred to, or other suitable layout modes may also be adopted, which are not limited in the embodiments of the present disclosure.

The display substrate provided by at least one embodiment of the present disclosure is described in detail below in conjunction with FIG. 3 to FIG. 21. When describing the layout of the display substrate, abbreviation of the respective transistors may be used to simplify description.

For example, the active layers A1-A14 of the transistors T1 to T14 of the shift register unit 100*aa* shown in FIG. 3 may refer to the pattern of the semiconductor layer LY0 shown in FIG. 4. The semiconductor layer LY0 may be formed by patterning a semiconductor material. For example, as shown in FIG. 4, according to different actual needs, the semiconductor layer LY0 may include a short rod-shaped portion or a portion having a curved or bent shape to form the active layers A1 to A14 of the above-described transistors T1 to T14. An active layer of each transistor may include a source electrode region, a drain electrode region, and a channel region located between the source electrode region and the drain electrode region. For example, the channel region has semiconductor characteristics, the source electrode region and the drain electrode region are on both sides of the channel region, are doped with impurities, and thus have conductivity. For example, the source electrode region is a portion of the active layer, and a metal electrode (e.g., located in the third conductive layer LY3) in contact with the source electrode region corresponds to the source electrode (or referred to as the first electrode) of the transistor. The drain electrode region is a portion of the active layer, and a metal electrode (e.g., located in the third conductive layer LY3) in contact with the drain electrode region corresponds to the drain electrode (or referred to as the second electrode) of the transistor. For example, the source electrode region is connected with the metal electrode (the source electrode) corresponding thereto through via holes penetrating the first insulating layer IL1, the second insulating layer IL2, and the third insulating layer IL3, and the drain electrode region is connected with the metal electrode (the drain electrode) corresponding thereto through via holes penetrating the first insulating layer IL1, the second insulating layer IL2 and the third insulating layer IL3. For example, in the embodiments of the present disclosure, an connection electrode located in the third conductive layer is a metal electrode. At least a portion of the connection electrode serves as the source electrode or the drain electrode of the transistor.

For example, the material of the semiconductor layer LY0 includes an oxide semiconductor, an organic semiconductor or an amorphous silicon, polysilicon, etc., for example, the oxide semiconductor includes a metal oxide semiconductor (e.g., Indium Gallium Zinc Oxide (IGZO)), and polysilicon includes low-temperature polysilicon or high-temperature polysilicon, etc., which is not limited in the embodiments of the present disclosure. It should be noted that, the source electrode region and drain electrode region described above may be regions doped with n-type impurities or p-type impurities, which is not limited in the embodiments of the present disclosure.

It should be noted that, in other examples, the first electrodes and second electrodes of respective transistors may also be located in other conductive layers, and are connected with active layers corresponding thereto through via holes in the insulating layer between the same and the semiconductor layer, which is not limited in the embodiments of the present disclosure.

FIG. 5 shows the first conductive layer LY1 of the display substrate, and the first conductive layer LY1 is provided on the first insulating layer IL1 so as to be insulated from the semiconductor layer LY0. For example, the first conductive layer LY1 includes second electrode plates C1*b*, C2*b*, C3*b*, C4*b* of the first capacitor C1 to the fourth capacitor C4, gate electrodes G1 to G14 of transistors T1 to T14, respective connection lines (e.g., connection lines L1 to L5), and conductive lines (e.g., conductive line M1, conductive line M2, and conductive line M3) for connection with signal lines or connection electrodes, etc., in the third conductive layer LY3. The conductive line M1, conductive line M2, and conductive line M3 are all independent patterns. As shown in FIG. 5, the gate electrodes G1 to G14 of transistors T1 to T14 are portions enclosed by a circular or oval dashed line, that is, portions where the semiconductor layer structures of the respective transistors overlap with the electrodes or lines in the first conductive layer LY1.

As shown in FIG. 5, the second electrode plates C1*b*, C2*b*, C3*b*, C4*b* of the first capacitor C1 to the fourth capacitor C4 respectively include first portions C1*b*1, C2*b*1, C3*b*1, C4*b*1 of the second plate electrode plates C1*b*, C2*b*, C3*b*, C4*b* of the first capacitor C1 to the fourth capacitor C4.

For example, as shown in FIG. 5, the gate electrode G5 of the transistor T5, the connection line L1, the first portion C1*b*1 of the second electrode plate C1*b* of the first capacitor C1, the connection line L2, and the gate electrode G4 of the transistor T4 are connected and formed integrally. For example, as shown in FIG. 5, the first portion C4*b*1 of the second electrode plate C4*b* of the fourth capacitor C4, the connection line L3, and the gate electrode G11 of the transistor T11 are connected and formed integrally. For example, as shown in FIG. 5, the connection line L4, the gate electrode G12 of the transistor T12, and the first portion C3*b*1 of the second electrode plate C3*b* of the third capacitor C3 are connected and formed integrally. For example, as shown in FIG. 5, the connection line L5, the gate electrode G2 of the transistor T2, and the gate electrode G8 of the transistor T8 are formed integrally.

FIG. 6 shows the second conductive layer LY2 of the display substrate, and the second conductive layer LY2 includes the first electrode plates C1*a*, C2*a*, C3*a*, C4*a* of the first capacitor C1 to the fourth capacitor C4 and an output terminal EOUT1. The first electrode plates C1*a*, C2*a*, C3*a*, C4*a* of the first capacitor C1 to the fourth capacitor C4 include a first portion C1*a*1 of the first electrode plate C1*a*, a first portion C2*a*1 of the first electrode plate C2*a*, a first portion C3*a*1 of the first electrode plate C3*a*, and a first portion C4*a*1 of the first electrode plate C4*a*.

It should be noted that, in the embodiments of the present disclosure, the output terminal EOUT1 located in the second conductive layer LY2 is used to provide output signals to the pixel units in the display region; while in some other embodiments of the present disclosure, the output signal of the output terminal EOUT1 of the shift register unit 100*aa* is also provided by electrodes located in other layers, that is, the output terminal EOUT1 may also be provided in another layer different from the second conductive layer LY2, for example, may be provided in the first conductive layer LY1, which is not limited in the embodiments of the present disclosure.

FIG. 7 shows distribution of via holes in the third insulating layer IL3 of the display substrate. The via holes shown in FIG. 7 are via holes penetrating the third insulating layer IL3.

FIG. 8 shows distribution of via holes in the second insulating layer IL2 of the display substrate. The via holes shown in FIG. 8 are via holes penetrating the third insulating layer IL3, the second insulating layer IL2 and the first insulating layer IL1, and via holes penetrating the third insulating layer IL3 and the second insulating layer IL2.

FIG. 9 shows the third conductive layer LY3 of the display substrate, and the third conductive layer LY3 includes a plurality of signal lines (e.g., the first clock signal line ECB, the second clock signal line ECB2, the third clock signal line ECK, and the fourth clock signal line ECK2), the first power line VGL, the second power line VGH, etc. FIG. 9 shows a first portion ECBa of the first clock signal line ECB, a first portion ECB2a of the second clock signal line ECB2, a first portion ECKa of the third clock signal line ECK, a first portion ECK2a of the fourth clock signal line ECK2, a first portion VGLa of the first power line VGL, a first portion VGHa of the second power line VGH, a second portion C1b2 of the second electrode plate C1b of the first capacitor C1, a second portion C2b2 of the second electrode plate C2b of the second capacitor C2, a second portion C3b2 of the second electrode plate C3b of the third capacitor C3, and a second portion C4b2 of the second electrode plate C4b of the fourth capacitor C4. It should be noted that, the third conductive layer LY3 also includes connection electrodes ET1 to ET14, an connection electrode ET5a, an connection electrode ETI, an connection electrode ETa, an connection electrode ETb, an connection electrode ETc and an connection electrode ETd, etc. connecting between the respective transistors, capacitors, and signal lines. For example, referring to FIG. 3, FIG. 9, and FIG. 12, the connection electrode ETI is connected with the input terminal EI located in the fourth conductive layer LY4 through a via hole structure. The input terminal EI may also be referred to as an input line.

It should be noted that, in some other embodiments of the present disclosure, the input terminal EI of the shift register unit 100aa may also be located in another layer, for example, it may be located in the third conductive layer LY3 to be directly connected with the connection electrode ETI. For example, the connection electrode ETI may be integrally formed with the input terminal EI, for example, the connection electrode ETI includes the input terminal EI, which is not limited in the embodiments of the present disclosure.

FIG. 10 shows distribution of via holes in the fourth insulating layer IL4 (a passivation layer PVX) of the display substrate.

FIG. 11 shows distribution of via holes in the fifth insulating layer IL5 (a first planarization layer PLN1) of the display substrate. As shown in FIG. 10 and FIG. 11, the area of the via hole in the fifth insulating layer IL5 (the first planarization layer PLN1) is greater than the area of the via hole in the fourth insulating layer IL4 (the passivation layer PVX) in a corresponding position, to facilitate implementing connection between the elements in the third conductive layer LY3 and the elements in the fourth conductive layer LY4, and to reduce the distance between two opposite electrode plates of the capacitor, so as to increase capacitance. Referring to FIG. 20B, the area of the via hole H0 penetrating the fifth insulating layer IL5 is greater than the area of the via hole H22 penetrating the fourth insulating layer IL4, to facilitate reducing the distance between the first electrode plate Ca and the second electrode plate Cb, to increase capacitance. Furthermore, in the case where the capacitors are connected in parallel, the distance between the second portion Ca2 of the first electrode plate Ca and the second portion Cb2 of the second electrode plate Cb may be reduced to increase capacitance.

FIG. 12 shows the fourth conductive layer LY4 of the display substrate. The fourth conductive layer LY4 includes second portions C1a2, C2a2, C3a2, C4a2 of the first electrode plates of the first capacitor C1 to the fourth capacitor C4, a second portion ECBb of the first clock signal line ECB, a second portion ECB2b of the second clock signal line ECB2, a second portion ECKb of the third clock signal line ECK, a second portion ECK2b of the fourth clock signal line ECK2, a second portion VGLb of the first power line VGL, a second portion VGHb of the second power line VGH, the input terminal EI, and an output terminal EOUT2. For example, the output terminal EOUT2 is used for connection with the input terminal EI of a next-stage shift register unit to provide an input signal to the input terminal EI of the next-stage shift register unit. It should be noted that, the output terminal EOUT2 may also be located in another conductive layer. The input terminal EI is used to receive an output signal of an output terminal of a previous-stage shift register unit as an input signal of an input terminal of a present-stage shift register unit.

Referring to FIG. 3, FIG. 9, FIG. 12, FIG. 15 and FIG. 19, the connection electrode ET5 is connected and formed integrally with the second electrode of the transistor T5, and the second electrode of the transistor T5 is connected with the active layer A5 of the transistor T5 through a via hole. In other words, at least a portion of the connection electrode ET5 serves as the second electrode of the transistor T5. The connection electrode ET5 is connected with the active layer A5 of the transistor T5 through a via hole. The second portion C1b2 of the second electrode C1b of the first capacitor C1 is connected with the active layer A5 of the transistor T5 through a first via hole H1, and the second portion C1b2 of the second electrode C1b of the first capacitor C1 is connected with the gate electrode G5 of the transistor T5 through a second via hole H2. The second portion C1b2 of the second electrode C1b of the first capacitor C1 may also be referred to as a conductive portion CP. The first electrode of the first transistor is connected with the active layer of the first transistor T5 through the first via hole H1.

Referring to FIG. 3, FIG. 9, FIG. 12, FIG. 15 and FIG. 19, the second electrode of the transistor T11 is connected and formed integrally with the connection electrode ET11, and the second electrode of the transistor T11 is connected with the active layer A11 of the transistor T11 through a via hole. The connection electrode ET11 is connected with the active layer A11 of the transistor T11 through a via hole. In other words, at least a portion of the connection electrode ET11 serves as the second electrode of the transistor T11. The connection electrode ET11, the connection electrode ET5, and the second portion C1b2 of the second electrode C1b of the first capacitor C1 are connected and formed integrally.

Referring to FIG. 3, FIG. 9, FIG. 12, FIG. 15 and FIG. 19, the input terminal EI is connected with the connection electrode ETI through a via hole, and the connection electrode ETI is connected and formed integrally with the first electrode of the transistor T12. In other words, at least a portion of the connection electrode ETI serves as the first electrode of the transistor T12. The first electrode of the transistor T12 is connected with the active layer A12 through a via hole. The connection electrode ET12 is connected and formed integrally with the second electrode of the transistor T12, and is connected and formed integrally with the first electrode of the transistor T1. In other words, at least a portion of the connection electrode ET12 serves as the second electrode of the transistor T12, and at least a portion of the connection electrode ET12 serves as the first electrode of transistor T1. The first electrode of the transistor T1 is connected with the active layer A1 of the transistor T1 through a via hole, and the connection electrode ET1 is connected and formed integrally with the second electrode of the transistor T1 and is connected and formed integrally with the second electrode of the transistor T13. In other words, at least a portion of the connection electrode ET1 serves as the second electrode of the transistor T1, and at least a portion of the connection electrode ET1 serves as the second electrode of the transistor T13.

Referring to FIG. 3, FIG. 5, FIG. 14 and FIG. 16, the connection electrode ET1 is connected with the connection line L5 through a via hole.

Referring to FIG. 3, FIG. 5, FIG. 14 and FIG. 16, one end of the conductive line M1 is connected with the first portion ECBa of the first clock signal line ECB through a via hole, the other end of the conductive line M1 is connected with the connection electrode ET6 through a via hole, and the other end of the connection electrode ET6 is connected with the active layer A4 of the transistor T4 through a via hole. The connection electrode ET6 is connected and integrally formed with the first electrode of the transistor T6, and is connected and integrally formed with the first electrode of the transistor T4. In other words, at least a portion of the connection electrode ET6 serves as the first electrode of the transistor T6, and at least a portion of the connection electrode ET6 serves as the first electrode of the transistor T4. The connection electrode ET4 is connected with the active layer A4 of the transistor T4 through a via hole, and the connection electrode ET4 is connected and formed integrally with the second electrode of the transistor T4. In other words, at least a portion of the connection electrode ET4 serves as the second electrode of the transistor T4. The connection electrode ETd is connected with the active layer A6 of the transistor T6 and the active layer A7 of the transistor T7 through a via hole, the connection electrode ETd is connected and formed integrally with the second portion C4b2 of the second electrode plate C4b of the fourth capacitor C4, and the second portion C4b2 of the second electrode plate C4b of the fourth capacitor C4 is connected and formed integrally with the first electrode of the transistor T6, and is connected and formed integrally with the first electrode of the transistor T7. In other words, at least a portion of the second portion C4b2 of the second electrode plate C4b of the fourth capacitor C4 serves as the first electrode of the transistor T6, and at least a portion of the second portion C4b2 of the second electrode plate C4b of the fourth capacitor C4 serves as the first electrode of the transistor T7. Referring to FIG. 18, the second portion C1b2 of the second electrode plate C1b of the first electrode C1 is connected with the connection electrode ET4 through a via hole.

Referring to FIG. 3, FIG. 5, FIG. 9, FIG. 14, FIG. 15 and FIG. 16, the connection electrode ETb is connected and formed integrally with the second power line VGH. One end of the conductive line M2 is connected with the connection electrode ETb through a via hole, and the other end of the conductive line M2 is connected with the connection electrode ET8 through a via hole. The connection electrode ET8 is connected and integrally formed with the first electrode of the transistor T8, and is connected and integrally formed with the first electrode of the transistor T11. In other words, at least a portion of the connection electrode ET8 serves as the first electrode of the transistor T8, and at least a portion of the connection electrode ET8 serves as the first electrode of the transistor T11.

Referring to FIG. 3, FIG. 5, FIG. 9, FIG. 14, FIG. 15 and FIG. 16, one end of the conductive line M3 is connected with the first power line VGL, the other end of the conductive line M3 is connected with the connection electrode ET3, and is further connected with the gate electrode G14 of the transistor T14, so that the gate electrode G14 of the transistor T14 is coupled to the first power line VGL. The connection electrode ET3 is connected and formed integrally with the second electrode of the transistor T3. In other words, at least a portion of the connection electrode ET3 serves as the second electrode of the transistor T3.

Referring to FIG. 3, FIG. 5, FIG. 9, FIG. 14, FIG. 15 and FIG. 16, one end of the connection electrode ET7 is connected with the gate electrode G9 of the transistor T9 through a via hole. Referring to FIG. 13 and FIG. 15, the other end of the connection electrode ET7 is connected with the active layer A7 of the transistor T7, and a further end of the connection electrode ET7 is connected with the active layer A8 of the transistor T8 through a via hole. The connection electrode ET7 is connected and formed integrally with the second electrode of the transistor T7, and is connected and formed integrally with the second electrode of the transistor T8. In other words, at least a portion of the connection electrode ET7 serves as the second electrode of the transistor T7, and at least a portion of the connection electrode ET7 serves as the second electrode of the transistor T8.

Referring to FIG. 3, FIG. 5, FIG. 9, FIG. 14, FIG. 15 and FIG. 16, the connection electrode ET13 is connected with the gate electrode G4 of the transistor T4 through a via hole, and the connection electrode ET13 is connected and formed integrally with the first electrode of the transistor T13. In other words, at least a portion of the connection electrode ET13 serves as the first electrode of the transistor T13. For example, the first end of the connection electrode ET13 is connected with the gate electrode G4 of the transistor T4 through a via hole.

Referring to FIG. 3, FIG. 5, FIG. 9, FIG. 14, FIG. 15 and FIG. 16, the gate electrode G12 of the transistor T12 is connected with the first portion ECB2a of the second clock signal line ECB2 through a via hole, the gate electrode G1 of the transistor T1 is connected with the first portion ECKa of the third clock signal line ECK through a via hole, the conductive line M1 is connected with the first portion ECBa of the first clock signal line ECB through a via hole, and the gate electrode G13 of the transistor T13 is connected with the first portion VGLa of the first power line VGL through a via hole. The connection electrode ETc is connected and integrally formed with the first portion VGLa of the first power line VGL. The connection electrode ETc is connected and formed integrally with the first electrode of the transistor T10. In other words, at least a portion of the connection electrode ETc serves as the first electrode of the transistor T10. The connection electrode ET10 is connected and formed integrally with the second electrode of the transistor T10, and is connected and formed integrally with the first electrode of the transistor T9. In other words, at least a portion of the connection electrode ET10 serves as the second electrode of the transistor T10, and at least a portion of the connection electrode ET10 serves as the first electrode of the transistor T9. The connection electrode ET9 is connected and formed integrally with the second portion C3b2 of the second electrode C3b of the third capacitor C3. The connection electrode ET9 is connected and formed integrally with the second electrode of the transistor T9. In other words, at least a portion of the connection electrode ET9 serves as the second electrode of the transistor T9. The second portion C3b2 (the connection electrode ET9) is connected with the first portion C3b1 of the second electrode C3b of the third capacitor C3 through a via hole, and is further coupled to the second clock signal line ECB2.

Referring to FIG. 3, FIG. 5, FIG. 9, FIG. 14, FIG. 15 and FIG. 16, one end of the connection electrode ET14 is connected with the active layer A3 of the transistor T3 through a via hole, and the other end of the connection electrode ET14 is connected with the active layer A2 of the transistor T2 and the active layer A14 of the transistor T14 through a via hole. The connection electrode ET14 is connected and formed integrally with the second electrode of the transistor T2, and is connected and formed integrally with the first electrode of the transistor T14. In other words, at least a portion of the connection electrode ET14 serves as the second electrode of the transistor T2, and at least a portion of the connection electrode ET14 serves as the first electrode of the transistor T14.

Referring to FIG. 3, FIG. 5, FIG. 9, FIG. 14, FIG. 15 and FIG. 16, one end of the connection electrode ET2 is connected with the active layer A2 of the transistor T2 through a via hole, and the other end of the connection electrode ET2 is connected with the gate electrode G3 of the transistor T3 through a via hole, and is connected with the first portion ECKa of the third clock signal line ECK through the gate electrode G3. The connection electrode ET2 is connected and formed integrally with the first electrode of the transistor T2. In other words, at least a portion of the connection electrode ET2 serves as the first electrode of the transistor T2.

Referring to FIG. 3, FIG. 5, FIG. 9, FIG. 14, FIG. 15 and FIG. 16, one end of the connection electrode ET3 is connected with the gate electrode G14 of the transistor T14, and the other end of the connection electrode ET3 is connected with the gate electrode G1 of the transistor T1, and further connected with the first portion VGLa of the first power line VGL.

Referring to FIG. 3, FIG. 5, FIG. 9, FIG. 14, FIG. 15 and FIG. 16, the connection electrode ETa is connected with the gate electrode G6 of the transistor T6 through a via hole, the connection electrode ETa is connected with the active layer A14 of the transistor T14 through a via hole, and the connection electrode ETa is connected and formed integrally with the second electrode of the transistor T14. In other words, at least a portion of the connection electrode ETa serves as the second electrode of the transistor T14.

Referring to FIG. 3, FIG. 5, FIG. 9, FIG. 14, FIG. 15 and FIG. 16, the second portion C2b2 of the second electrode plate C2b of the second capacitor C2 is connected with the gate electrode G10 of the transistor T10 through a via hole.

Referring to FIG. 3, FIG. 17 and FIG. 18, the first portion C1a1 of the first electrode plate C1a of the first capacitor C1 is connected with the connection electrode ET4 through a via hole.

Referring to FIG. 3, FIG. 17 and FIG. 18, the first portion C2a1 of the first electrode plate C2a of the second capacitor C2 is connected with the connection electrode ETc through a via hole.

Referring to FIG. 3, FIG. 17 and FIG. 18, the first portion C3a1 of the first electrode plate C3a of the third capacitor C3 is connected with the connection electrode ET7 through a via hole.

Referring to FIG. 3, FIG. 17 and FIG. 18, the first portion C4a1 of the first electrode plate C4a of the fourth capacitor C4 is connected with the connection electrode ETa through a via hole.

For example, referring to FIG. 3 to FIG. 19, FIG. 21, and Table 1 as mentioned later, the connection electrode ET1 or the connection line L5 may serve as the first isolation node P31, the connection electrode ET13 or the gate electrode G4 of the transistor T4 or the second electrode plate of the first capacitor C1 may serve as the first input node P11, the connection electrode ET14 may serve as the second isolation node P32, the connection electrode ETa may serve as the third input node P13, the connection electrode ET7 may serve as the second node P2, the connection electrode ET5

(the connection electrode ET11), the second electrode plate C2b of the second capacitor C2 or the gate electrode G10 of the transistor T10 may serve as the first node P1, and the connection electrode ETd may serve as the second input node P12.

For example, the output terminal EOUT1 may have two end portions respectively providing output signals to two adjacent rows of pixel units 103 in the display region 102, for example, the two end portions are arranged side by side in the first direction Y. The output terminal EOUT2 is used to provide an output signal to a next-stage shift register unit as an input signal of the next-stage shift register unit, for example, the output terminal EOUT2 is connected with an input terminal EI of the next-stage shift register unit.

As shown in FIG. 2B and FIG. 3, the charge pump circuit 11 includes the first capacitor C1, the first transistor T5, and the second capacitor C2. The first electrode plate of the first capacitor C1 is connected with the first clock signal line ECB, and the second electrode plate of the first capacitor C1 is connected with the first electrode of the first transistor T5. The first electrode plate of the second capacitor C2 is connected with the first power line VGL, the second electrode plate of the second capacitor C2 is connected with the second electrode of the first transistor T5, and the gate electrode of the first transistor T5 is connected with the first electrode or the second electrode of the first transistor T5. For the charge pump circuit 11, the foregoing description may be referred to.

As shown in FIG. 3, an orthogonal projection of the first capacitor C1 on the base substrate 10 is adjacent to an orthogonal projection of the first transistor T5 on the base substrate 10, and an orthogonal projection of the second capacitor C2 on the base substrate 10 is adjacent to the orthogonal projection of the first transistor T5 on the base substrate 10. In the embodiments of the present disclosure, the first capacitor C1 is adjacent to the first transistor T5, and the second capacitor C2 is adjacent to the first transistor T5, which facilitates layout of the shift register unit and reduces a frame of the display substrate.

As shown in FIG. 3, the orthogonal projection of the first capacitor C1 on the base substrate 10 partially overlaps with the orthogonal projection of the first transistor T5 on the base substrate 10, and an orthogonal projection of the second capacitor C2 on the base substrate 10 partially overlaps with the orthogonal projection of the first transistor T5 on the base substrate 10.

In the embodiments of the present disclosure, elements being arranged adjacent to each other refers to that no other elements are arranged between the elements. In other words, elements being arranged adjacent to each other refers to that the elements are directly connected, rather than indirectly connected through other elements. The elements according to the embodiments of the present disclosure include capacitors and transistors. In the embodiments of the present disclosure, element A and element B being adjacent to each other refers to that there is no other element A and no other element B between the two elements. For example, a capacitor and a transistor being adjacent to each other refers to that there are no other capacitor and no other transistors between the capacitor and the transistor. For example, element A and element B being adjacent to each other refers to that there are no other capacitors and no other transistors between the two elements. For example, element A includes a capacitor or a transistor, and element B includes a capacitor or a transistor.

For example, in the embodiments of the present disclosure, the first capacitor C1 and the second capacitor C2 are arranged around the first transistor T5. Such arrangement can increase layout density and is favorable for a narrow frame. For example, in some embodiments, the first capacitor C1 and the second capacitor C2 are both located on a left side of the first transistor T5. For example, in some embodiments, the first capacitor C1 and the second capacitor C2 are both located on a right side of the first transistor T5. For example, in some embodiments, one of the first capacitor C1 and the second capacitor C2 is located on the left side of the first transistor T5, and the other of the first capacitor C1 and the second capacitor C2 is located on the right side of the first transistor T5. For example, in some embodiments, one of the first capacitor C1 and the second capacitor C2 is located on an upper side of the first transistor T5, and the other of the first capacitor C1 and the second capacitor C2 is located on a lower side of the first transistor T5.

For example, as shown in FIG. 15, in order to make arrangement of the charge pump circuit more compact and reduce the frame of the display substrate, an orthogonal projection of the second electrode plate C1$b$ of the first capacitor C1 on the base substrate 10 partially overlaps with an orthogonal projection of the first electrode of the first transistor T5 on the base substrate 10, and an orthogonal projection of the second electrode plate C2$b$ of the second capacitor C2 on the base substrate 10 partially overlaps with an orthogonal projection of the second electrode of the first transistor T5 on the base substrate.

For example, as shown in FIG. 3 and FIG. 15, the second portion C1$b$2 of the second electrode plate C1$b$ of the first capacitor C1 is connected with the active layer A5 of the first transistor T5, and the second portion C2$b$2 of the second electrode plate C2$b$ of the second capacitor C2 is connected with the active layer A5 of the first transistor T5. The second portion C1$b$2 of the second electrode plate C1$b$ of the first capacitor C1 also serves as the first electrode of the first transistor T5, and the second portion C2$b$2 of the second electrode plate C2$b$ of the second capacitor C2 also serves as the second electrode of the first transistor T5. In other words, the second portion C1$b$2 of the second electrode plate C1$b$ of the first capacitor C1 is connected and formed integrally with the first electrode of the first transistor T5, and the second portion C2$b$2 of the second electrode plate C2$b$ of the second capacitor C2 is connected and formed integrally with the second electrode of the transistor T5.

For example, in order to more effectively reset the first node P1 so that the denoising module is continuously turned on during the keeping phase, the capacitance value of the first capacitor C1 is greater than or equal to the capacitance value of the second capacitor C2. For further example, the capacitance value of the first capacitor C1 is less than or equal to ten times the capacitance value of the second capacitor C2. In some embodiments, in order to take into account the narrow frame and the reset effect for the first node P1, the capacitance value of the first capacitor C1 is four to six times the capacitance value of the second capacitor C2.

For example, the capacitance value of the second capacitor C2 ranges from 0.01 pF to 2 pF. The second capacitor C2 within the value range facilitates setting of the capacitance values of the first capacitor C1 and the second capacitor C2, facilitates implementing functions of the first capacitor C1 and the second capacitor C2, and further facilitates implementing a narrow frame.

For example, as shown in FIG. 3, the first clock signal line ECB extends along the first direction Y on the base substrate 10, and the first capacitor C1, the first transistor T5, and the second capacitor C2 are sequentially arranged in the second direction X. For example, the first direction Y and the second direction X intersect with each other. For example, the first direction Y and the second direction X are directions parallel to a main surface of the base substrate 10, and the main surface of the base substrate 10 is a surface for fabricating respective film layers.

For example, as shown in FIG. 3, the gate electrode of the first transistor T5 and the first electrode of the first transistor T5 are connected through the conductive portion CP to form a diode structure. As shown in FIG. 15, the conductive portion CP is connected with the active layer A5 of the first transistor T5 through the first via hole H1. As shown in FIG. 3, an orthogonal projection of a channel CNL of the first transistor T5 on the base substrate 10 does not overlap with the orthogonal projection of the first via hole H1 on the base substrate 10, so as to avoid a destructive effect on the channel of the first transistor T5 during a process of forming the via hole, which can effectively implement a unidirectional current flow function of the diode-connected first transistor T5, and effectively eliminate noise interference in the keeping phase. For example, as shown in FIG. 16, the conductive portion CP is the second portion C1$b$2 of the second electrode plate C1$b$ of the first capacitor C1.

For example, as shown in FIG. 3 and FIG. 16, the conductive portion CP is connected with the gate electrode G5 of the first transistor T5 through the second via hole H2. As shown in FIG. 3, in order to avoid affecting the channel CNL of the first transistor T5 in the process of forming the second via hole H2, the orthogonal projection of the channel CNL of the first transistor T5 on the base substrate 10 does not overlap with the orthogonal projection of the second via hole H2 on the base substrate 10.

For example, as shown in FIG. 20A, a height h2 of the second via hole H2 in a direction perpendicular to the base substrate 10 is smaller than a height h1 of the first via hole H1 in the direction perpendicular to the base substrate 10.

For example, as shown in FIG. 20A, the first via hole H1 penetrates the third insulating layer IL3, the second insulating layer IL2, and the first insulating layer IL1, and the second via hole H2 penetrates the third insulating layer IL3 and the second insulating layer IL2.

For example, as shown in FIG. 3 and FIG. 20A, the orthogonal projection of the channel CNL of the first transistor T5 on the base substrate 10 partially overlaps with the orthogonal projection of the gate electrode G5 of the first transistor T5 on the base substrate 10. A portion of the active layer A5 that is covered by the gate electrode G5 is the channel CNL. The channel CNL of the first transistor T5 includes a first channel CNL1 and a second channel CNL2, and FIG. 20A shows the first gate electrode G51 overlapping with the first channel CNL1 of the first transistor T5 and the second gate electrode G52 overlapping with the second channel CNL2 of the first transistor T5. As shown in FIG. 5, the first gate electrode G51 and the second gate electrode G52 are both connected and formed integrally with the connection line L1.

For example, as shown in FIG. 3 and FIG. 15, an orthogonal projection of the second transistor T4 on the base substrate 10 partially overlaps with the orthogonal projection of the first capacitor C1 on the base substrate 10. The orthogonal projection of the second transistor T4 on the base substrate 10 is adjacent to the orthogonal projection of the first capacitor C1 on the base substrate 10. The second transistor T4 is arranged adjacent to the first capacitor C1 to facilitate reducing an occupied area of the charge pump circuit and reducing the frame of the display substrate.

For example, as shown in FIG. 3 and FIG. 15, the second transistor T4, the first capacitor C1, the first transistor T5, and the second capacitor C2 are sequentially arranged in the second direction X to facilitate connection of the charge pump circuit with other structures and arrangement of other structures, to facilitate increasing layout density, and to facilitate reducing the frame of the display substrate.

For example, as shown in FIG. 3, the second clock signal line ECB2 extends in the first direction Y on the base substrate 10, the third clock signal line ECK extends in the first direction Y on the base substrate 10, the fourth clock signal line ECK2 extends in the first direction Y on the base substrate 10, the first power line VGL extends in the first direction Y on the base substrate 10, and the second power line VGH extends in the first direction Y on the base substrate 10.

As shown in FIG. 11 and FIG. 12, the via holes H01, H02, H03 and H04 in the fifth insulating layer IL5 (the first planarization layer PLN1) respectively have substantially same shapes and substantially same areas as the second portions C1a2, C2a2, C3a2 and C4a2 of the first electrode plates of the first capacitor C1 to the fourth capacitor C4, so that orthogonal projections of the second portions of the first electrode plates of the first capacitor C1 to the fourth capacitor C4 on the base substrate completely fall within orthogonal projections of the via holes in the fifth insulating layer IL5 on the base substrate, so as to facilitate reducing the distance between the electrode plates of the capacitor, and increasing capacitance, and to facilitate connection of the second portions of the first electrode plates of the first capacitor C1 to the fourth capacitor C4 with the connection electrode ET (referring to FIG. 20B). For example, dielectric layers between the second portions of the first electrode plates of the first capacitor C1 to the fourth capacitor C4 and the second portions of the second electrode plates of the first capacitor C1 to the fourth capacitor C4 do not include the fifth insulating layer IL5 (referring to FIG. 20B).

In the embodiments of the present disclosure, referring to FIG. 3 and FIG. 9 to FIG. 12, the signal line may be in a form of two portions connected in parallel and located in different layers to reduce resistance of the signal line. The first portion ECBa and the second portion ECBb are connected in parallel to form the first clock signal line ECB, the first portion ECB2a and the second portion ECB2b are connected in parallel to form the second clock signal line ECB2, the first portion ECKa and the second portion ECKb are connected in parallel to form the third clock signal line ECK, and the first portion ECK2a and the second portion ECK2b are connected in parallel to form the fourth clock signal line ECK2. The first portion VGLa and the second portion VGLb are connected in parallel to form the first power line VGL, and the first portion VGHa and the second portion VGHb are connected in parallel to form the second power line VGH. The two portions of the signal line can be connected by providing a via hole penetrating an insulating layer between the two portions in corresponding positions.

As shown in FIG. 3 to FIG. 19, the plurality of signal lines, the first power line VGL, and the second power line VGH are connected with the transistors and the capacitors in the remaining respective layers that need to be connected therewith through at least one via hole shown in FIG. 8. The respective transistors and capacitors may also be connected with each other through at least one via hole or bridged through a connection electrode, which is not repeated here.

For example, the materials of the first conductive layer LY1, the second conductive layer LY2, the third conductive layer LY3, and the fourth conductive layer LY4 include metal. For example, the material of the third conductive layer LY3 includes titanium, titanium alloy, aluminum, aluminum alloy, copper, copper alloy, or any other suitable composite material, which is not limited in the embodiments of the present disclosure. For example, the material of the fourth conductive layer LY4 may have the same selection range as the material of the third conductive layer LY3, but is not limited thereto. For example, the material of the first conductive layer LY1 includes molybdenum, nickel, molybdenum alloy, nickel alloy, etc. For example, the material of the second conductive layer LY2 has the same selection range as the material of the first conductive layer LY1, but is not limited thereto.

For example, as shown in FIG. 3 and FIG. 4, in order to facilitate arrangement of the shift register unit, reduce the size of the shift register unit, and reduce the frame of the display substrate, in at least one example, the active layer A9 of the transistor T9 and the active layer A10 of the transistor T10 have an integral structure, the active layer A2 of the transistor T2 and the active layer A14 of the transistor T14 have an integral structure, and the active layer A6 of the transistor T6 and the active layer A7 of the transistor T7 have an integral structure. Of course, in other embodiments, the active layers of the transistors may also be arranged separately.

For example, as shown in FIG. 3 and FIG. 5, in at least one example, the gate electrode G12 of the transistor T12 is connected with the first portion C3b1 of the second electrode plate C3b of the third capacitor C3 through a connection line L4. The gate electrode G12 of the transistor T12, the first portion C3b1 of the second electrode plate C3b of the third capacitor C3, and the connection line L4 have an integral structure. The gate electrode G11 of the transistor T11 is connected with the first portion C4b1 of the second electrode plate C4b of the fourth capacitor C4 through a connection line L3, for example, the gate electrode G11 of the transistor T11, the connection line L3 and the first portion C4b1 of the second electrode plate C4b of the fourth capacitor C4 have an integral structure.

For example, as shown in FIG. 3 and FIG. 5, in at least one example, the fourth control transistor T2 includes a first gate electrode G21 and a second gate electrode G22, and both the first gate electrode G21 and the second gate electrode G22 are connected with the connection line L5. The connection line L5 is located on one side of the gate electrode G2 of the fourth control transistor T2, and extends along the second direction X, and the connection line L5 is connected with the gate electrode G8 of the seventh control transistor T8. The gate electrode G2 of the fourth control transistor T2 forms a "U"-shaped structure, which further enhances stability of the fourth control transistor T2 and improves performance of the fourth control transistor T2. For example, as shown in FIG. 4, the active layer A8 of the transistor T8 has a "U"-shaped structure, so that the transistor T8 has a double-gate structure. For example, as shown in FIG. 4, the active layer A11 of the transistor T11 has a "U"-shaped structure, so that the transistor T11 has a double-gate structure.

Of course, the case may also be that the active layer of the fourth control transistor T2 has a "U"-shaped structure. The gate electrode of the fourth control transistor T2 has an "I"-shaped structure overlapping with the "U"-shaped active layer to form a double-gate structure, as long as arrangement of other structures are not affected and the width of the shift register unit is not excessively increased, which is not limited in the embodiments of the present disclosure. It should be noted that, the case may also be that a single gate electrode overlaps with the active layer of the fourth control transistor T2, which is not limited in the embodiments of the present disclosure.

For example, as shown in FIG. 3 and FIG. 5, in at least one example, the conductive line M1 extends along the second direction X, the conductive line M2 extends along the first direction Y, and the conductive line M3 extends along the second direction X.

For example, as shown in FIG. 3 and FIG. 5, in at least one example, the gate electrode G11 of the transistor T11 is connected with the first portion C4*b*1 of the second electrode plate C4*b* of the fourth capacitor C4 through a connection line L3, and the gate electrode G11 of the transistor T11, the connection line L3, and the first portion C4*b*1 of the second electrode plate C4*b* of the fourth capacitor C4 have an integral structure.

For example, as shown in FIG. 3 and FIG. 5, in at least one example, the gate electrode G4 of the transistor T4 is connected with the first portion C1*b*1 of the first electrode plate C1*b* of the first capacitor through the connection line L2, and the gate electrode G4 of the transistor T4, the connection line L2 and the first portion C1*b*1 of the first electrode plate C1*b* of the first capacitor have an integral structure. Further, for example, the gate electrode G4 of the transistor T4, the gate electrode of the transistor T5, the connection line L2, the connection line L1 and the first portion C1*b*1 of the first electrode plate C1*b* of the first capacitor have an integral structure.

For example, as shown in FIG. 3 and FIG. 5, in at least one example, the gate electrode of the second output transistor T9 has a comb-shaped structure to improve stability of the second output transistor T9.

For example, as shown in FIG. 3 and FIG. 4, the extension direction of the active layer A4 of the second transistor T4 intersects with the extension direction of the active layer A5 of the first transistor T5, to facilitate arrangement of the first transistor T5 and the second transistor T4, to facilitate reducing the occupied area of the charge pump circuit, and to facilitate improving layout density, and reducing the size of the shift register unit to reduce the frame. For example, as shown in FIG. 4, the active layer A4 of the second transistor T4 extends in the first direction Y, and the active layer A5 of the first transistor T5 extends in the second direction X.

For example, as shown in FIG. 3 and FIG. 4, in order to reduce the size of the shift register unit, the active layer A1 of the second control transistor T1 extends along the first direction Y, the active layer A12 of the first control transistor T12 extends along the first direction Y, the active layer A13 of the first isolation transistor T13 extends along the first direction Y, and the active layer A1 is located between the active layer A12 and the active layer A13. For example, the active layer A12, the active layer A1, and the active layer A13 are sequentially arranged along the first direction Y. For example, the active layer A12, the active layer A1, and the active layer A13 are located on the same straight line.

For example, as shown in FIG. 3 and FIG. 4, in order to increase layout density, the active layer A2, the active layer A14, the active layer A6 and the active layer A7 all extend along the second direction X, and the active layer A3 and the active layer A4 both extend along the first direction Y.

For example, referring to FIG. 3, FIG. 10, FIG. 11 and FIG. 19, a via hole H041, a via hole H031, a via hole H021 and a via hole H011 are respectively via holes penetrating the fourth insulating layer IL4 (the passivation layer PVX), and a via hole H04, a via hole H03, a via hole H02 and a via hole H01 are respectively via holes penetrating the fifth insulating layer IL5 (the first planarization layer PLN1). As shown in FIG. 19, the via hole H041 and the via hole H04 overlap and connect with each other, the via hole H031 and the via hole H03 overlap and connect with each other, the via hole H021 and the via hole H02 overlap and connect with each other, and the via hole H011 and the via hole H01 overlap and connect with each other, to facilitate reducing the distance between the electrode plates of the capacitor, and increasing capacitance and to facilitate arrangement of electrode plates of the capacitor.

For example, in some embodiments of the present disclosure, the first capacitor C1, the second capacitor C2, the third capacitor C3, and the fourth capacitor C4 adopt the same structure, and all adopt a structure of three capacitors connected in parallel. As shown in FIG. 20B, the capacitor C includes a first electrode plate Ca and a second electrode plate Cb, the first electrode plate Ca includes a first portion Ca1 and a second portion Ca2, the second electrode plate Cb includes a first portion Cb1 and a second portion Cb2, the first portion Ca1 is connected with the second portion Ca2 through an connection electrode ET, and the first portion Cb1 is connected with the second portion Cb2. As shown in FIG. 20B, in the third direction Z, the first portion Cb1, the first portion Ca1, the second portion Cb2, and the second portion Ca2 are arranged sequentially. The third direction Z is a direction perpendicular to the base substrate 10. The third direction Z is perpendicular to the first direction Y and perpendicular to the second direction X. For example, the first direction Y and the second direction X are directions parallel to the main surface of the base substrate, the third direction Z is a direction perpendicular to the main surface of the base substrate, and the main surface of the base substrate is a surface for fabricating respective elements. The first portion Cb1 and the first portion Ca1 directly face each other to form a capacitor, the first portion Ca1 and the second portion Cb2 directly face each other to form a capacitor, and the second portion Cb2 and the second portion Ca2 directly face each other to form a capacitor. Such arrangement facilitates increasing capacitance, and reducing the occupied area of the capacitor, and facilitates implementing a narrow frame of the display substrate. It should be noted that, FIG. 20B only schematically shows the structure of three capacitors connected in parallel, and the insulating layer provided between the electrode plates of the capacitor may include at least one insulating layer.

As shown in FIG. 20B, the second portion Ca2 is connected with the connection electrode ET through a via hole H22 penetrating the fourth insulating layer IL4, the connection electrode ET is connected with the first portion Ca1 through a via hole H21 penetrating the third insulating layer IL3, and the second portion Cb2 is connected with the first portion Cb1 through a via hole H23 penetrating the third insulating layer IL3 and the second insulating layer IL2.

Referring to FIG. 17, FIG. 18 and FIG. 20B, with respect to the first capacitor C1, the first electrode plate Ca shown in FIG. 20B is the first electrode plate C1*a*, and the first portion Ca1 shown in FIG. 20B is the first portion C1*a*1. Referring to FIG. 12 and FIG. 20B, the second portion Ca2 shown in FIG. 20B is the second portion C1*a*2, the second electrode plate Cb shown in FIG. 20B is the second electrode plate C1*b*, the first portion Cb1 shown in FIG. 20B is the first portion C1*b*1, the second portion Cb2 shown in FIG. 20B is the second portion C1*b*2, and the connection electrode ET shown in FIG. 20B is the connection electrode ET4, which may also be referred to as an connection portion or a first connection portion.

Referring to FIG. 17, FIG. 18 and FIG. 20B, with respect to the second capacitor C2, the first electrode plate Ca shown in FIG. 20B is the first electrode plate C2a, the first portion Ca1 shown in FIG. 20B is the first portion C2a1, and the second portion Ca2 shown in FIG. 20B is the second portion C2a2. Referring to FIG. 12 and FIG. 20B, the second electrode plate Cb shown in FIG. 20B is the second electrode plate C2b, the first portion Cb1 shown in FIG. 20B is the first portion C2b1, the second portion Cb2 shown in FIG. 20B is the second portion C2b2, and the connection electrode ET shown in FIG. 20B is the connection electrode ETc, which may also be referred to as an connection portion or a second connection portion.

Referring to FIG. 17, FIG. 18 and FIG. 20B, with respect to the third capacitor C3, the first electrode plate Ca shown in FIG. 20B is the first electrode plate C3a, the first portion Ca1 shown in FIG. 20B is the first portion C3a1, and the second portion Ca2 shown in FIG. 20B is the second portion C3a2. Referring to FIG. 12 and FIG. 20B, the second electrode plate Cb shown in FIG. 20B is the second electrode plate C3b, the first portion Cb1 shown in FIG. 20B is the first portion C3b1, the second portion Cb2 shown in FIG. 20B is the second portion C3b2, and the connection electrode ET shown in FIG. 20B is the connection electrode ET7, which may also be referred to as a connection portion or a third connection portion.

Referring to FIG. 17, FIG. 18 and FIG. 20B, with respect to the fourth capacitor C4, the first electrode plate Ca shown in FIG. 20B is the first electrode plate C4a, the first portion Ca1 shown in FIG. 20B is the first portion C4a1, and the second portion Ca2 shown in FIG. 20B is the second portion C4a2. Referring to FIG. 12 and FIG. 20B, the second electrode plate Cb shown in FIG. 20B is the second electrode plate C4b, the first portion Cb1 shown in FIG. 20B is the first portion C4b1, the second portion Cb2 shown in FIG. 20B is the second portion C4b2, and the connection electrode ET shown in FIG. 20B is the connection electrode ETa, which may also be referred to as a connection portion or a fourth connection portion.

For example, as shown in FIG. 20B, at least one of the first capacitor C1, the second capacitor C2, the third capacitor C3, and the fourth capacitor C4 is the structure of three capacitors connected in parallel, and the structure of three capacitors connected in parallel includes the first portion of the second electrode plate, the second portion of the second electrode plate, the first portion of the first electrode plate, and the second portion of the first electrode plate. The first portion of the second electrode plate is connected with the second portion of the second electrode plate through the third via hole (via hole H23), the first portion of the first electrode plate is connected with the second portion of the first electrode plate through the connection electrode ET, and the third via hole (via hole H23) and the connection electrode ET are respectively located on two opposite sides of the structure of three capacitors connected in parallel. The first portion of the second electrode plate, the first portion of the first electrode plate, the second portion of the second electrode plate, and the second portion of the first electrode plate are arranged sequentially to form the structure of three capacitors connected in parallel, and the connection electrode ET and the second portion of the second electrode plate are located in the same layer and insulated from each other. For example, as shown in FIG. 20B, the first portion of the second electrode plate, the first portion of the first electrode plate, the second portion of the second electrode plate, and the second portion of the first electrode plate are formed sequentially. For example, as shown in FIG. 20B, the connection electrode ET and the second portion Cb2 of the second electrode plate Cb are located in the same layer and are spaced apart from each other to be insulated from each other.

For example, as shown in FIG. 3 and FIG. 16, the gate electrode of the first output transistor T10 is electrically connected with the second portion C2b2 of the second electrode C2b of the second capacitor C2, the first electrode of the first output transistor T10 is electrically connected with the first portion VGLa of the first power line VGL, and the second electrode of the first output transistor T10 is electrically connected with the driving signal output terminal. For example, as shown in FIG. 3, FIG. 16 and FIG. 18, the gate electrode of the second output transistor T9 is electrically connected with the first portion C3a1 of the first electrode plate C3a of the third capacitor C3 through the connection electrode ET7.

As shown in FIG. 3, FIG. 15 and FIG. 18, the first electrode of the second output transistor T9 is electrically connected with the driving signal output terminal EOUT1 through a via hole, and the second electrode of the second output transistor T9 is connected with the first portion C3b1 of the second electrode plate C3b of the third capacitor C3 through the connection electrode ET9, and is further connected with the connection line L4, and is further electrically connected with the second clock signal line ECB2. The first portion C3b1 of the second electrode plate C3b of the third capacitor C3 is electrically connected with the first portion ECB2a of the second clock signal line ECB2. An orthogonal projection of the third capacitor C3 on the base substrate is adjacent to an orthogonal projection of the second output transistor T9 on the base substrate. For example, the third capacitor C3 is arranged adjacent to the second output transistor T9 to facilitate signal transmission.

For example, as shown in FIG. 20B, the area of the second portion Ca2 of the first electrode plate Ca is less than or equal to the area of the via hole H0 penetrating the fifth insulating layer IL5, so as to minimize the distance between the electrode plates of the capacitor, and increase capacitance. For example, an orthogonal projection of the second portion Ca2 of the first electrode plate Ca on the base substrate 10 completely falls within an orthogonal projection of the via hole H0 penetrating the fifth insulating layer IL5 on the base substrate 10.

For example, as shown in FIG. 3 and FIG. 15, the shift register unit 100aa further includes a first control transistor T12, a second control transistor T1, and a first isolation transistor T13. A gate electrode of the first control transistor T12 is electrically connected with the second clock signal line ECB2 through a via hole, a first electrode of the first control transistor T12 is electrically connected with the input terminal EI through the connection electrode ETI, a gate electrode of the second control transistor T1 is electrically connected with the third clock signal line ECK through a via hole, a first electrode of the second control transistor T1 is electrically connected with a second electrode of the first control transistor T12 through the connection electrode ET12, a second electrode of the second control transistor T1 is electrically connected with a second electrode of the first isolation transistor T13 through the connection electrode ET1, a first electrode of the first isolation transistor T13 is electrically connected with the second electrode plate of the first capacitor C1 through the connection electrode ET13, and a gate electrode of the first isolation transistor T13 is electrically connected with the first portion VGLa of the first power line VGL through a via hole. For example, a second end of the connection electrode ET13 is connected with the first electrode of the first isolation transistor T13.

For example, in order to reduce the GOA width and facilitate signal transmission, the first control transistor T12 is arranged close to the second clock signal line ECB2. An orthogonal projection of the first control transistor T12 on the base substrate and an orthogonal projection of the second clock signal line ECB2 on the base substrate are located on the same side of the orthogonal projection of the second output transistor T9 on the base substrate. For example, as shown in FIG. 3, the first control transistor T12 and the second clock signal line ECB2 are located on the same side of the second output transistor T9. In FIG. 3, the first control transistor T12 and the second clock signal line ECB2 are both located on a left side of the second output transistor T9.

For example, the orthogonal projection of the second clock signal line ECB2 on the base substrate, the orthogonal projection of the first control transistor T12 on the base substrate, and the orthogonal projection of the second output transistor T9 on the base substrate are sequentially arranged along the second direction X. For example, as shown in FIG. 3, the second clock signal line ECB2, the first control transistor T12, and the second output transistor T9 are sequentially arranged along the second direction X.

For example, as shown in FIG. 3, the second clock signal line ECB2, the first control transistor T12, the first capacitor C1, the second capacitor C2, and the second output transistor T9 are sequentially arranged along the second direction X.

For example, as shown in FIG. 3, the second clock signal line ECB2, the first control transistor T12, the fourth capacitor C4, the third capacitor C3, and the second output transistor T9 are sequentially arranged along the second direction X.

For example, as shown in FIG. 3 and FIG. 21, the shift register unit 100aa further includes a third control transistor T3, a fourth control transistor T2, and a second isolation transistor T14. A gate electrode of the third control transistor T3 is electrically connected with the third clock signal line ECK through a via hole, a first electrode of the third control transistor T3 is electrically connected with the first power line VGL through the connection electrode ET3 (as shown in FIG. 16) and the conductive line M3, and a second electrode of the third control transistor T3 is electrically connected with a second electrode of the fourth control transistor T2 through the connection electrode ET14 (as shown in FIG. 16). A gate electrode of the fourth control transistor T2 is electrically connected with the connection line L5, and is further electrically connected with the connection electrode ET1, the connection line L5 and/or the connection electrode ET1 may serve as the first isolation node P31, a first electrode of the fourth control transistor T2 is electrically connected with the third clock signal line ECK through the connection electrode ET2 and the gate electrode of the third control transistor T3, and a second electrode of the fourth control transistor T2 is electrically connected with the second electrode of the third control transistor T3 through the connection electrode ET14 A gate electrode of the second isolation transistor T14 is electrically connected with the first power line VGL through the connection electrode ET3 and the conductive line M3, a first electrode of the second isolation transistor T14 is electrically connected with the second electrode of the fourth control transistor T2 through the connection electrode ET14, and a second electrode of the second isolation transistor T14 is connected with the connection electrode ETa.

For example, referring to FIG. 3, FIG. 16 and FIG. 21, the shift register unit 100aa further includes a fifth control transistor T6, a sixth control transistor T7, a seventh control transistor T8, and a fourth capacitor C4. A first electrode plate of the fourth capacitor C4 is electrically connected with the connection electrode ETa, and is further connected with the second electrode of the second isolation transistor T14. A gate electrode G6 of the fifth control transistor T6 is electrically connected with the first electrode plate C4a (the first portion C4a1 and the second portion C4a2 of the first electrode plate C4a) of the fourth capacitor C4 through the connection electrode ETa, a first electrode of the fifth control transistor T6 is electrically connected with the second electrode plate C4b of the fourth capacitor C4 through the connection electrode ETd, and a second electrode of the fifth control transistor T6 is electrically connected with the first clock signal line ECB through the connection electrode ET6 and the conductive line M1. A gate electrode G7 of the sixth control transistor T7 is electrically connected with the first clock signal line ECB through the connection electrode ET6 and the conductive line M1, a first electrode of the sixth control transistor T7 is electrically connected with the second electrode plate of the fourth capacitor C4 through the connection electrode ETd, and a second electrode of the sixth control transistor T7 is electrically connected with the first electrode plate C3a of the third capacitor C3 through the connection electrode ET7. A gate electrode G8 of the seventh control transistor T8 is electrically connected with the second electrode of the second control transistor T1 through the connection line L5 and the connection electrode ET1, a first electrode of the seventh control transistor T8 is electrically connected with the second power line VGH through the connection electrode ET8, the conductive line M2 and the connection electrode ETb, and a second electrode of the seventh control transistor T8 is electrically connected with the first electrode plate C3a of the third capacitor C3 through the connection electrode ET7.

For example, as shown in FIG. 3, in order to reduce the frame of the display substrate, the fourth capacitor C4 is arranged adjacent to the fifth control transistor T6 and the sixth control transistor T7. An orthogonal projection of the fourth capacitor C4 on the base substrate is adjacent to an orthogonal projection of the fifth control transistor T6 on the base substrate, and the orthogonal projection of the fourth capacitor C4 on the base substrate is adjacent to an orthogonal projection of the sixth control transistor T7 on the base substrate. The fourth capacitor C4 is arranged close to the fifth control transistor T6 and the sixth control transistor T7 to facilitate signal transmission.

For example, as shown in FIG. 3, connection lines between centers of the fourth capacitor C4, the fifth control transistor T6 and the sixth control transistor T7 constitute an obtuse triangle. For example, the center of the fourth capacitor C4 includes a center of the first electrode plate C4a or a center of the second electrode plate C4b of the fourth capacitor C4. For example, the center of the fifth control transistor T6 includes a center of the active layer A6, and the center of the sixth control transistor T7 includes a center of the active layer A7. In the embodiments of the present disclosure, the center of the transistor may refer to the center of the active layer of the transistor, and the center of the capacitor may refer to a center of any one of the electrode plates thereof. For example, a center of an element may refer to a geometric center of the element.

For example, as shown in FIG. 3, the fifth control transistor T6 and the sixth control transistor T7 are arranged along the second direction X, and the fifth control transistor T6 and the sixth control transistor T7 are located on the same side of the fourth capacitor C4. As shown in FIG. 3, the fifth control transistor T6 and the sixth control transistor T7 are located on a lower side of the fourth capacitor C4. As shown in FIG. 3, the connection line L4 is located on an upper side of the fourth capacitor C4, then, the fifth control transistor T6 and the sixth control transistor T7, and the connection line L4 are separately arranged on opposite sides of the fourth capacitor C4.

For example, as shown in FIG. 3, the fifth control transistor T6 and the sixth control transistor T7 are both located between the seventh control transistor T8 and the fourth capacitor C4.

For example, as shown in FIG. 3, in order to increase layout density, the fifth control transistor T6, the sixth control transistor T7 and the seventh control transistor T8 are located in a region surrounded by the first capacitor C1, the second capacitor C2, and the fourth capacitor C4.

For example, as shown in FIG. 3, in order to increase layout density, the fifth control transistor T6, the sixth control transistor T7, and the seventh control transistor T8 are located in a region surrounded by the first capacitor C1, the second capacitor C2, the third capacitor C3, and the fourth capacitor C4.

For example, as shown in FIG. 3, the first capacitor C1 and the third capacitor C3 are arranged in the second direction X, the second capacitor C2 and the fourth capacitor C4 are arranged in the first direction Y, the second capacitor C2 is located between the first capacitor C1 and the third capacitor C3, and the fourth capacitor C4 is located between the first capacitor C1 and the third capacitor C3.

For example, as shown in FIG. 3, in order to facilitate arrangement of the first transistor T5, that is, to arrange the first transistor T5 between the first capacitor C1 and the second capacitor C2, the distance between the third capacitor C3 and the second capacitor C2 in the second direction X is less than the distance between the first capacitor C1 and the second capacitor C2 in the second direction X.

For example, as shown in FIG. 3, in order to facilitate wiring, the distance between the third capacitor C3 and the fourth capacitor C4 in the second direction X is greater than the distance between the first capacitor C1 and the fourth capacitor C4 in the second direction X.

Figure 22:
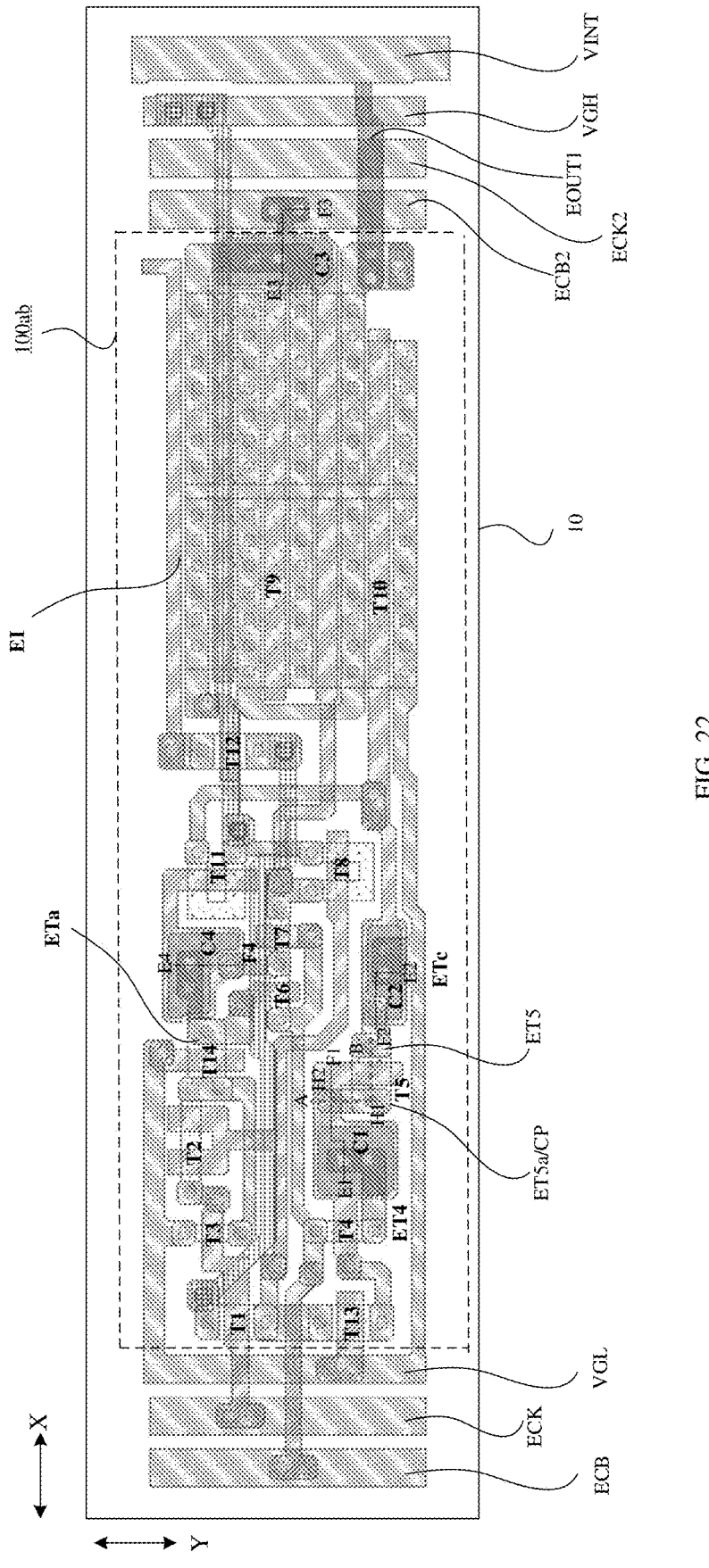
FIG. 22 is a schematic diagram of a layout of the shift register unit shown in FIG. 2B in the display substrate.
Figure 23:
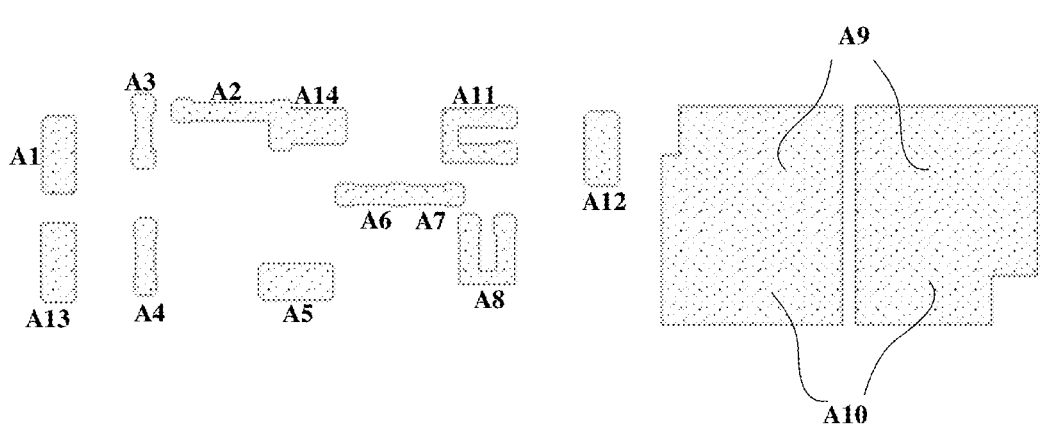
FIG. 23 to FIG. 29 are plan views of wirings or via holes of respective layers of the display substrate shown in FIG. 22.
Figure 24:
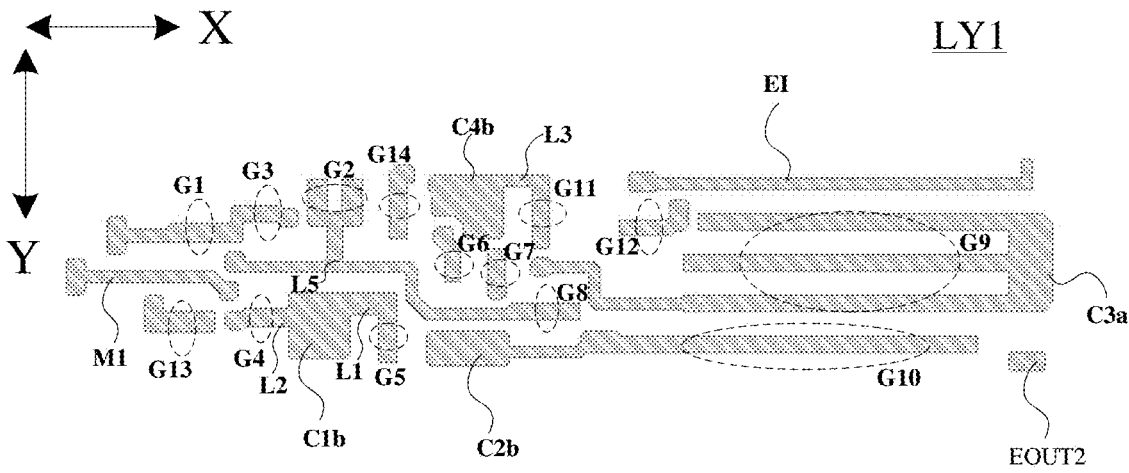
Figure 25:
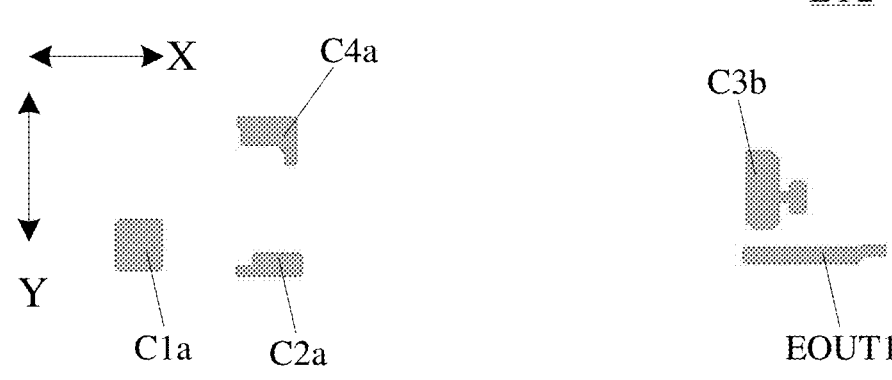
Figure 26:
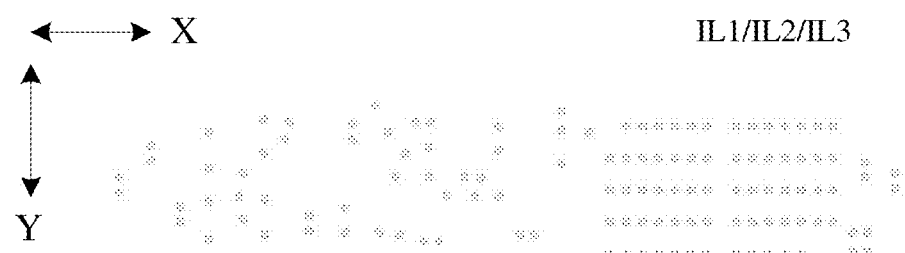
Figure 27:
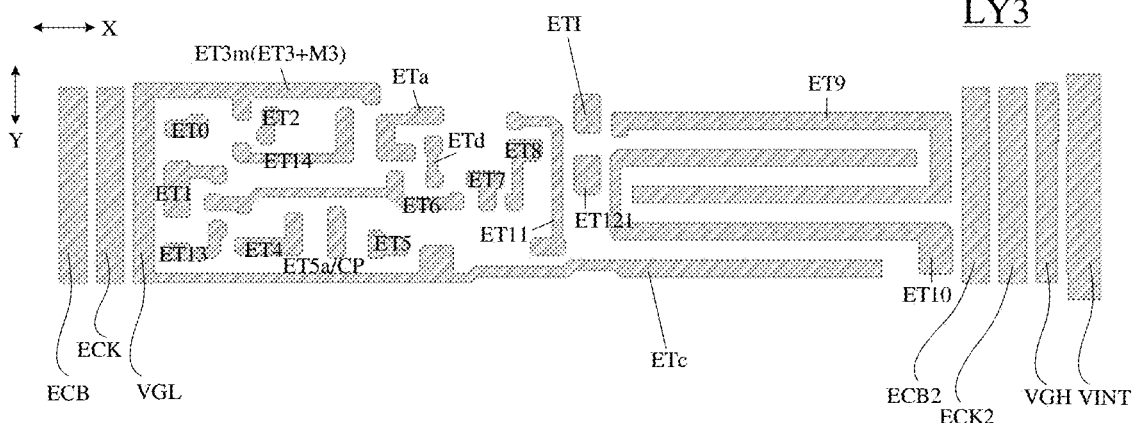
Figure 28:
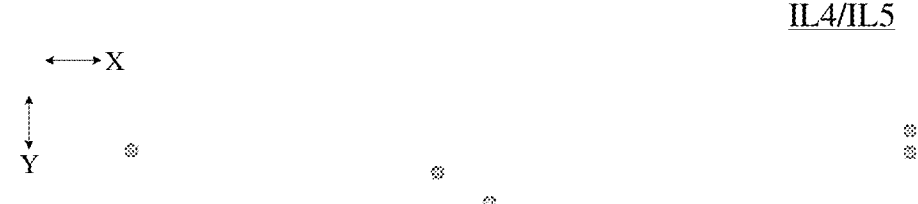
Figure 29:
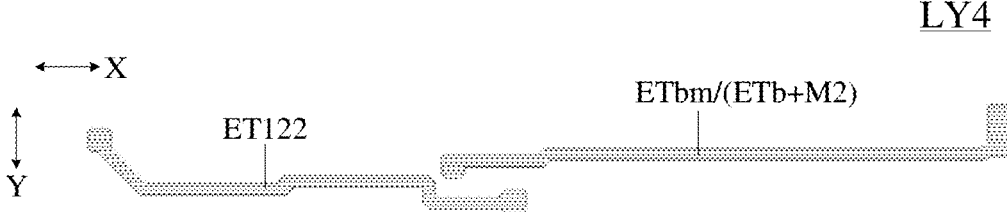
Figure 30:
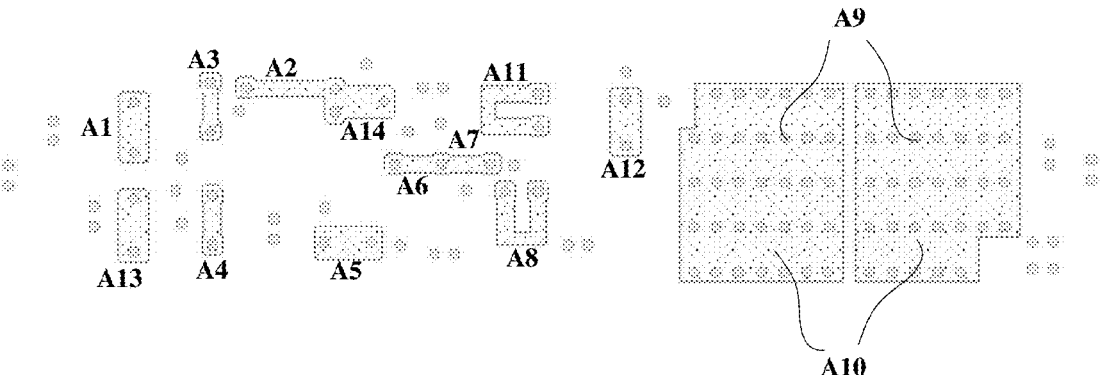
FIG. 30 to FIG. 37 are plan views of a plurality of film layers in the display substrate shown in FIG. 22.
Figure 31:
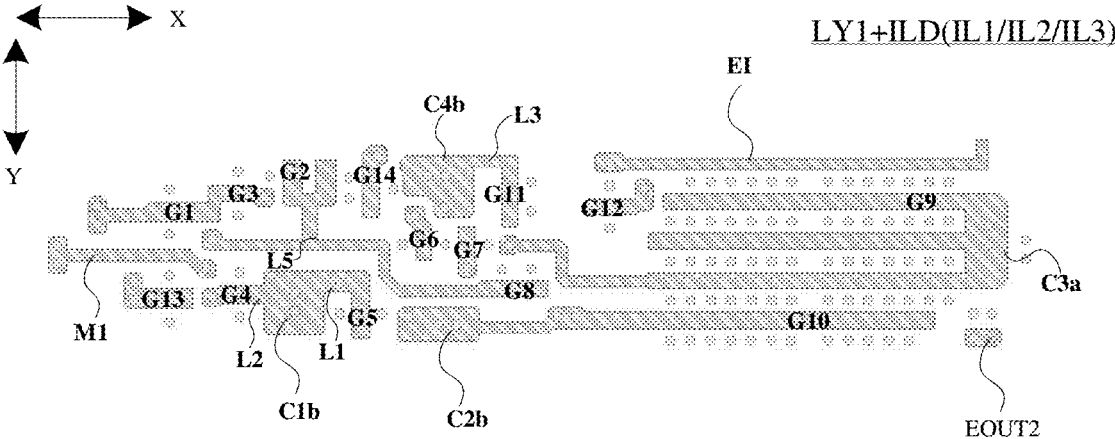
Figure 32:
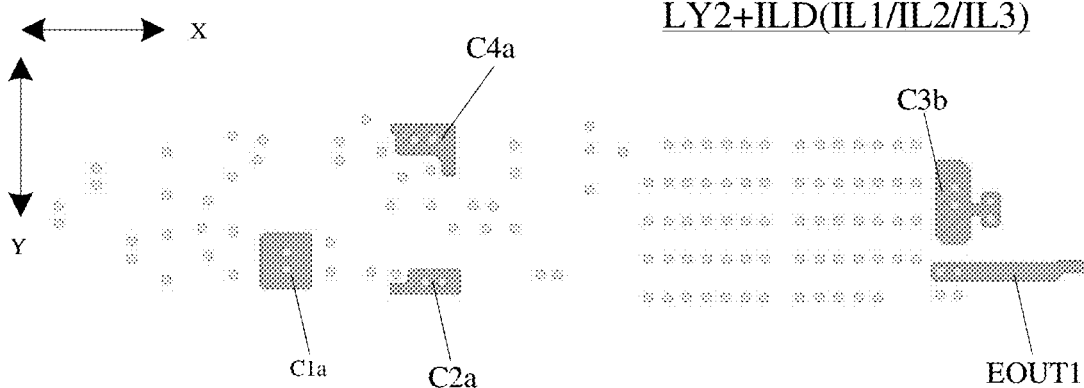
Figure 33:
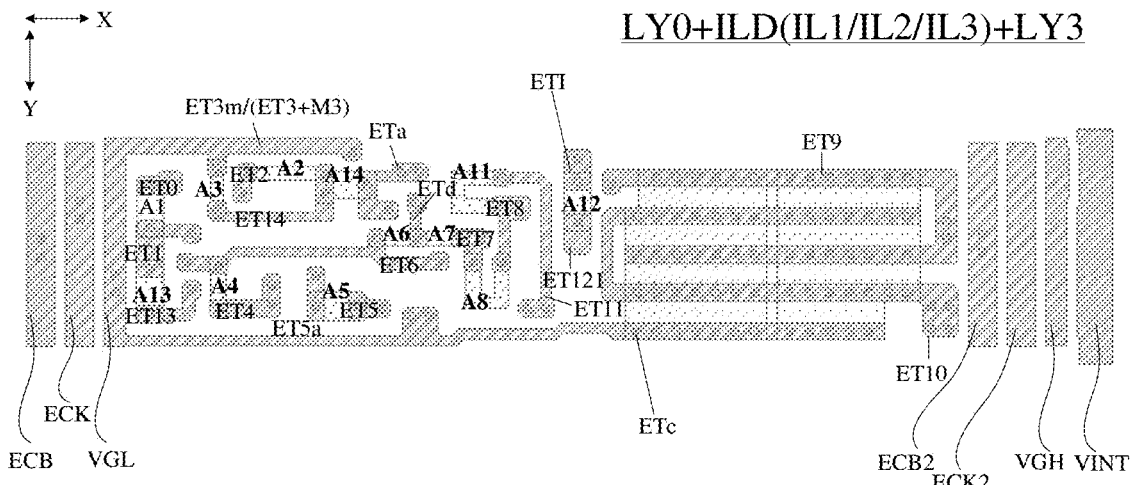
Figure 34:
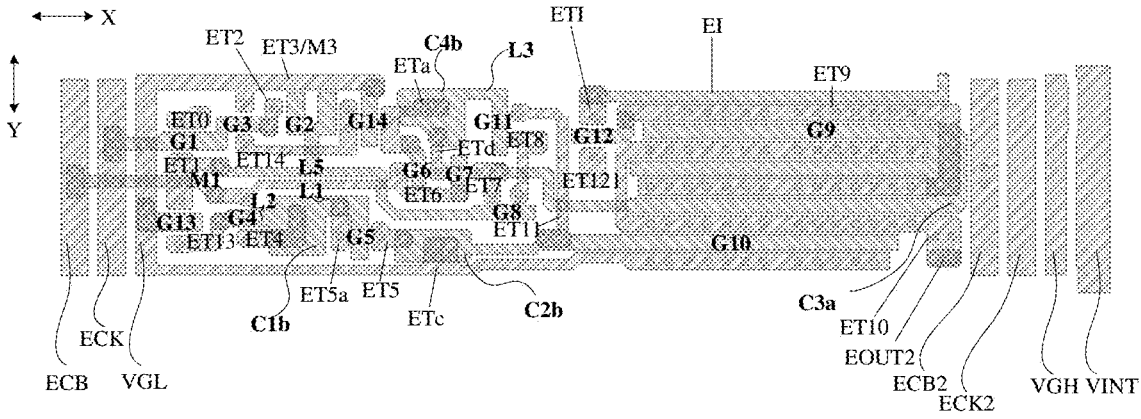
Figure 35:
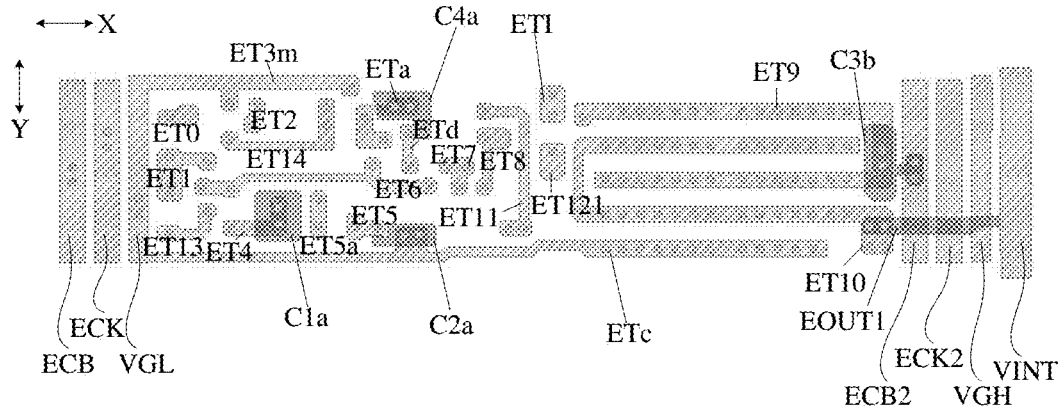
Figure 36:
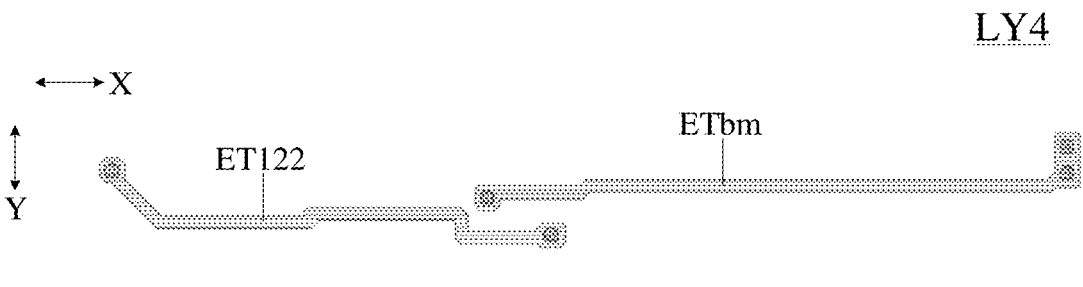
Figure 37:
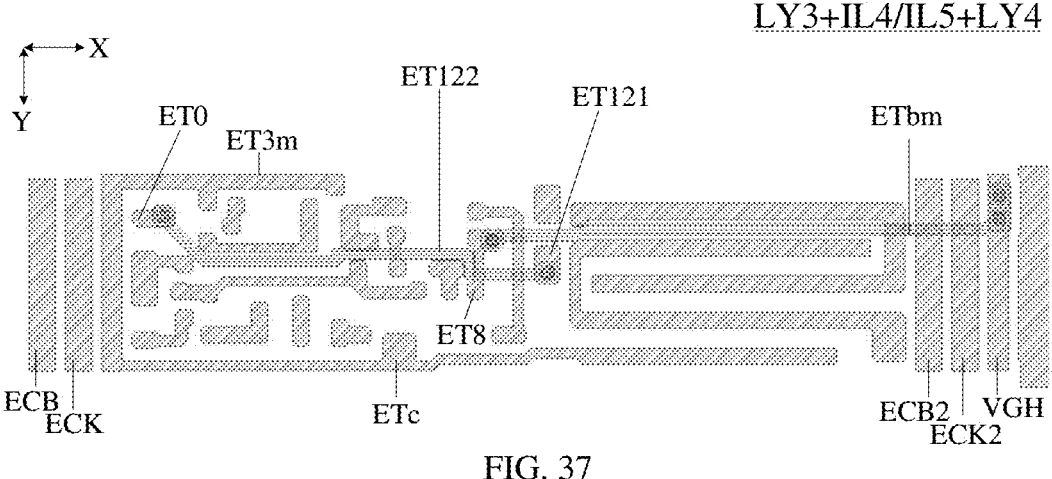
Figure 38:
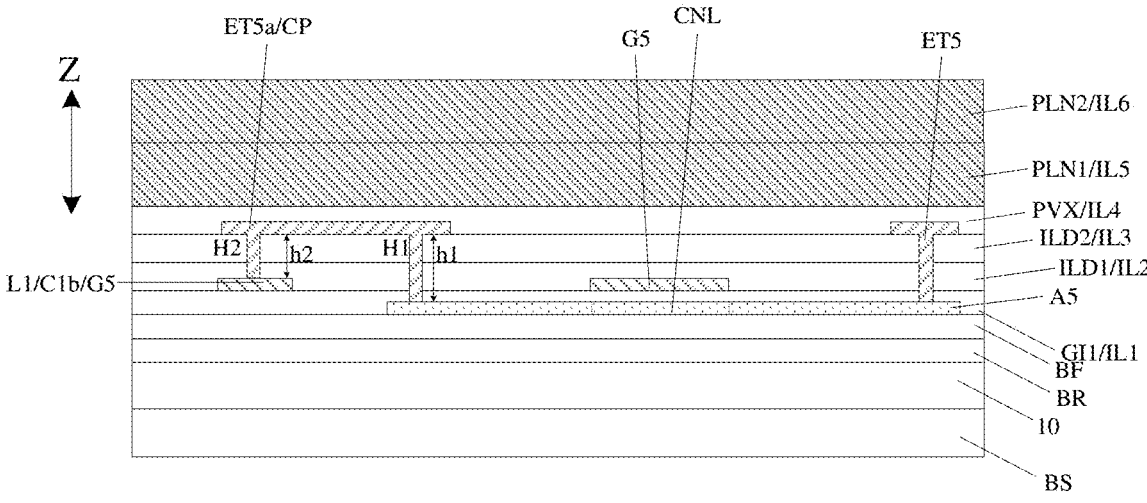
FIG. 38 is a cross-sectional view taken along line A-B in FIG. 22.
Figure 39:
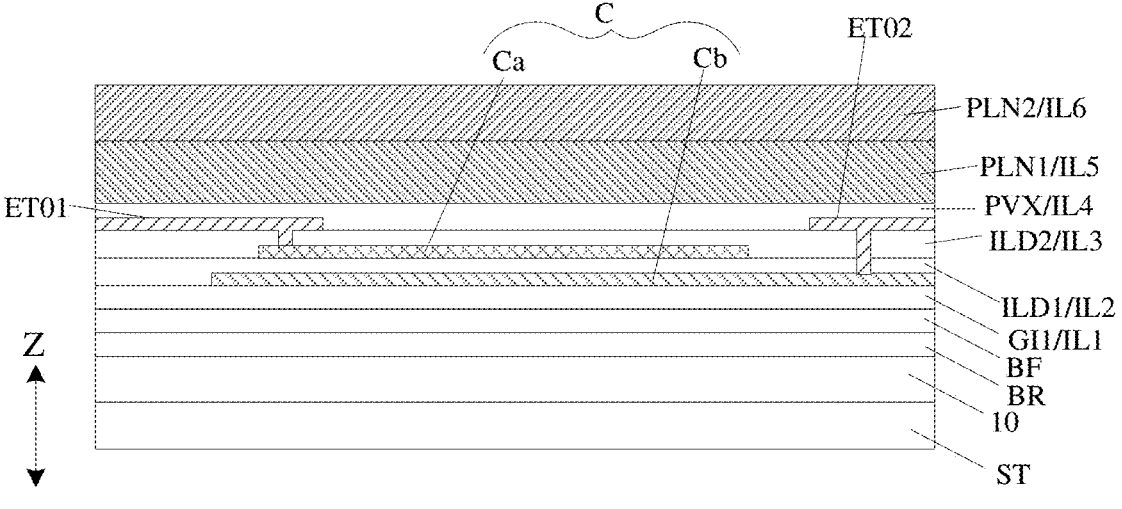
FIG. 39 is a cross-sectional view taken along line E1-F1, E2-F2, or E4-F4 in FIG. 22.
Figure 40:
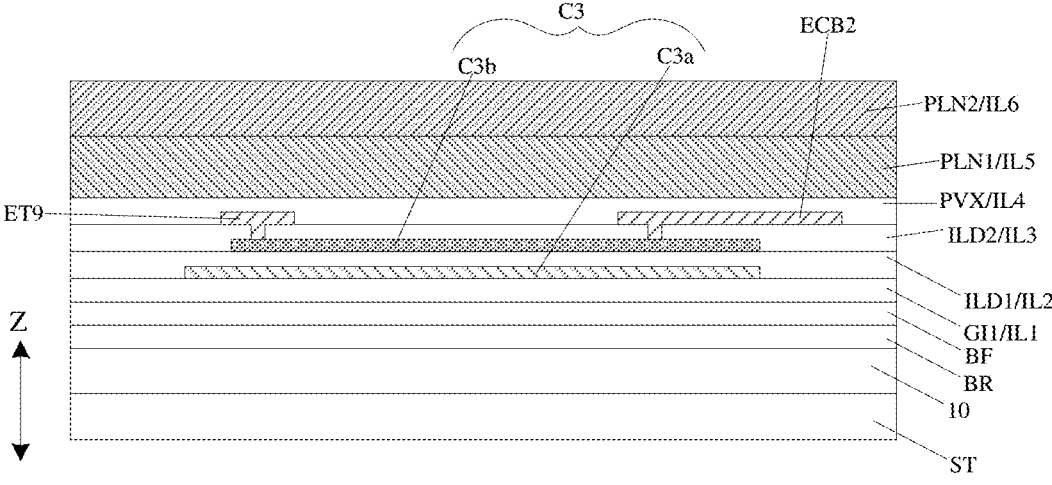
FIG. 40 is a cross-sectional view taken along line E3-F3 in FIG. 22.
Figure 41:
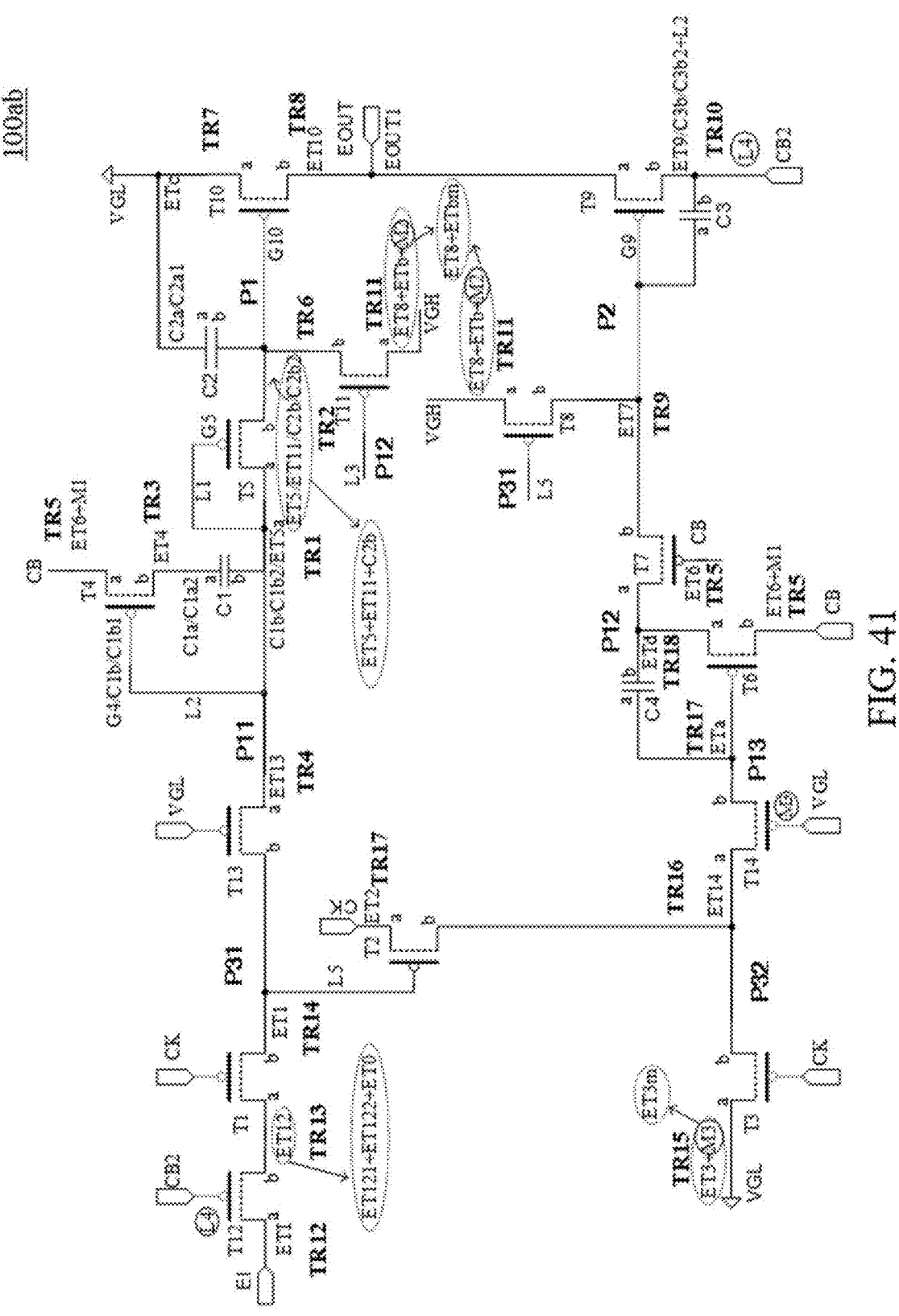
FIG. 41 is a schematic diagram of the arrangement positions of respective connection lines, connection electrodes, and conductive lines in the display substrate shown in FIG. 22.

FIG. 22 is a schematic diagram of a layout of the shift register unit 100a shown in FIG. 2B in the display substrate. FIG. 23 to FIG. 29 are plan views of wiring or via holes of respective layers of the display substrate shown in FIG. 22. FIG. 30 to FIG. 37 are plan views of a plurality of film layers in the display substrate shown in FIG. 22. FIG. 38 is a cross-sectional view taken along line A-B of FIG. 22. FIG. 39 is a cross-sectional view taken along line E1-F1, E2-F2, or E4-F4 of FIG. 22. FIG. 40 is a cross-sectional view taken along line E3-F3 in FIG. 22. FIG. 41 is a schematic diagram of arrangement positions of respective connection lines, connection electrodes, and conductive lines in the display substrate shown in FIG. 22. FIG. 23 is a plan view of an active layer of a display substrate provided by at least one embodiment of the present disclosure. FIG. 24 is a plan view of a first conductive layer of a display substrate provided by at least one embodiment of the present disclosure. FIG. 25 is a plan view of a second conductive layer of a display substrate provided by at least one embodiment of the present disclosure. FIG. 26 is a distribution diagram of via holes penetrating at least one of a first insulating layer, a second insulating layer, and a third insulating layer of a display substrate provided by at least one embodiment of the present disclosure. FIG. 27 is a plan view of a third conductive layer of a display substrate provided by at least one embodiment of the present disclosure. FIG. 28 is a distribution diagram of via holes penetrating a fourth insulating layer and a fifth insulating layer of a display substrate provided by at least one embodiment of the present disclosure. FIG. 29 is a distribution diagram of via holes penetrating a fourth insulating layer (a first planarization layer) of a display substrate provided by at least one embodiment of the present disclosure. FIG. 30 is a schematic diagram of a laminate of a semiconductor layer LY0 and a via hole penetrating an interlayer insulating layer ILD (a first insulating layer IL1, a second insulating layer IL2, and a third insulating layer IL3) of a display substrate provided by at least one embodiment of the present disclosure. FIG. 31 is a schematic diagram of a laminate of a first conductive layer LY1 and a via hole penetrating an interlayer insulating layer ILD of a display substrate provided by at least one embodiment of the present disclosure. FIG. 32 is a schematic diagram of a laminate of a second conductive layer LY2 and a via hole penetrating an interlayer insulating layer ILD of a display substrate provided by at least one embodiment of the present disclosure. FIG. 33 is a schematic diagram of a laminate of a semiconductor layer LY0, a via hole penetrating an interlayer insulating layer ILD, and a third conductive layer LY3 of a display substrate provided by at least one embodiment of the present disclosure. FIG. 34 is a schematic diagram of a laminate of a first conductive layer LY1, a via hole penetrating an interlayer insulating layer ILD, and a third conductive layer LY3 of a display substrate provided by at least one embodiment of the present disclosure. FIG. 35 is a schematic diagram of a laminate of a second conductive layer LY2, a via hole penetrating an interlayer insulating layer ILD, and a third conductive layer LY3 of a display substrate provided by at least one embodiment of the present disclosure. FIG. 36 is a schematic diagram of a laminate of a fourth conductive layer LY4, and a via hole penetrating a fourth insulating layer and a fifth insulating layer of a display substrate provided by at least one embodiment of the present disclosure. FIG. 37 is a schematic diagram of a laminate of a third conductive layer LY3, a via hole penetrating a fourth insulating layer and a fifth insulating layer, and a fourth conductive layer LY4 of a display substrate provided by at least one embodiment of the present disclosure.

For example, as shown in FIG. 22, some clock signal lines and the first power line VGL are located on one side of the shift register unit 100ab, and the other clock signal lines and the second power line VGH are located on the other side of the shift register unit 100aa.

For example, in order to reduce the length of a connection line between the gate electrode of the first control transistor T12 and the second electrode of the second output transistor T9, and to reduce the length of a connection line between the first control transistor T12 and the second clock signal line ECB2/the fourth clock signal line ECK2, to facilitates reducing load on the second clock signal line ECB2/the fourth clock signal line ECK2, and further reducing power consumption of the GOA, as shown in FIG. 22, the first control transistor T12 is arranged close to or adjacent to the second output transistor T9, and the first control transistor T12 and the second clock signal line ECB2 are located on two opposite sides of the second output transistor T9. For example, the orthogonal projection of the first control transistor T12 on the base substrate and the orthogonal projection of the second clock signal line ECB2 on the base substrate are located on two opposite sides of the orthogonal projection of the second output transistor T9 on the base substrate.

For example, as shown in FIG. 22, the first control transistor T12, the second output transistor T9, and the second clock signal line ECB2 are sequentially arranged along the second direction X. For example, as shown in FIG. 22, the orthogonal projection of the first control transistor T12 on the base substrate, the orthogonal projection of the second output transistor T9 on the base substrate, and the orthogonal projection of the second clock signal line ECB2 on the base substrate are arranged sequentially along the second direction X. For example, as shown in FIG. 22, the orthogonal projection of the second control transistor T1 on the base substrate, the orthogonal projection of the first control transistor T12 on the base substrate, the orthogonal projection of the second output transistor T9 on the base substrate, and the orthogonal projection of the second clock signal line ECB2 on the base substrate are sequentially arranged along the second direction X. For example, as shown in FIG. 22, the orthogonal projection of the second control transistor T1 on the base substrate, the orthogonal projection of the second capacitor C2 on the base substrate, the orthogonal projection of the first control transistor T12 on the base substrate, the orthogonal projection of the second output transistor T9 on the base substrate, and the orthogonal projection of the second clock signal line ECB2 on the base substrate are sequentially arranged along the second direction X.

For example, as shown in FIG. 22, connection lines between centers of the first control transistor T12, the second control transistor T1, and the first isolation transistor T13 constitute an acute triangle.

For example, as shown in FIG. 22, connection lines between the center of the first control transistor T12, the center of the first node control transistor T11, and the center of the seventh control transistor T8 constitute an acute triangle. For example, as shown in FIG. 22, the center of the orthogonal projection of the first control transistor T12 on the base substrate, the center of the orthogonal projection of the first node control transistor T11 on the base substrate, and the center of the orthogonal projection of the seventh control transistor T8 on the base substrate constitute an acute triangle. For example, as shown in FIG. 22, the first control transistor T12, the first node control transistor T11, and the seventh control transistor T8 are arranged adjacent to each other. The orthogonal projection of the first control transistor T12 on the base substrate, the orthogonal projection of the first node control transistor T11 on the base substrate, and the orthogonal projection of the seventh control transistor T8 on the base substrate are arranged adjacent to each other.

For example, as shown in FIG. 22, the orthogonal projection of the first control transistor T12 on the base substrate is located between the orthogonal projection of the second output transistor T9 on the base substrate and the orthogonal projection of the first node control transistor T11 on the base substrate.

For example, as shown in FIG. 22, the orthogonal projection of the first node control transistor T11 on the base substrate and the orthogonal projection of the seventh control transistor T8 on the base substrate are arranged along the first direction Y, and the orthogonal projection of the first node control transistor T11 on the base substrate and the orthogonal projection of the second output transistor T9 on the base substrate are arranged along the second direction X.

For example, as shown in FIG. 22, the orthogonal projection of the third capacitor C3 on the base substrate is located between the orthogonal projection of the second output transistor T9 on the base substrate and the orthogonal projection of the second power line VGH on the base substrate.

As compared with the display substrate shown in FIG. 3, in the display substrate shown in FIG. 22, the respective clock signal lines, the first power line VGL, and the second power line VGL do not adopt a form of two-layer metal structures connected in parallel, and the first capacitor C1, the second capacitor C2, the third capacitor C3, and the fourth capacitor C4 do not adopt a form of three capacitors connected in parallel. As shown in FIG. 24, the first conductive layer LY1 is provided with the conductive line M1 and the conductive line M2, as compared with the display substrate shown in FIG. 3, the first conductive layer LY1 is not provided with the conductive line M3. As shown in FIG. 27, the third conductive layer LY3 is provided with a connection electrode ET3m, an connection electrode ET0, and an connection electrode ET121. Of course, FIG. 27 further shows the connection electrode ET1, the connection electrodes ET3 to ET14, the connection electrode ET5a, the connection electrode ETI, the connection electrode ETa, the connection electrode ETc and the connection electrode ETd, etc. As shown in FIG. 29, the fourth conductive layer LY4 is provided with an connection electrode ET122 and an connection electrode ETbm. For example, the connection electrode ET5a is connected and formed integrally with the first electrode of the first transistor T5. In other words, at least a portion of the connection electrode ET5a serves as the first electrode of the first transistor T5. The connection electrode ET3m is equivalent to integrating the functions of the connection electrode ET3 and the conductive line M3 in the display substrate shown in FIG. 3. The connection electrode ETbm is equivalent to integrating the functions of the connection electrode ETb and the conductive line M2 in the display substrate shown in FIG. 3.

Referring to FIG. 37, the connection electrode ET0 is connected with the connection electrode ET121 through the connection electrode ET122. In other words, a first end of the connection electrode ET122 is connected with the connection electrode ET121, and a second end of the connection electrode ET122 is connected with the connection electrode ET0. For example, referring to FIG. 37, the connection electrode ET121 is connected and formed integrally with the second electrode of the first control transistor T12, in other words, at least a portion of the connection electrode ET121 serves as the second electrode of the first control transistor T12. For example, referring to FIG. 37, the connection electrode ET0 is connected and formed integrally with the first electrode of the transistor T1, in other words, at least a portion of the connection electrode ET0 serves as the first electrode of the transistor T1. That is, the connection electrode ET0, the connection electrode ET121, and the connection electrode ET122 in the display substrate shown in FIG. 22 may play the same role as the connection electrode ET12 in the display substrate shown in FIG. 3. Referring to FIG. 37, the second power line VGH is connected with the connection electrode ET8 through the connection electrode ETbm.

For example, the capacitors shown in FIG. 22 (including the first capacitor C1, the second capacitor C2, the third capacitor C3, and the fourth capacitor C4) are all formed by arranging the first electrode plate and the second electrode plate opposite to each other with an insulating layer sandwiched therebetween. FIG. 32 and FIG. 35 show the first electrode plate C1a of the first capacitor C1, the first electrode plate C2a of the second capacitor C2, the second electrode plate C3b of the third capacitor C3, and the first electrode plate C4a of the fourth capacitor C4. FIG. 31 shows the second electrode plate C1b of the first capacitor C1, the second electrode plate C2b of the second capacitor C2, the first electrode plate C31 of the third capacitor C3, and the second electrode plate C4b of the fourth capacitor C4. Because the first capacitor C1, the second capacitor C2, the third capacitor C3, and the fourth capacitor C4 in the display substrate shown in FIG. 22 do not adopt the form of a plurality of capacitors connected in parallel, when describing the connection structure thereof, with respect to the capacitor in the display substrate shown in FIG. 3, it is only necessary to replace both the first portion Ca1 and the second portion Ca2 of the first electrode plate Ca by the first electrode plate Ca, and replace both the first portion Cb1 and the second portion Cb2 of the second electrode plate Cb by the second electrode plate Cb.

Referring to FIG. 35 and FIG. 41, the first electrode plate C1a of the first capacitor C1 is connected with the connection electrode ET4 through a via hole, the first electrode plate C2a of the second capacitor C2 is connected with the connection electrode ETc through a via hole, the second electrode plate C3b of the third capacitor C3 is connected with the second clock signal line ECB2 through a via hole, and the first electrode plate C4a of the fourth capacitor C4 is connected with the connection electrode ETa through a via hole. Referring to FIG. 35, the second electrode plate C3b of the third capacitor C3 is connected with the connection electrode ET9 through a via hole. The output terminal EOUT1 is connected with the connection electrode ET10 through a via hole.

For the connection modes and functions of the remaining connection electrodes shown in FIG. 34, reference may be made to the connection modes and the functions of the respective connection electrodes shown in FIG. 3.

As compared with the display substrate shown in FIG. 3, in the display substrate shown in FIG. 22, the position of the transistor T12 is adjusted, and further some wiring design is adjusted. Referring to FIG. 34, the gate electrode G12 of the transistor T12 is connected with the connection electrode ET9 through a via hole, is further connected with the second electrode plate C3b of the third capacitor C3, and is further connected with the second clock signal line ECB2.

Referring to FIG. 5, FIG. 22 and FIG. 38, the connection electrode ET5a may also be referred to as the conductive portion CP. FIG. 38 shows the gate electrode G5 of the first transistor T5 and the channel CNL of the first transistor T5, and the gate electrode G5 of the first transistor T5 partially overlaps with the channel CNL of the first transistor T5 in a third direction Z. The third direction Z is a direction perpendicular to the base substrate 10.

For example, as shown in FIG. 3 and FIG. 22, the gate electrode of the first transistor T5 is connected with the first electrode of the first transistor T5 through the conductive portion CP (the connection electrode ET5a) to form a diode structure. As shown in FIG. 22 and FIG. 38, the conductive portion CP is connected with the active layer A5 of the first transistor T5 through the first via hole H1. As shown in FIG. 5 and FIG. 22, the orthogonal projection of the channel CNL of the first transistor T5 on the base substrate 10 does not overlap with the orthogonal projection of the first via hole H1 on the base substrate 10, so as to avoid a destructive effect on the channel of the first transistor T5 in a process of forming the via hole, which may effectively implement a unidirectional current flow function of the diode-connected first transistor T5, and effectively eliminate noise interference in the keeping phase.

As shown in FIG. 22 and FIG. 38, the conductive portion CP is connected with the gate electrode G5 of the first transistor T5 through the second via hole H2, and the orthogonal projection of the channel CNL of the first transistor T5 on the base substrate 10 does not overlap with the orthogonal projection of the second via hole H2 on the base substrate 10, so as to avoid a destructive effect on the channel of the first transistor T5 during the process of forming the via hole.

Referring to FIG. 22 and FIG. 39, the capacitor C includes a first electrode plate Ca and a second electrode plate Cb, the connection electrode ET01 is connected with the first electrode plate Ca, the connection electrode ET02 is connected with the second electrode plate Cb, the second electrode plate Cb is located in the second conductive layer LY2, the first electrode plate Ca is located in the first conductive layer LY1, and the connection electrode ET01 and the connection electrode ET02 are located in the second conductive layer LY3. The first electrode plate Ca and the second electrode plate Cb are arranged opposite to each other with a dielectric layer sandwiched therebetween to form a capacitor, and the capacitor C may be at least one of the first capacitor C1, the second capacitor C2, and the fourth capacitor C4.

Referring to FIG. 22 and FIG. 39, with respect to the first capacitor C1, the first electrode plate Ca is the first electrode plate C1a, the second electrode plate Cb is the second electrode plate C1b, the connection electrode ET01 is the connection electrode ET4, and the connection electrode ET02 is the connection electrode ET5a.

Referring to FIG. 22 and FIG. 39, with respect to the second capacitor C2, the first electrode plate Ca is the first electrode plate C2a, the second electrode plate Cb is the second electrode plate C2b, the connection electrode ET01 is the connection electrode ETc, and the connection electrode ET02 is the connection electrode ET5.

Referring to FIG. 22 and FIG. 39, with respect to the fourth capacitor C4, the first electrode plate Ca is the first electrode plate C4a, the second electrode plate Cb is the second electrode plate C4b, the connection electrode ET01 is the connection electrode ETa, and the connection electrode ET02 is the connection electrode ETd.

Referring to FIG. 22 and FIG. 39, with respect to the first capacitor C1, the second capacitor C2 and the fourth capacitor C4, the first electrode plate C1a, the first electrode plate C2a and the first electrode plate C4a are located in the second conductive layer LY2, and the second electrode plate C1b, the second electrode plate C2b and the second electrode plate C4b are located in the first conductive layer LY1.

Referring to FIG. 22 and FIG. 40, with respect to the third capacitor C3, the first electrode plate C3a is located in the first conductive layer LY1, and the second electrode plate C3b is located in the second conductive layer LY2. The first electrode plate C3a and the second electrode plate C3b are directly opposite to each other with a dielectric layer sandwiched therebetween, thereby forming a capacitor.

Referring to FIG. 22, FIG. 39 and FIG. 40, the second electrode plate C1b, the second electrode plate C2b, the first electrode plate C3a and the second electrode plate C4b are located in the first conductive layer LY1, and the first electrode plate C1a, the first electrode plate C2a, the second electrode plate C3b and the first electrode plate C4a are located in the second conductive layer LY2.

As shown in FIG. 22 and FIG. 34, the orthogonal projection of the first capacitor C1 on the base substrate 10 partially overlaps with the orthogonal projection of the first transistor T5 on the base substrate 10, and the orthogonal projection of the second capacitor C2 on the base substrate 10 partially overlaps with the orthogonal projection of the first transistor T5 on the base substrate 10.

For example, as shown in FIG. 22, the centers of the fourth capacitor C4, the fifth control transistor T6, and the sixth control transistor T7 constitute an acute triangle.

For example, as shown in FIG. 3 and FIG. 22, in order to reduce the frame, the third control transistor T3, the fourth control transistor T2, and the second isolation transistor T14 are arranged sequentially along the second direction X. The orthogonal projection of the third control transistor T3 on the base substrate is adjacent to the orthogonal projection of the fourth control transistor T2 on the base substrate, and the orthogonal projection of the second isolation transistor T14 on the base substrate is adjacent to the orthogonal projection of the fourth control transistor T2 on the base substrate.

For example, the display substrate further includes a gate driving circuit (not shown) and a trigger signal line. For example, the trigger signal line is configured to provide a trigger signal to the gate driving circuit, and the orthogonal projection of the trigger signal line on the base substrate 10 is located on a side of the orthogonal projection of the second clock signal line ECB2 on the base substrate 10 that is away from the display region 102. For example, the gate driving circuit is the light-emitting control driving circuit array (EM GOA) described above, which includes a plurality of shift register units 100aa which are cascaded or includes a plurality of shift register units 100ab which are cascaded, so that the light-emitting control signals may be output row by row.

For example, the trigger signal line is connected with the first electrode of the transistor T12 of the first-stage shift register unit of the gate driving circuit to provide the trigger signal. For specific introduction, reference may be made to the foregoing description, which is not repeated here.

For example, in some embodiments of the present disclosure, the line width of the line in each layer is, for example, generally 3 micrometers, and the spacing between lines in the same layer is, for example, greater than 3 micrometers. For example, the spacing between lines is related to the accuracy of an exposure machine, the higher the accuracy of the exposure machine, the smaller the spacing may be, which may be specifically determined according to actual conditions, and is not limited in the embodiments of the present disclosure. In the embodiments of the present disclosure, a necessary spacing must be left between the lines in the same layer to avoid line adhesion, signal short, etc., in the actual process.

The spacing between the orthogonal projection of the respective lines of the first conductive layer LY1 on the base substrate 10 and the orthogonal projection of the respective lines of the second conductive layer LY2 on the base substrate 10 is generally 1.5 micrometers, for example, the gate electrode of the transistor in the first conductive layer LY1 should exceed an active layer thereof on the semiconductor layer LY0, for example, by more than 2 micrometers. For example, as shown in FIG. 3, the "U"-shaped double gate electrode of the transistor T2 extends beyond the active layer of the transistor T2 by more than 2 micrometers on both sides of the active layer of the transistor T2 in the first direction Y, for example, the length of a portion that does not overlap with the active layer of the transistor T2 in the first direction Y is 2 micrometers or more, which is not limited in the embodiments of the present disclosure.

For example, the spacing between the orthogonal projection of the active layers of the respective transistors in the semiconductor layer LY0 on the base substrate 10 and the orthogonal projection of respective gate lines in the first conductive layer LY1 on the base substrate 10 is 1.5 micrometers or more, so that a channel effect between the gate lines and the active layers of the respective transistors in the semiconductor layer LY0 can be avoided. For example, the spacing between the orthogonal projection of the semiconductor layer LY0 on the base substrate 10 and the orthogonal projection of the second conductive layer LY2 on the base substrate 10 may be unlimited, for example, may be arranged overlapping with each other. For example, in some embodiments of the present disclosure, a certain spacing should be reserved as far as possible between the lines of different layers (the spacing is less than the spacing between lines in the same layer), so that unnecessary overlap may be reduced to reduce or avoid excessive parasitic capacitance which generates crosstalk.

For example, the width of each line in the third conductive layer LY3 should cover (e.g., completely cover) its corresponding via hole, for example, may exceed the sizes of the via hole (e.g., the diameter of the via hole) by more than 1 micrometer, for example, the sizes of the via hole is 2.0 micrometers to 2.5 micrometers, and the width of each line in the third conductive layer LY3 that covers the via hole is 4 micrometers to 5 micrometers. For example, the widths of lines of the first output transistor T10 and the second output transistor T9 that correspond to the via holes both exceed by 1 micrometer above and below the via hole, which are for example, 4.0 micrometers to 4.5 micrometers. Because the first output transistor T10 and the second output transistor T9 correspond to more via holes, and the widths of lines that are located in the third conductive layer LY3 and connected with other transistors only needs to meet the requirements of covering the via holes exceeding 1 micron at the via hole positions, for example, the widths of the lines between the via holes can be thinner.

For example, the spacing between the lines such as the first clock signal line ECB, the second clock signal line ECB2, the third clock signal line ECK, the fourth clock signal line ECK2, the first power line VGL, the second power line VGH, etc., located in the third conductive layer LY3 is 3 micrometers or more, and the line widths of the first clock signal line ECB, the second clock signal line ECB2, the third clock signal line ECK, and the fourth clock signal line ECK2 are set to 4 micrometers or more in order to meet driving capability requirements. For example, the line width of each clock signal line is 4 micrometers to 10 micrometers. For further example, the line width of each clock signal line is 8 micrometers or 10 micrometers. The line width of the first power line VGL may be 6, 9 or 10 micrometers, the line width of the second power line VGH is, for example, 10 micrometers, and the first power voltage provided by the first power line VGL is generally −7 V, for example.

For example, in some examples, the thicknesses of the first conductive layer LY1 and the second conductive layer LY2 are respectively 2,000 to 3,000 angstroms, and the thicknesses of the third conductive layer LY3 and the fourth conductive layer LY4 are respectively 5,000 to 8,000 angstroms, which are not limited in the embodiments of the present disclosure.

For example, by arranging the above-described connection electrodes, conductive lines and connection lines, problems such as line adhesion, signal short, etc., caused by dense lines in the same layer can be alleviated or avoided. For example, the above-described connection electrodes, conductive lines, and connection lines can function as connections or jumper connections.

The display substrate provided by the above-described embodiments of the present disclosure optimizes the line connection and structural layout of the shift register unit, compresses the length of the shift register unit in the first direction or the second direction to a certain extent, further reduces the size of the shift register unit, facilitates implementing narrow frame design of the display substrate, and meanwhile ensures display quality achieved by the display substrate.

It should be noted that, any capacitor in the display substrate shown in FIG. 22 may also adopt the mode of connection in parallel as adopted by any capacitor in the display substrate shown in FIG. 3. For example, with respect to the output transistors T9 and T10, in order to enhance output capabilities of the two TFTs, capacitance of the second capacitor C2 and the third capacitor C3 may be increased, for example, at least one of the second capacitor C2 and the third capacitor C3 in the display substrate shown in FIG. 22 is designed as a parallel capacitor.

FIG. 21 shows a schematic diagram of arrangement positions of the respective connection electrodes, the respective connection lines, and the respective conductive lines in the display substrate shown in FIG. 3. FIG. 41 shows a schematic diagram of arrangement positions of the respective connection electrodes, the respective connection line, and the respective conductive lines in the display substrate shown in FIG. 22. As shown in FIG. 3, FIG. 22, FIG. 21 and FIG. 41, as compared with the display substrate shown in FIG. 3, the display substrate shown in FIG. 22 is not provided with the connection line L4, the conductive line M2, and the conductive line M3. The display substrate shown in FIG. 22 is the same as the display substrate shown in FIG. 3 in that: connection lines L1 to L3 and connection line L5 are provided, and the conductive line M1 is provided. With respect to the layer where the connection electrode is located, the connection electrode ET12 in the display substrate shown in FIG. 3 is replaced by functions of the structure combined by the connection electrode ET121, the connection electrode ET122, and the connection electrode ET0 in the display substrate shown in FIG. 22, the integral structure of the connection electrode ET5, the connection electrode ET11, and the second electrode plate C2*b* of the second electrode in the display substrate shown in FIG. 3 is replaced by functions of the structure combined by the connection electrode ET5, the connection electrode ET11, and the second electrode plate C2*b* of the second electrode respectively provided in the display substrate shown in FIG. 22, and the connection electrode ETb in the display substrate shown in FIG. 3 is replaced by the connection electrode ETbm in the display substrate shown in FIG. 22.

In FIG. 41, the components in the display substrate shown in FIG. 3 are in the light-colored dashed frame (where the arrow starts), which are replaced by the components in the dark-colored dashed frame (where the arrow ends) to form the display substrate shown in FIG. 22. The elements in the solid-line frame are the elements that are not provided in the display substrate shown in FIG. 22 but are provided in the display substrate shown in FIG. 3.

For example, in the display substrate shown in FIG. 3 and FIG. 22, the connection line L5 may be referred to as the first connection line, the connection line L1 may be referred to as the second connection line, the connection line L2 may be referred to as the third connection line, the connection line L3 may be referred to as the fourth connection line, and the connection line L4 may be referred to as the fifth connection line. As shown in FIG. 14 and FIG. 31, in the embodiments of the present disclosure, the connection line may be directly connected with the elements located at both ends thereof, or the connection line may be formed integrally with the elements located at both ends thereof.

For example, in the display substrate shown in FIG. 3 and FIG. 22, the conductive line M1 may be referred to as a first conductive line, the conductive line M2 may be referred to as a second conductive line, and the conductive line M3 may be referred to as a third conductive line.

For clarity of illustration, the respective components are not all labeled in FIG. 3 and FIG. 22, and for reference signs of the respective elements, the reference signs in the single-layer or multi-layer structure in the display substrate shown in FIG. 22 may be referred to.

Referring to FIG. 21, FIG. 41 and Table 2 as mentioned later, in order to facilitate distinguishing the respective connection electrodes, the connection electrode ET5*a* may be referred to as a first connection electrode TR1, the connection electrode ET5 may be referred to as a second connection electrode TR2, the connection electrode ET4 may be referred to as a third connection electrode TR3, the connection electrode ET13 may be referred to as a fourth connection electrode TR4, the connection electrode ET6 may be referred to as a fifth connection electrode TR5, the connection electrode ET11 may be referred to as a sixth connection electrode TR6, the connection electrode ETc may be referred to as a seventh connection electrode TR7, the connection electrode ET10 may be referred to as an eighth connection electrode TR8, the connection electrode ET7 may be referred to as a ninth connection electrode TR9, the connection electrode ET9 may be referred to as a tenth connection electrode TR10, the connection electrode ET8 may be referred to as an eleventh connection electrode TR11, the connection electrode ETI may be referred to as a twelfth connection electrode TR12, the connection electrode ET12 in the display substrate shown in FIG. 3 or the connection electrode ET121 in the display substrate shown in FIG. 22 may be referred to as a thirteenth connection electrode TR13, the connection electrode ET1 may be referred to as a fourteenth connection electrode TR14, the connection electrode ET3 may be referred to as a fifteenth connection electrode TR15, the connection electrode ET14 may be referred to as a sixteenth connection electrode TR16, the connection electrode ET2 may be referred to as the a seventeenth connection electrode TR17, the connection electrode ETa may be referred to as an eighteenth connection electrode TR18, and the connection electrode ETd may be referred to as a nineteenth connection electrode TR19.

Figure 42:
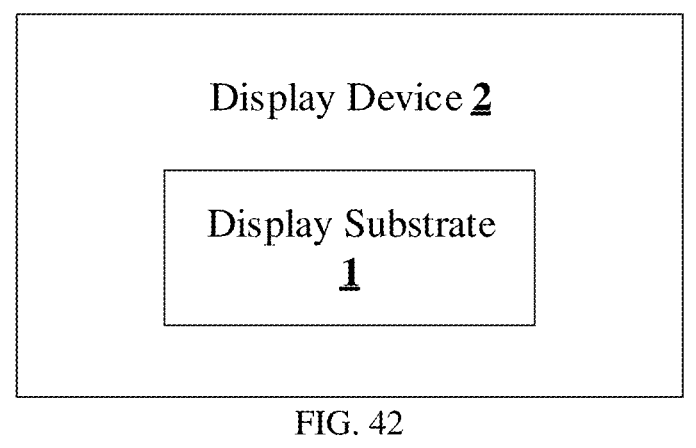

At least one embodiment of the present disclosure further provides a display device. FIG. 42 is a schematic diagram of a display device provided by at least one embodiment of the present disclosure. As shown in FIG. 42, the display device 2 includes a display substrate 1, and the display substrate 1 may be a display substrate provided by any one embodiment of the present disclosure, for example, the display substrate shown in the FIG. 3 or FIG. 22 described above.

It should be noted that, the display device 2 may be an OLED panel, an OLED television, a QLED panel, a QLED television, a mobile phone, a tablet computer, a laptop, a digital photo frame, a navigator, or any other product or component having a display function. The display device 2 may further include other components, for example, a data driving circuit, a timing controller, etc., which is not limited in the embodiments of the present disclosure. The display device 2 may be used for a low-frequency GOA display device, but is not limited thereto.

It should be noted that, for clarity and conciseness, the embodiment of the present disclosure does not describe all the component units of the display device 2. In order to implement basic functions of the display device 2, those skilled in the art can provide and arrange other structures not shown according to specific needs, which is not limited in the embodiments of the present disclosure.

For technical effects of the display device 2 provided by the above-described embodiment, the technical effects of the display substrate (e.g., the display substrate shown in the above-described FIG. 2) provided by the embodiments of the present disclosure may be referred to, and no details will be repeated here.

At least one embodiment of the present disclosure further provides a fabrication method of a display substrate, for example, a fabrication method of the display substrate provided by any one embodiment of the present disclosure. For example, the method can be used for fabricating the display substrate provided by any one embodiment of the present disclosure, for example, can be used for fabricating the display substrate shown in the above-described FIG. 2.

For example, the fabrication method of the display substrate includes step S110 to step S120.

Step S110: providing a base substrate.

Step S120: forming shift register units, a first power line providing a first power voltage, a second power line providing a second power voltage, a first clock signal line, a second clock signal line, a third clock signal line and a fourth clock signal line on the base substrate.

For example, forming a semiconductor layer, a first insulating layer, a first conductive layer, a second insulating layer, a second conductive layer, a third insulating layer, a third conductive layer, a fourth insulating layer, a fifth insulating layer, and a fourth conductive layer respectively includes forming corresponding material layers (e.g., a semiconductor material layer, an insulating material layer, or a conductive material layer), and then respectively forming corresponding pattern structures (e.g., active layers, electrode patterns, lines, via holes, etc.) by using a patterning process. The patterning process is, for example, a photo-etching process, for example, including: coating a photoresist layer on a material layer that needs to be patterned, exposing the photoresist layer with a mask, developing the exposed photoresist layer to obtain the photoresist pattern, etching the structure layer with the photoresist pattern, and then optionally removing the photoresist pattern.

With respect to step S110, for example, the base substrate 10 is made of, for example, glass, plastic, quartz, or other suitable materials, which is not limited in the embodiments of the present disclosure.

For example, the shift register unit 100aa, the first power line VGL, the second power line VGH, the first power line VGL, the first clock signal line ECB, the second clock signal line ECB2, the third clock signal line ECK and the fourth clock signal line ECK2 are formed on the base substrate 10.

With respect to step S120, for example, forming the shift register unit 100aa includes: sequentially forming a semiconductor layer LY0, a first insulating layer IL1, a first conductive layer LY1, a second insulating layer IL2, a second conductive layer LY2, a third insulating layer IL3, a third conductive layer LY3, a fourth insulating layer IL4, a fifth insulating layer IL5, and a fourth conductive layer LY4 in a direction perpendicular to the base substrate 10. The active layers of the respective transistors are located in the semiconductor layer LY0, the gate electrodes of the respective transistors and the first portions of the second electrode plates of the respective capacitors are located in the first conductive layer LY1, the first portions of the first electrode plates of the respective capacitors are located in the second conductive layer LY2, the second portions of the second electrode plates of the respective capacitors are located in the third conductive layer LY3, the second portions of the first electrode plates of the respective capacitors are located in the fourth conductive layer LY4, and the first portion of the first power line VGL, the first portion of the second power line VGH, the first portion of the first clock signal line ECB, the first portion of the second clock signal line ECB2, the first portion of the third clock signal line ECK, the first portion of the fourth clock signal line ECK2, and the first electrodes and second electrodes of the respective transistors are located in the third conductive layer LY3. The second portion of the first power line VGL, the second portion of the second power line VGH, the second portion of the first clock signal line ECB, the second portion of the second clock signal line ECB2, the second portion of the third clock signal line ECK, and the second portion of the fourth clock signal line ECK2 are located in the fourth conductive layer LY4.

For example, the respective transistors and the respective capacitors are connected with each other through the via holes penetrating the first insulating layer IL1, the second insulating layer IL2, or the third insulating layer IL3, and are connected with the first power line VGL, the second power line VGH, the first clock signal line ECB, the second clock signal line ECB2, the third clock signal line ECK, and the fourth clock signal line ECK2.

For arrangement of connection structures of the respective transistors and capacitors of the shift register unit 100aa with the second power line VGH, the first power line VGL, and the plurality of clock signal lines, as well as the connection lines, the conductive lines, and the connection electrodes, reference may be made to the corresponding description of the corresponding drawing, and details are not repeated here.

With respect to step S120, for example, forming a shift register unit 100ab includes sequentially forming a semiconductor layer LY0, a first insulating layer IL1, a first conductive layer LY1, a second insulating layer IL2, a second conductive layer LY2, a third insulating layer IL3, a third conductive layer LY3, a fourth insulating layer IL4, a fifth insulating layer IL5, and a fourth conductive layer LY4 in a direction perpendicular to the base substrate 10. The active layers of the respective transistors are located in the semiconductor layer LY0, the gate electrodes of the respective transistors, a second electrode plate of a first capacitor C1, a second electrode plate of a second capacitor C2, a second electrode plate of a fourth capacitor C4, and a first electrode plate of a third capacitor C3 are located in the first conductive layer LY1, a first electrode plate of the first capacitor C1, a first electrode plate of the second capacitor C2, a first electrode plate of the fourth capacitor C4, and a second electrode plate of the third capacitor C3 are located in the second conductive layer LY2, the first power line VGL, the second power line VGH, the first clock signal line ECB, the second clock signal line ECB2, the third clock signal line ECK and the fourth clock signal line ECK2, as well as first electrodes and second electrodes of the respective transistors are located in the third conductive layer LY3, and the connection electrode ET122 and the connection electrode ETbm are located in the fourth conductive layer LY4.

For example, in the embodiments of the present disclosure, forming a semiconductor layer LY0 includes doping with the first conductive layer LY1 as a mask, so that the portion of the active layer that is not covered by the pattern of the first conductive layer LY1 is conducted to form a source electrode region or a drain electrode region, and the portion of the active layer that is covered by the pattern of the first conductive layer LY1 maintains semiconductor characteristics, so as to form a channel of the transistor.

For example, in the embodiments of the present disclosure, forming the first conductive layer LY1 includes forming a first conductive thin film, and patterning the first conductive thin film to form the first conductive layer LY1.

For example, in the embodiments of the present disclosure, forming the second conductive layer LY2 includes forming a second conductive thin film, and patterning the second conductive thin film to form the second conductive layer LY2.

In the embodiments of the present disclosure, taking the display substrate shown in FIG. 3 as an example, a third insulating thin film is formed on the second conductive layer LY2, and the third insulating thin film is patterned to form via holes in the third insulating thin film, so as to form a third insulating layer IL3. The via holes in the third insulating layer IL3 are shown in FIG. 8, a third conductive thin film is formed on the third insulating layer IL3, the third conductive thin film is patterned to form a third conductive layer, and the pattern of the third conductive layer is shown in FIG. 9. For example, some elements in the pattern of the third conductive layer are connected with the elements at corresponding positions in the semiconductor layer LY0 through the via holes penetrating the third insulating layer IL3, the second insulating layer IL2, and the first insulating layer IL1, some elements in the pattern of the third conductive layer are connected with the elements at corresponding positions in the first conductive layer LY1 through the via holes penetrating the third insulating layer IL3 and the second insulating layer IL2, and some elements in the pattern of the third conductive layer are connected with the elements at corresponding positions in the second conductive layer LY2 through the via holes penetrating the third insulating layer IL3. A fourth conductive thin film is formed on the third conductive layer LY3, the fourth conductive thin film is patterned to form a fourth conductive layer LY4, and the pattern of the fourth conductive layer LY4 is shown in FIG. 12. For example, the elements in the fourth conductive layer LY4 are connected with the elements at corresponding positions in the third conductive layer LY3 through the via holes penetrating the fourth insulating layer LY4.

In the embodiments of the present disclosure, the elements in the semiconductor layer LY0 are connected with the elements located in the third conductive layer LY3 through via holes, the elements in the first conductive layer LY1 are connected with the elements located in the third conductive layer LY3 through via holes, the elements in the second conductive layer LY2 are connected with the elements in the third conductive layer LY3 through via holes, and the elements in the third conductive layer LY3 are connected with the elements in the fourth conductive layer LY4 through via holes.

In the embodiments of the present disclosure, the elements in the semiconductor layer LY0 are connected with the elements located in the second conductive layer LY2 through the elements located in the third conductive layer LY3, and the elements in the first conductive layer LY1 are connected with the elements located in the second conductive layer LY2 through the elements located in the third conductive layer LY3. In other words, the elements in the semiconductor layer LY0 are not directly connected with the elements located in the second conductive layer LY2, and the elements in the first conductive layer LY1 are not directly connected with the elements located in the second conductive layer LY2. In other words, the elements in the semiconductor layer LY0 are not in direct contact with the elements located in the second conductive layer LY2, and the elements in the first conductive layer LY1 are not in direct contact with the elements located in the second conductive layer LY2.

It should be noted that, in the embodiments of the present disclosure, the flow of the fabrication method of the display substrate may include more or fewer operations, and these operations may be executed sequentially or in parallel. Although the flow of the fabrication method as described above includes a plurality of operations appearing in a specific order, it should be clearly understood that, the order of the plurality of operations is not limited. The above-described fabrication method may be executed once, or may also be executed a plurality of times according to predetermined conditions.

For the technical effects of the fabrication method of the display substrate provided by the above-described embodiments, reference may be made to the technical effects of the display substrate (e.g., the display substrate shown in the above-described FIG. 2) provided by the embodiments of the present disclosure, and details are not repeated here.

For example, as shown in Table 3 as mentioned later, in the embodiments of the present disclosure, the transistor T1 may be referred to as a second control transistor T1, the transistor T2 may be referred to as a fourth control transistor T2, the transistor T3 may be referred to as a third control transistor T3, the transistor T4 may be referred to as a second transistor T4, the transistor T5 may be referred to as a first transistor T5, the transistor T6 may be referred to as a fifth control transistor T6, the transistor T7 may be referred to as a sixth control transistor T7, the transistor T8 may be referred to as a seventh control transistor T8, the transistor T9 may be referred to as a second output transistor T9, the transistor T10 may be referred to as a first output transistor T10, the transistor T11 may be referred to as a first node control transistor T11, the transistor T12 may be referred to as a first control transistor T12, the transistor T13 may be referred to as a first isolation transistor T13, and the transistor T14 may be referred to as a second isolation transistor T14. When describing the layout of the shift register units of the display substrate, abbreviation of the respective transistors may be used.

For the display substrates shown in FIG. 3 and FIG. 22, in order to facilitate correspondence, three tables are given below to facilitate understanding of the embodiments of the present disclosure.

TABLE 1

Respective nodes and connection electrodes corresponding thereto

| Node | Corresponding connection electrode |
|---|---|
| First isolation node P31 | Connection electrode ET1 or connection line L5 |
| First input node P11 | Connection electrode ET13 or gate electrode G4 of transistor T4 or second electrode plate of first capacitor C1 |
| Second isolation node P32 | Connection electrode ET14 |
| Third input node P13 | Connection electrode ETa |
| Second node P2 | Connection electrode ET7 |
| First node P1 | Connection electrode ET5 (connection electrode ET11), second electrode plate C2b of second capacitor C2 or gate electrode G10 of transistor T10 |
| Second input node P12 | Connection electrode ETd |

TABLE 2

| Correspondence relationship between connection electrode ET and connection electrode TR | |
| --- | --- |
| Connection electrode TR | Connection electrode ET |
| First connection electrode TR1 | Connection electrode ET5a |
| Second connection electrode TR2 | Connection electrode ET5 |
| Third connection electrode TR3 | Connection electrode ET4 |
| Fourth connection electrode TR4 | Connection electrode ET13 |
| Fifth connection electrode TR5 | Connection electrode ET6 |
| Sixth connection electrode TR6 | Connection electrode ET11 |
| Seventh connection electrode TR7 | Connection electrode ETc |
| Eighth connection electrode TR8 | Connection electrode ET10 |
| Ninth connection electrode TR9 | Connection electrode ET7 |
| Tenth connection electrode TR10 | Connection electrode ET9 |
| Eleventh connection electrode TR11 | Connection electrode ET8 |
| Twelfth connection electrode TR12 | Connection electrode ETI |
| Thirteenth connection electrode TR13 | Connection electrode ET12 in display substrate shown in FIG. 3 or connection electrode ET121 in display substrate shown in FIG. 22 |
| Fourteenth connection electrode TR14 | Connection electrode ET1 |
| Fifteenth connection electrode TR15 | Connection electrode ET3 |
| Sixteenth connection electrode TR16 | Connection electrode ET14 |
| Seventeenth connection electrode TR17 | Connection electrode ET2 |
| Eighteenth connection electrode TR18 | Connection electrode ETa |
| Nineteenth Connection electrode TR19 | Connection electrode ETd |

TABLE 3

| Respective transistors and names thereof | | |
| --- | --- | --- |
| | Name | Name |
| Transistor T1 | Second control transistor | Seventh transistor |
| Transistor T2 | Fourth control transistor | Tenth transistor |
| Transistor T3 | Third control transistor | Ninth transistor |
| Transistor T4 | Second transistor | Second transistor |
| Transistor T5 | First transistor | First transistor |
| Transistor T6 | Fifth control transistor | Twelfth transistor |
| Transistor T7 | Sixth control transistor | Thirteenth transistor |
| Transistor T8 | Seventh control transistor | Fourteenth transistor |
| Transistor T9 | Second output transistor | Fifth transistor |
| Transistor T10 | First output transistor | Fourth transistor |
| Transistor T11 | First node control transistor | Third transistor |
| Transistor T12 | First control transistor | Sixth transistor |
| Transistor T13 | First isolation transistor | Eighth transistor |
| Transistor T14 | Second isolation transistor | Eleventh transistor |

What have been described above are only specific implementations of the present disclosure, but the protection scope of the present disclosure is not limited thereto. Any person skilled in the art who is familiar with the technical scope disclosed in the present disclosure can easily think of changes or substitutions, which should be included in the protection scope of the present disclosure. Therefore, the protection scope of the present disclosure should be based on the protection scope of the claims.

What is claimed is:

1. A display substrate, comprising:

a base substrate, and a shift register unit, a first clock signal line, and a first power line which are all provided in a peripheral region of the base substrate, wherein the shift register unit comprises a charge pump circuit, the first clock signal line is configured to supply a first clock signal to the shift register unit, the first power line is configured to supply a first power voltage to the shift register unit, the charge pump circuit comprises a first capacitor and a first transistor, and the charge pump circuit is electrically connected with a first input node and a first node, a first electrode plate of the first capacitor is connected with the first clock signal line, a second electrode plate of the first capacitor is connected with the first input node, a gate electrode of the first transistor is connected with a first electrode of the first transistor, the second electrode plate of the first capacitor is provided with a first portion, and the first portion of the second electrode plate of the first capacitor and the gate electrode of the first transistor have an integral structure, the display substrate further comprises a second connection electrode, wherein the charge pump circuit comprises a second transistor, a first electrode of the second transistor is connected with the first clock signal line, at least a part of the second connection electrode serves as a second electrode of the second transistor, the second connection electrode is connected with a first portion of the first electrode plate of the first capacitor, and a gate electrode of the second transistor and the gate electrode of the first transistor have an integral structure.

2. The display substrate according to claim 1, further comprising a first connection electrode, wherein a first electrode of the first transistor is connected with an active layer of the first transistor through the first connection electrode.

3. The display substrate according to claim 1, further comprising a third connection electrode and a first connection line, wherein the shift register unit further comprises a first isolation transistor, the first isolation transistor is connected with the first connection line through the third connection electrode, the first connection line and the gate electrode of the second transistor have an integral structure, and a gate electrode of the first isolation transistor is connected with the first power line.

4. The display substrate according to claim 3, wherein the first power line comprises a first portion and a second portion that are located in different layers and are connected with each other.

5. The display substrate according to claim 3, further comprising a fourth connection electrode, wherein the shift register unit further comprises a second control transistor, a second electrode of the second control transistor is connected with a second electrode of the first isolation transistor through the fourth connection electrode, an active layer of the first isolation transistor and an active layer of the second control transistor both extend in a first direction, and the second electrode of the first isolation transistor and a first electrode of the second control transistor are both electrically connected with an input terminal.

6. The display substrate according to claim 5, further comprising a second clock signal line, wherein the second clock signal line is configured to supply a second clock signal to the shift register unit, the shift register unit further comprises a first control transistor, a first electrode of the first control transistor is connected with the input terminal, a gate electrode of the first control transistor is connected with the second clock signal line, and the gate electrode of the first control transistor and the second clock signal line are located in different layers.

7. The display substrate according to claim 5, wherein the shift register unit further comprises a third control transistor, a gate electrode of the second control transistor and a gate electrode of the third control transistor are located in a same conductive layer.

8. The display substrate according to claim 7, further comprising a fifth connection electrode, wherein the shift register unit further comprises a second isolation transistor and a fourth control transistor, a gate electrode of the fourth control transistor is electrically connected with the second electrode of the second control transistor, a second electrode of the fourth control transistor is electrically connected with a second electrode of the third control transistor through the fifth connection electrode, and the second electrode of the third control transistor is electrically connected with a first electrode of the second isolation transistor through the fifth connection electrode.

9. The display substrate according to claim 8, wherein the fourth control transistor is a double-gate transistor, the shift register unit further comprises a seventh control transistor, and the gate electrode of the fourth control transistor and a gate electrode of the seventh control transistor have an integral structure.

10. The display substrate according to claim 9, further comprising an eleventh connection electrode and a second power line, wherein the second power line is configured to supply a second power voltage to the shift register unit, and the shift register unit further comprises a first node control transistor, and a first electrode of the seventh control transistor and a first electrode of the first node control transistor are both connected with the second power line through the eleventh connection electrode.

11. The display substrate according to claim 10, further comprising a twelfth connection electrode, wherein the shift register unit further comprises a first output transistor, and a second electrode of the first node control transistor is connected with a gate electrode of the first output transistor through the twelfth connection electrode.

12. The display substrate according to claim 8, further comprising a sixth connection electrode and a second connection line, wherein a first electrode of the fourth control transistor is electrically connected with the gate electrode of the second control transistor through the sixth connection electrode, the gate electrode of the fourth control transistor is electrically connected with the fourth connection electrode through the second connection line, and at least a part of the fourth connection electrode serves as the second electrode of the second control transistor.

13. The display substrate according to claim 8, further comprising a seventh connection electrode and a first conductive line, wherein an active layer of the fourth control transistor and an active layer of the second isolation transistor have an integral structure, a gate electrode of the second isolation transistor is connected with the first power line through the seventh connection electrode and the first conductive line, and the seventh connection electrode and the first conductive line are located in different layers.

14. The display substrate according to claim 9, further comprising an eighth connection electrode, wherein the shift register unit further comprises a fifth control transistor and a fourth capacitor, a second electrode of the second isolation transistor is connected with a gate electrode of the fifth control transistor through the eighth connection electrode, and the second electrode of the second isolation transistor is connected with a first electrode plate of the fourth capacitor through the eighth connection electrode.

15. The display substrate according to claim 14, further comprising a ninth connection electrode and a second conductive line, wherein a first electrode of the fifth control transistor is connected with the first clock signal line through the ninth connection electrode and the second conductive line, and the ninth connection electrode and the second conductive line are located in different layers.

16. The display substrate according to claim 15, further comprising a tenth connection electrode, wherein the shift register unit further comprises a sixth control transistor and a third capacitor, a gate electrode of the sixth control transistor is connected with the first clock signal line through the second conductive line, a second electrode of the sixth control transistor is connected with a second electrode of the seventh control transistor through the tenth connection electrode, and the second electrode of the sixth control transistor is connected with a first electrode plate of the third capacitor through the tenth connection electrode.

17. The display substrate according to claim 1, wherein the first transistor is located at a side away from an input terminal of a present-stage shift register unit in a first direction, and is located at a side adjacent to an input terminal of an adjacent-stage shift register unit in the first direction.

18. A display device, comprising the display substrate according to claim 1.

\* \* \* \* \*